(12) United States Patent
Chung et al.

(10) Patent No.: US 12,500,167 B2
(45) Date of Patent: Dec. 16, 2025

(54) SEMICONDUCTOR DEVICE AND DATA STORAGE SYSTEM INCLUDING THE SAME

(71) Applicant: SAMSUNG ELECTRONICS CO., LTD., Suwon-si (KR)

(72) Inventors: Minkyu Chung, Suwon-si (KR); Sangjae Lee, Suwon-si (KR); Seungyoon Kim, Suwon-si (KR); Jaehwang Sim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 300 days.

(21) Appl. No.: 18/142,795

(22) Filed: May 3, 2023

(65) Prior Publication Data
US 2024/0071921 A1    Feb. 29, 2024

(30) Foreign Application Priority Data
Aug. 29, 2022 (KR) ........................ 10-2022-0108556

(51) Int. Cl.
*H01L 23/528* (2006.01)
*H01L 23/522* (2006.01)
(Continued)

(52) U.S. Cl.
CPC ...... *H01L 23/5283* (2013.01); *H01L 23/5226* (2013.01); *H01L 25/0652* (2013.01);
(Continued)

(58) Field of Classification Search
CPC ............ H01L 23/5283; H01L 23/5226; H01L 25/0652; H10B 41/27; H10B 41/35;
(Continued)

(56) References Cited

U.S. PATENT DOCUMENTS 10,381,081 B2   8/2019  Sugisaki et al.
11,233,004 B2   1/2022  Lim
(Continued)

FOREIGN PATENT DOCUMENTS

CN        109524417 A      3/2019
JP        2020155492 A     9/2020
KR    10-2007-0008403 A    1/2007

OTHER PUBLICATIONS

Search Report dated Feb. 9, 2024 for corresponding application No. EP 23193711.1.

*Primary Examiner* — Herve-Louis Y Assouman
(74) *Attorney, Agent, or Firm* — Muir Patent Law, PLLC

(57) ABSTRACT

A semiconductor device may include a first structure, a second structure on the first structure, and gate contact plugs penetrating through the first and second structures. The first structure may include a first stack structure including first gate layers and first insulating layers alternately stacked, a first pad capping pattern penetrating through at least a first portion of the first stack structure, and a first buffer capping pattern penetrating through at least a second portion of the first stack structure and spaced apart from the first pad capping pattern. The second structure may include a second stack structure including second gate layers and second insulating layers alternately stacked, and a second pad capping pattern penetrating through at least a portion of the second stack structure. The first gate layers may include first gate pads covered by the first pad capping pattern.

20 Claims, 44 Drawing Sheets

(51) Int. Cl.

| | |
|---|---|
| *H01L 25/065* | (2023.01) |
| *H10B 41/27* | (2023.01) |
| *H10B 41/30* | (2023.01) |
| *H10B 41/35* | (2023.01) |
| *H10B 41/40* | (2023.01) |
| *H10B 41/50* | (2023.01) |
| *H10B 43/27* | (2023.01) |
| *H10B 43/30* | (2023.01) |
| *H10B 43/35* | (2023.01) |
| *H10B 43/40* | (2023.01) |
| *H10B 43/50* | (2023.01) |
| *H10B 51/20* | (2023.01) |
| *H10B 51/30* | (2023.01) |
| *H10B 51/40* | (2023.01) |
| *H10B 63/00* | (2023.01) |
| *H10B 63/10* | (2023.01) |
| *H10B 80/00* | (2023.01) |

(52) U.S. Cl.
CPC .............. *H10B 41/27* (2023.02); *H10B 41/35* (2023.02); *H10B 41/40* (2023.02); *H10B 43/27* (2023.02); *H10B 43/35* (2023.02); *H10B 43/40* (2023.02); *H10B 80/00* (2023.02)

(58) Field of Classification Search
CPC ........ H10B 41/40; H10B 43/27; H10B 43/35; H10B 43/40; H10B 80/00; H10B 41/50; H10B 43/50; H10B 41/30; H10B 43/30; H10B 51/20; H10B 51/30; H10B 51/40; H10B 63/10; H10B 63/34
See application file for complete search history.

(56) References Cited

U.S. PATENT DOCUMENTS

| | | | |
|---|---|---|---|
| 2014/0054787 | A1 | 2/2014 | Eun et al. |
| 2017/0236746 | A1* | 8/2017 | Yu .......................... G11C 16/24 257/314 |
| 2020/0203372 | A1* | 6/2020 | Lee ......................... H10B 41/27 |
| 2020/0303407 | A1 | 9/2020 | Miyazaki |
| 2021/0296349 | A1 | 9/2021 | Yoshimizu |
| 2022/0013538 | A1 | 1/2022 | Lee et al. |
| 2022/0102375 | A1 | 3/2022 | Kubo |
| 2022/0231038 | A1 | 7/2022 | Baek et al. |

\* cited by examiner

'Bc'

'Bd'

SEMICONDUCTOR DEVICE AND DATA STORAGE SYSTEM INCLUDING THE SAME

CROSS-REFERENCE TO RELATED APPLICATIONS

Korean Patent Application No. 10-2022-0108556, filed on Aug. 29, 2022, in the Korean Intellectual Property Office, is incorporated by reference herein in its entirety.

BACKGROUND

1. Field

Example embodiments relate to a semiconductor device and a data storage system including the same.

2. Description of the Related Art

A semiconductor device able to store high-capacity data in a data storage system requiring data storage is desirable. Accordingly, a method for increasing data storage capacity of a semiconductor device has been researched.

SUMMARY

An example embodiment is to provide a semiconductor device which may increase integration density and reliability.

An example embodiment is to provide a data storage system including the semiconductor device.

Embodiments are directed to a semiconductor device. The semiconductor device may include a first structure, a second structure on the first structure, and gate contact plugs penetrating through the first and second structures. The first structure may include a first stack structure including first gate layers and first insulating layers alternately stacked. A first pad capping pattern may penetrate through at least a first portion of the first stack structure, and a first buffer capping pattern may penetrate through at least a second portion of the first stack structure. The first buffer capping pattern may be spaced apart from the first pad capping pattern. The second structure may include a second stack structure including second gate layers and second insulating layers alternately stacked, and a second pad capping pattern penetrating through at least a portion of the second stack structure. The first gate layers may include first gate pads covered by the first pad capping pattern. The second gate layers may include second gate pads covered by the second pad capping pattern. At least a portion of the first pad capping pattern may be disposed at substantially the same level as a level of the first buffer capping pattern. At least a portion of the second pad capping pattern may vertically overlap the first buffer capping pattern.

Embodiments are also directed to a semiconductor device. The semiconductor device may include a first structure, a second structure on the first structure, a third structure on the second structure, a vertical memory structure penetrating the first, second and third structures in a memory cell array region, and gate contact plugs penetrating the first, second and third structures in a connection region adjacent to the memory cell array region. The first structure may include a lower stack structure including lower gate layers and lower insulating layers alternately stacked. A first lower pad capping pattern may penetrate through at least a first portion of the lower stack structure. A first lower buffer capping pattern may penetrate through at least a second portion of the lower stack structure. The first lower buffer capping portion may be spaced apart from the first lower pad capping pattern. The second structure may include an intermediate stack structure including alternately stacked intermediate gate layers, intermediate insulating layers, and a first intermediate pad capping pattern penetrating through at least a portion of the intermediate stack structure. The third structure may include an upper stack structure including upper gate layers and upper insulating layers alternately stacked, and a first upper pad capping pattern penetrating through at least a portion of the upper stack structure. The lower gate layers may include first lower gate pads covered by the first lower pad capping pattern. The intermediate gate layers may include first intermediate gate pads covered by the first intermediate pad capping pattern. The upper gate layers may include first upper gate pads covered by the first upper pad capping pattern. At least a portion of the first lower pad capping pattern may be disposed at substantially the same level as a level of the first lower buffer capping pattern. At least a portion of the first intermediate pad capping pattern may vertically overlap the first lower buffer capping pattern.

Embodiments are also directed to a data storage system. The data storage system may include a semiconductor device including data transfer pads configured to receive input data and transmit output data. A controller may be electrically connected to the semiconductor device through the data transfer pads and may be configured to control the semiconductor device. The semiconductor device may include a first structure, a second structure on the first structure, and gate contact plugs penetrating through the first and second structures. The first structure may include a first stack structure including first gate layers and first insulating layers alternately stacked, a first pad capping pattern penetrating through at least a first portion of the first stack structure, and a first buffer capping pattern penetrating through at least a second portion of the first stack structure. The first buffer capping pattern may be spaced apart from the first pad capping pattern. The second structure may include a second stack structure including second gate layers and second insulating layers alternately stacked, and a second pad capping pattern penetrating through at least a portion of the second stack structure. The first gate layers may include first gate pads covered by the first pad capping pattern. The second gate layers may include second gate pads covered by the second pad capping pattern. At least a portion of the first pad capping pattern may be disposed at substantially the same level as a level of the first buffer capping pattern. At least a portion of the second pad capping pattern may vertically overlap the first buffer capping pattern.

BRIEF DESCRIPTION OF DRAWINGS

Features will become apparent to those of skill in the art by describing in detail exemplary embodiments with reference to the attached drawings in which.

DETAILED DESCRIPTION

A method for increasing data storage capacity of a semiconductor device, a semiconductor device including memory cells arranged three-dimensionally, instead of memory cells arranged two-dimensionally, is disclosed.

Figure 1:
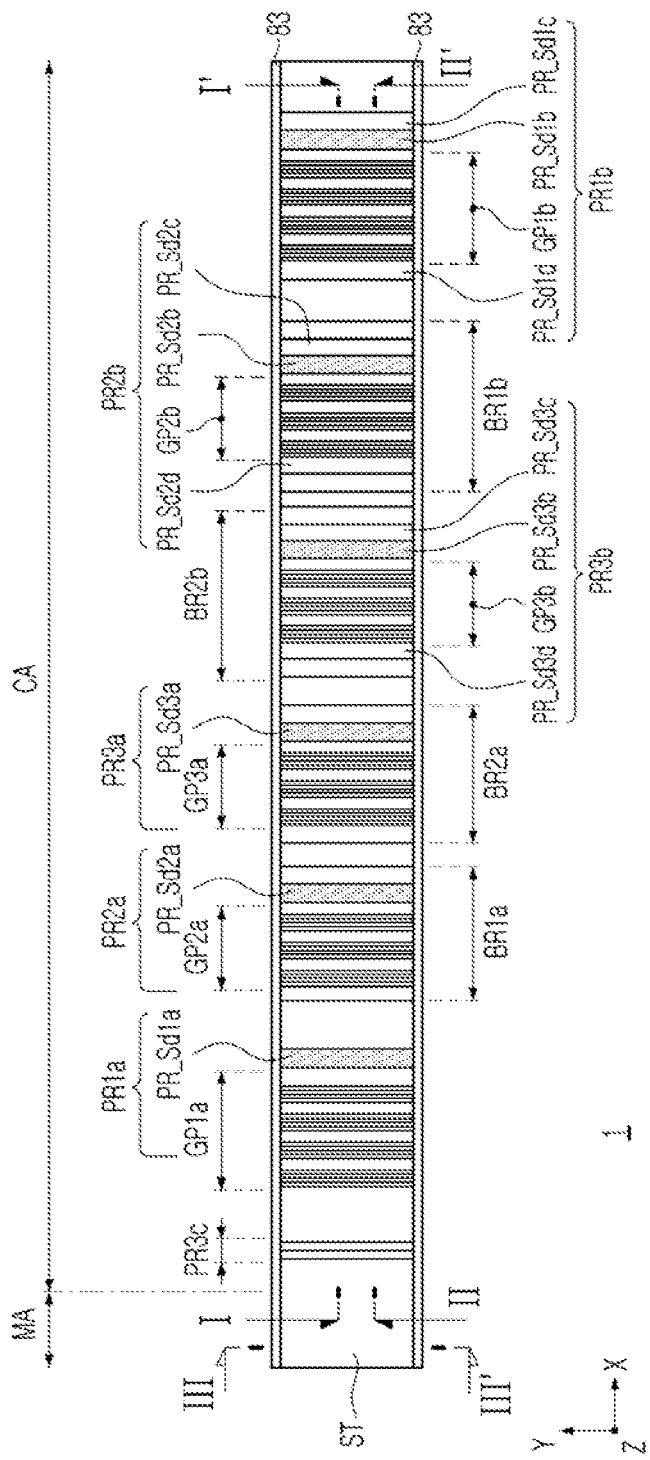
FIGS. 1, 2A, 2B, 3A to 3E, 4, 5A to 5C, 6A and 6B are diagrams illustrating a semiconductor device according to an example embodiment.
Figure 2A:
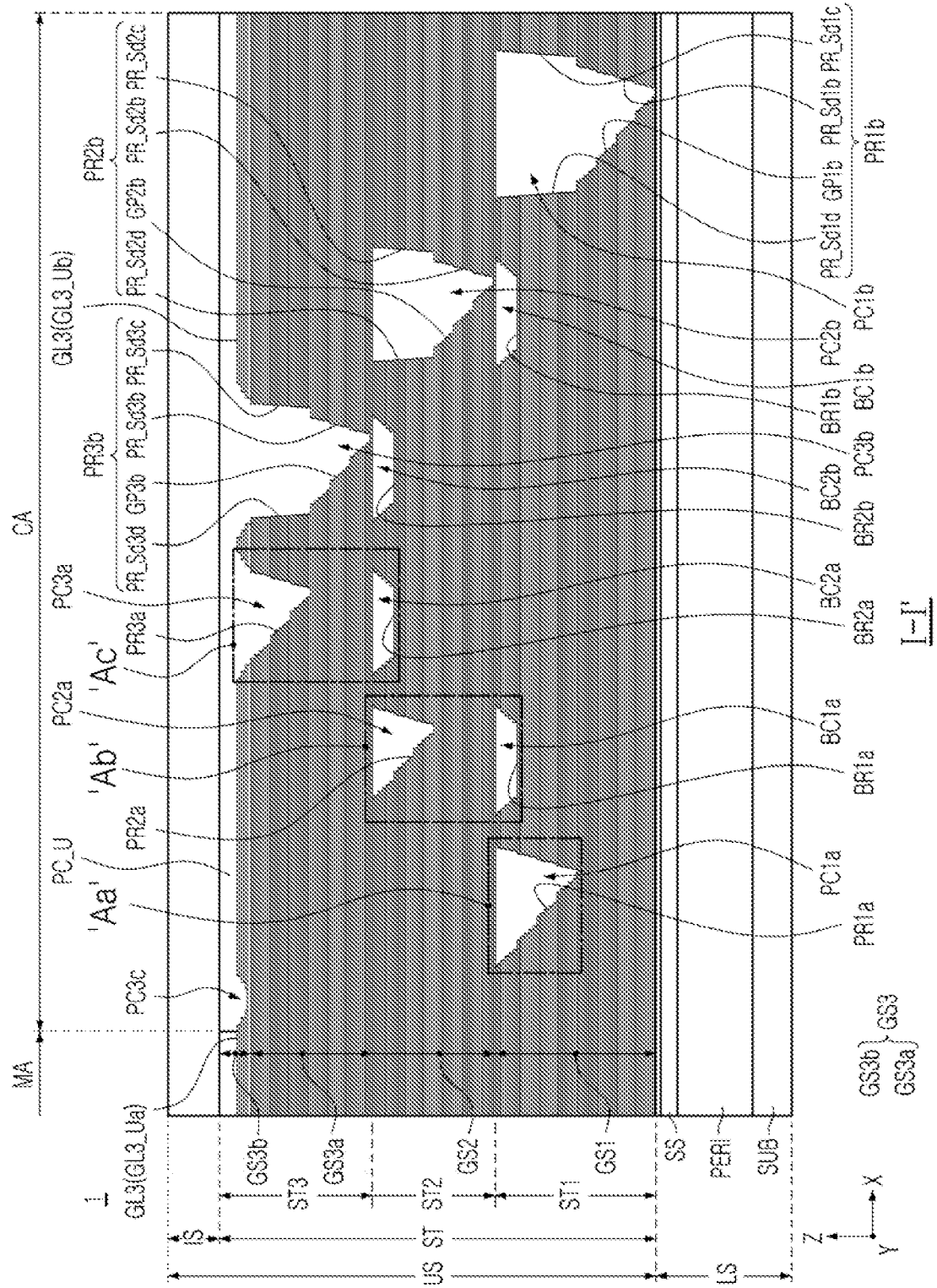
Figure 2B:
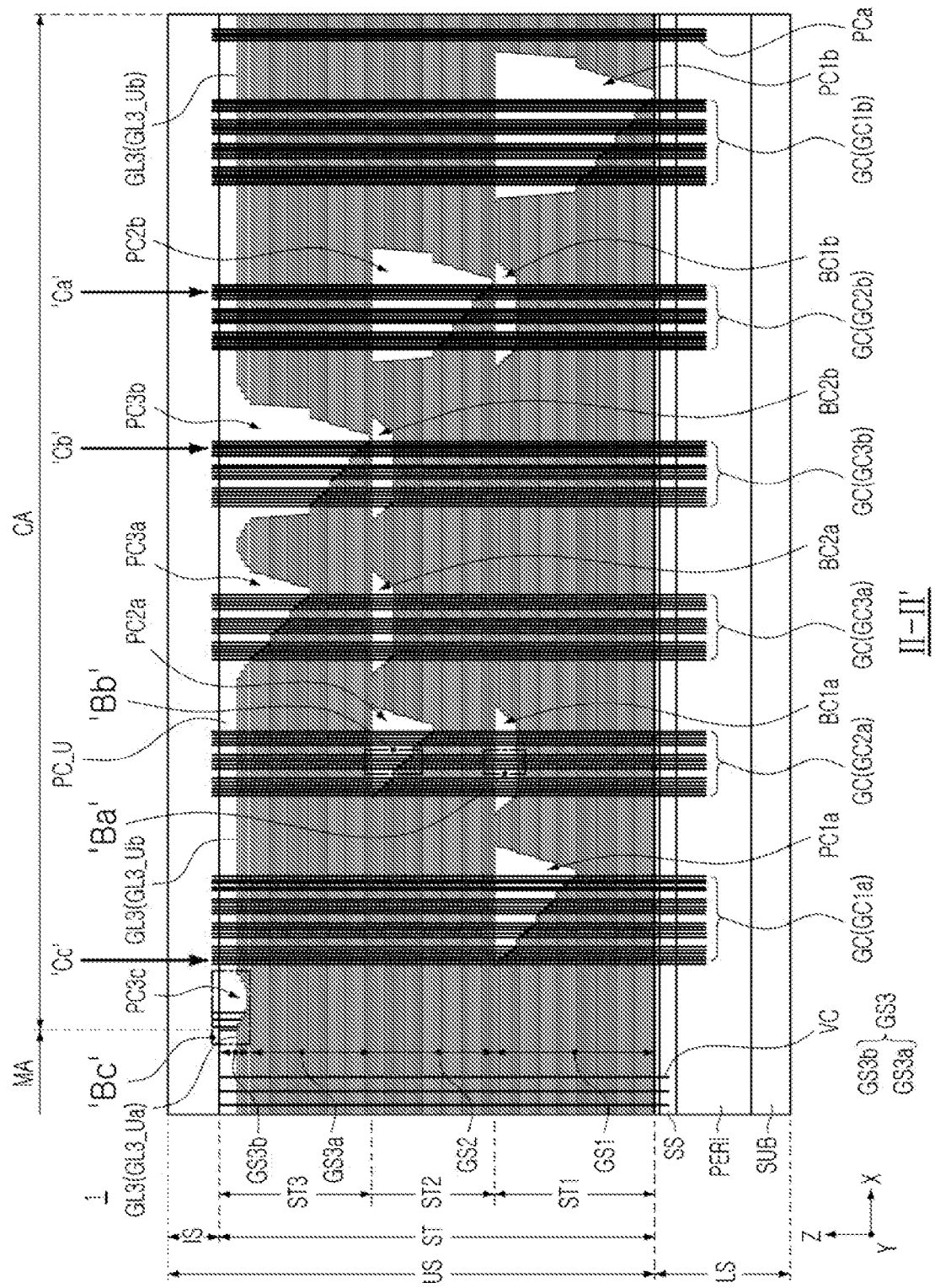
Figure 3A:
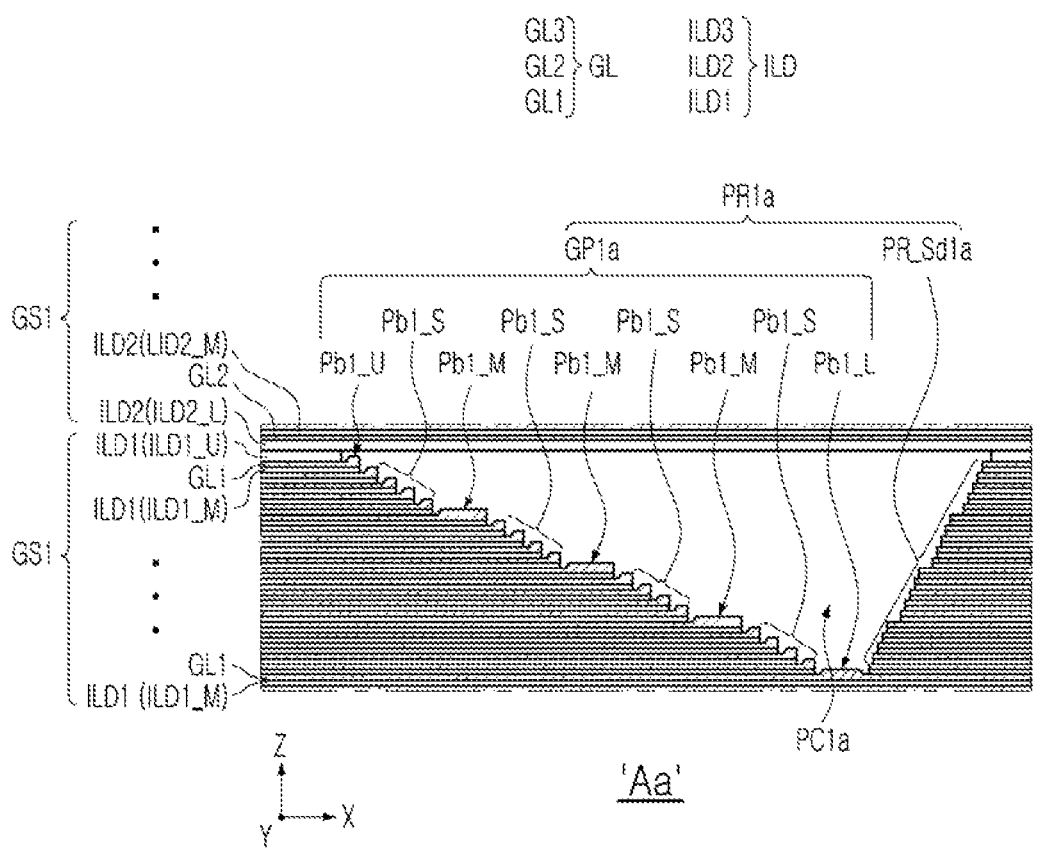
Figure 3B:
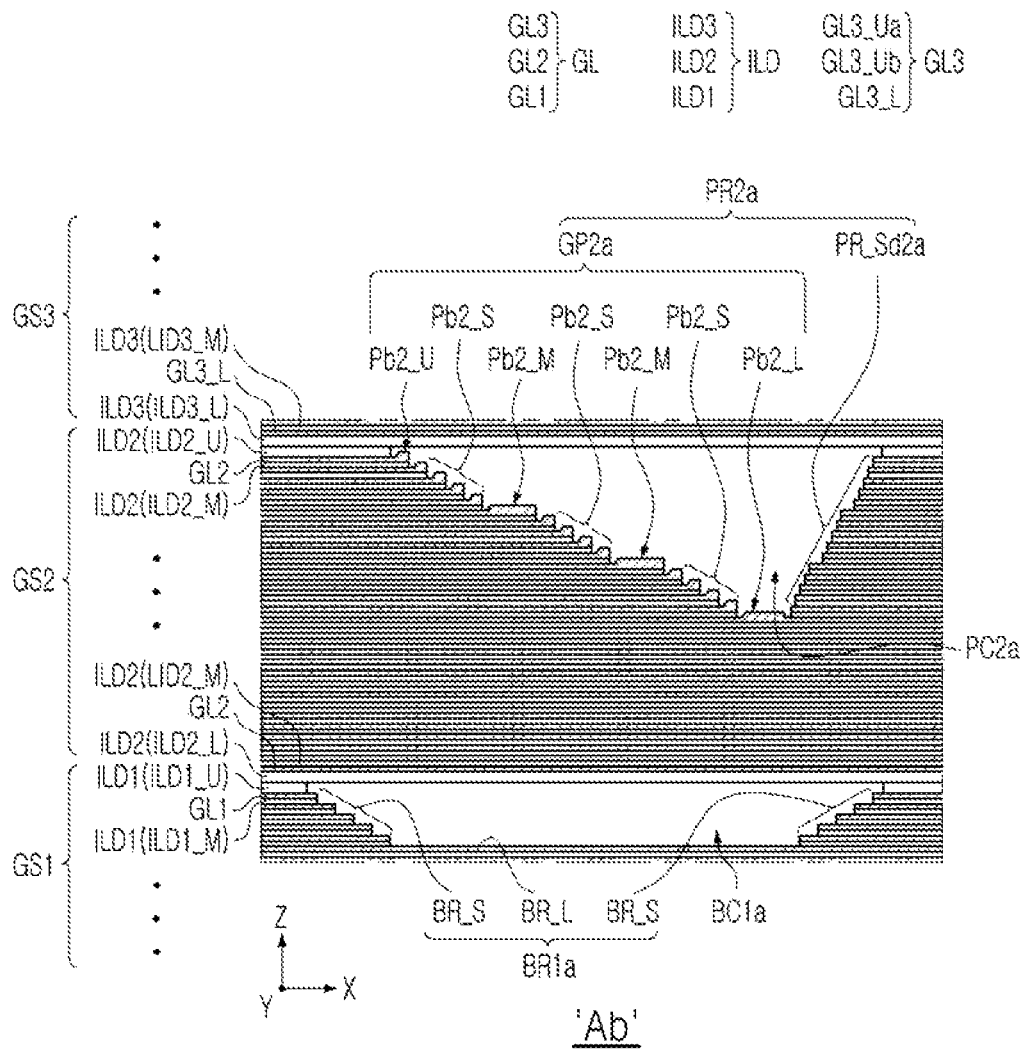
Figure 3C:
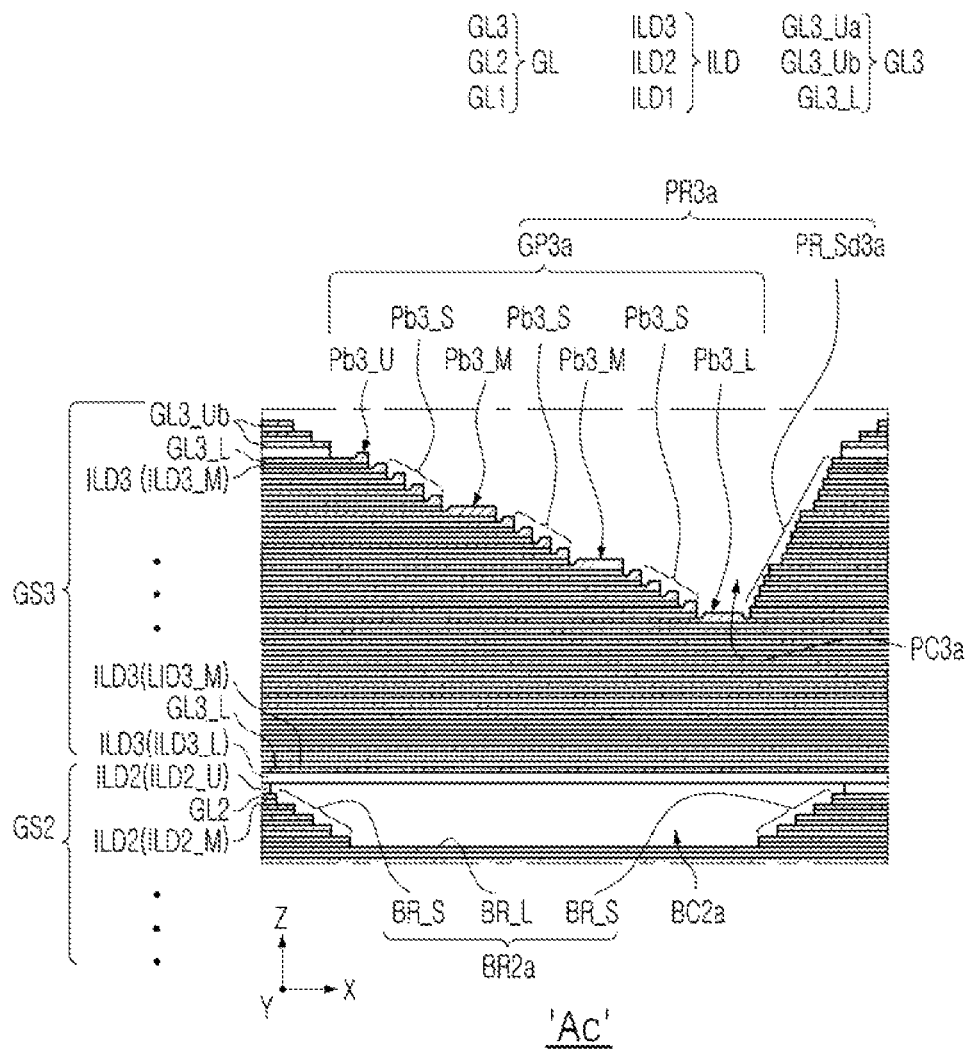
Figure 3D:
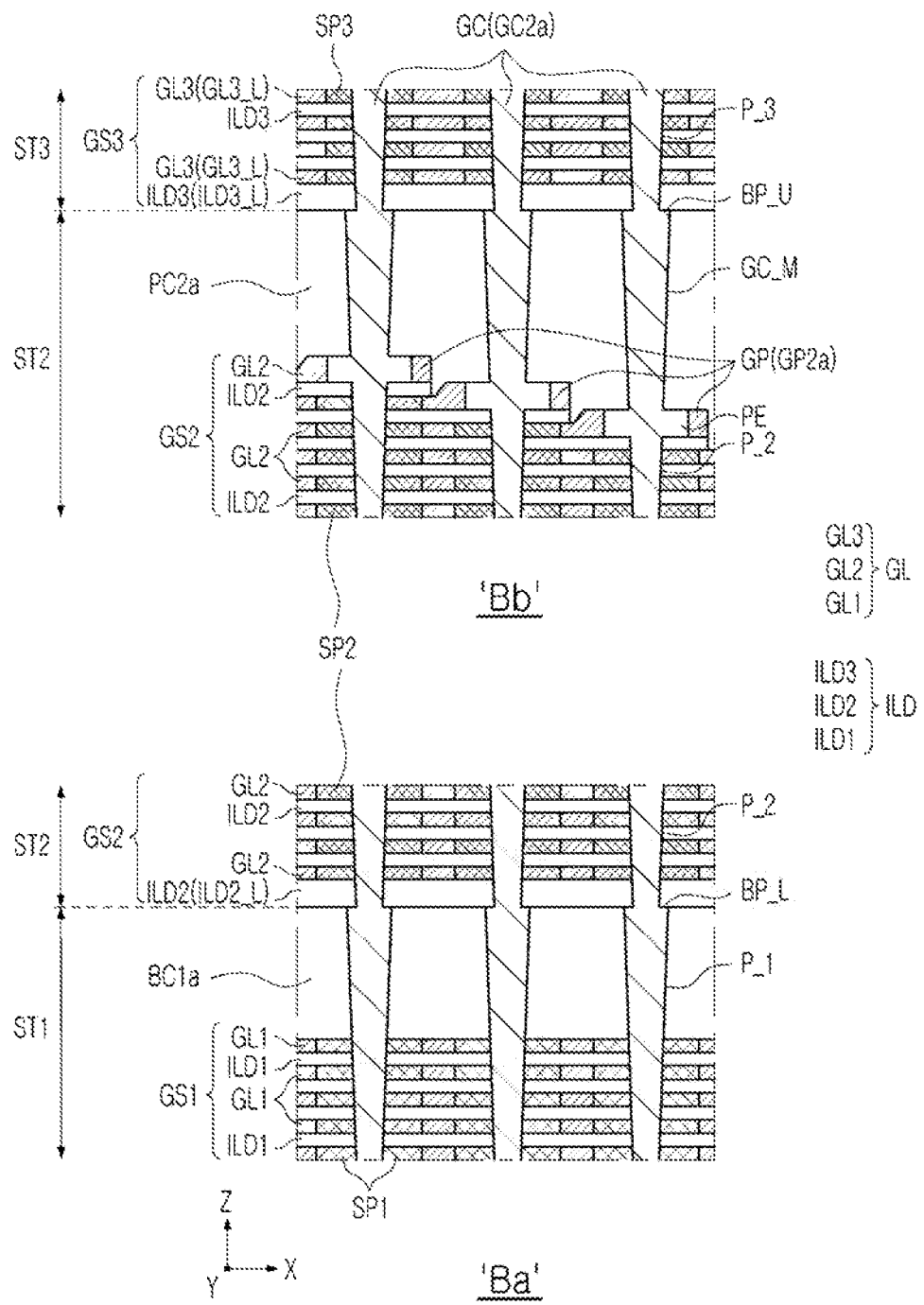
Figure 3E:
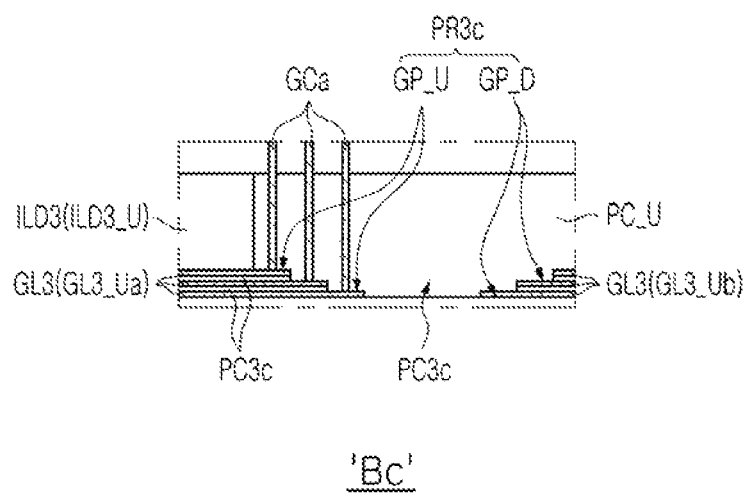
Figure 4:
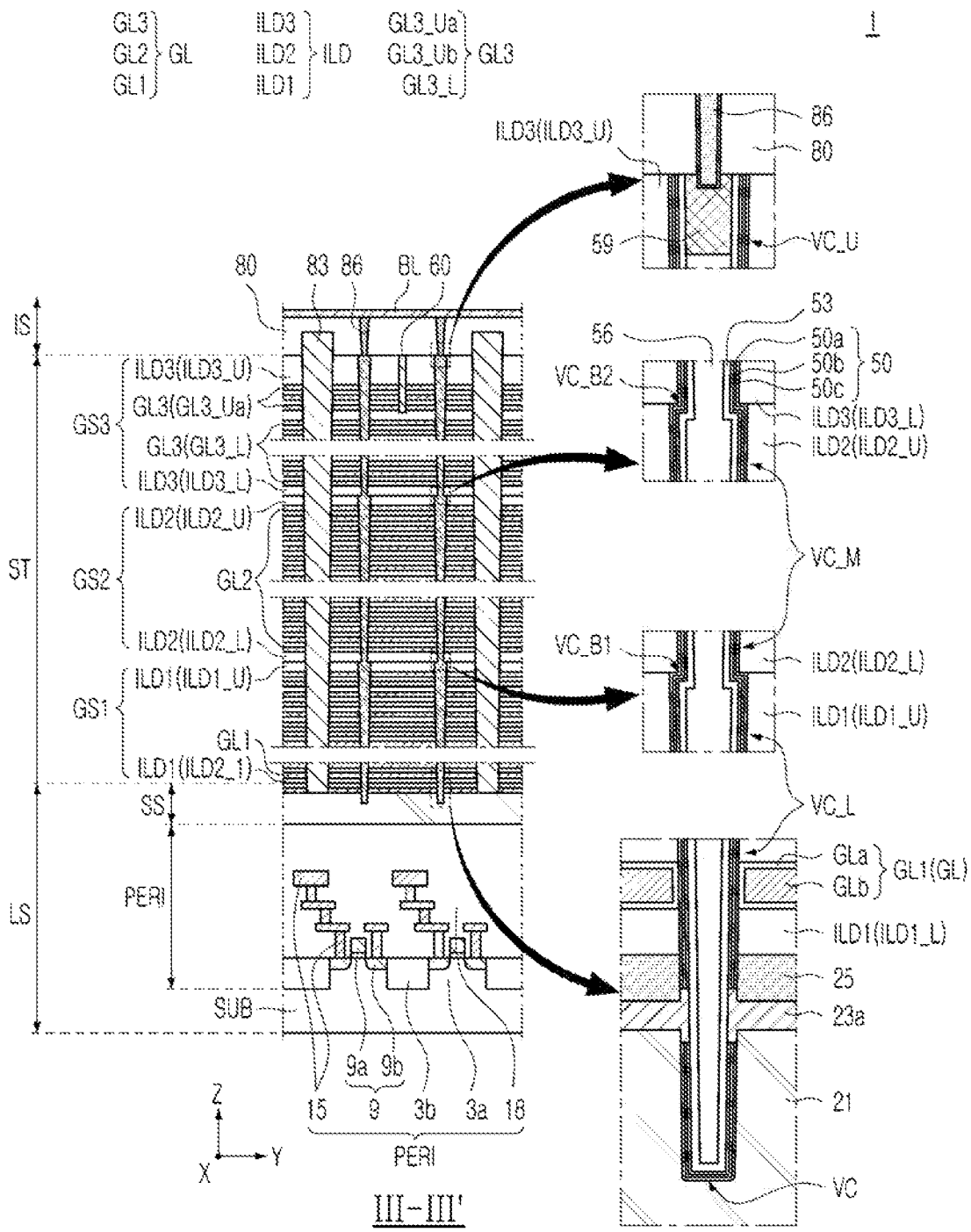
Figure 5A:
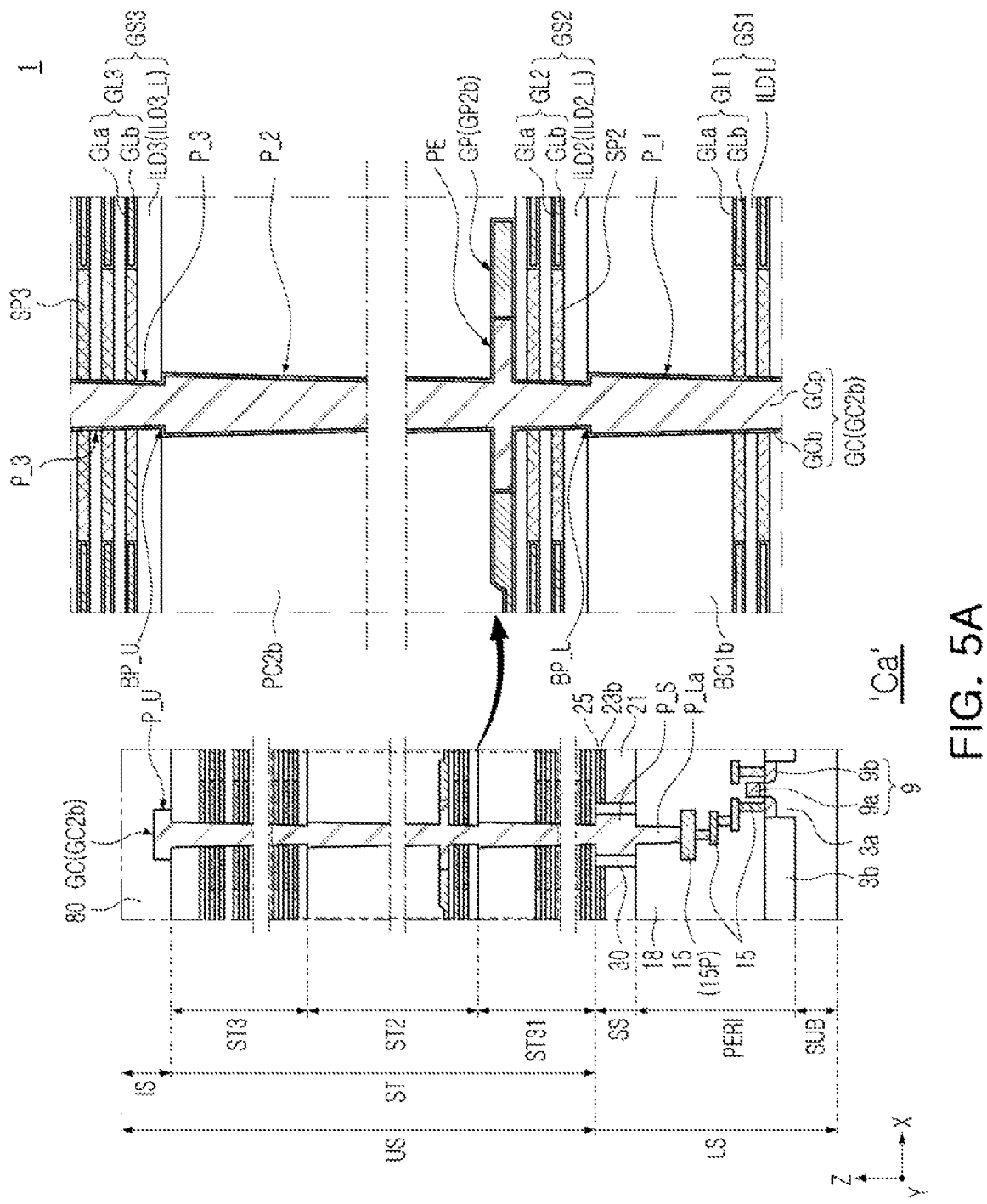
Figure 5B:
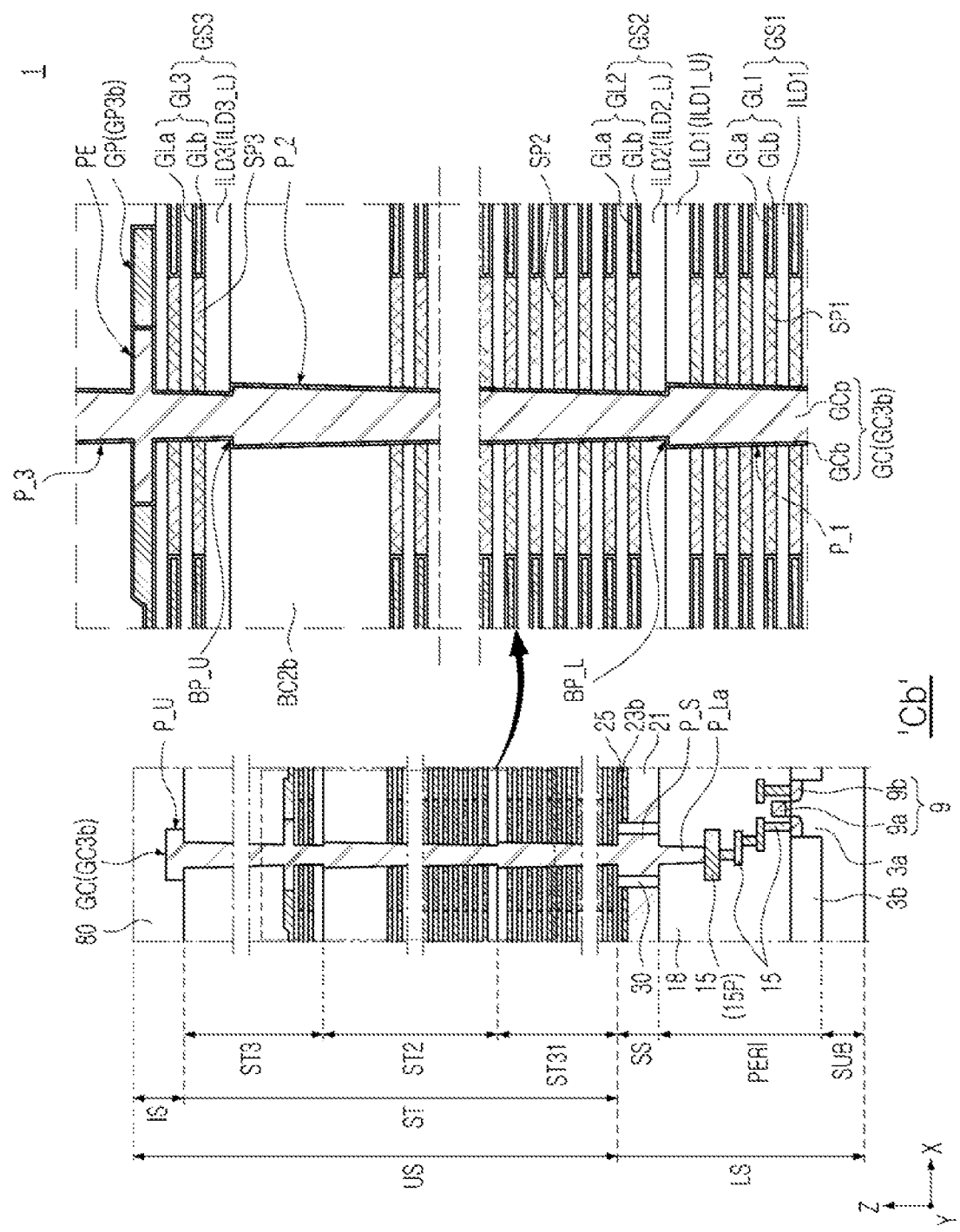
Figure 5C:
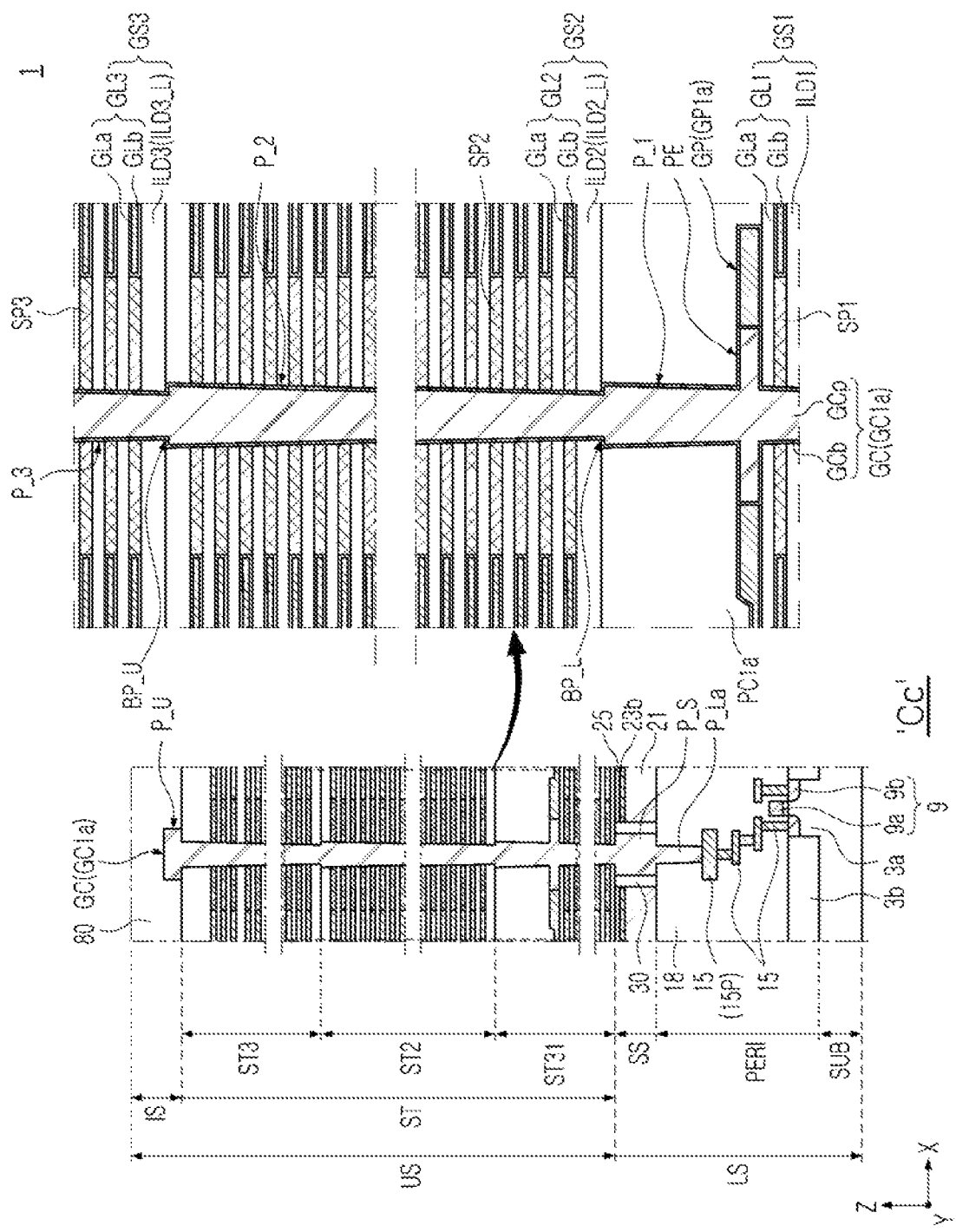
Figure 6A:
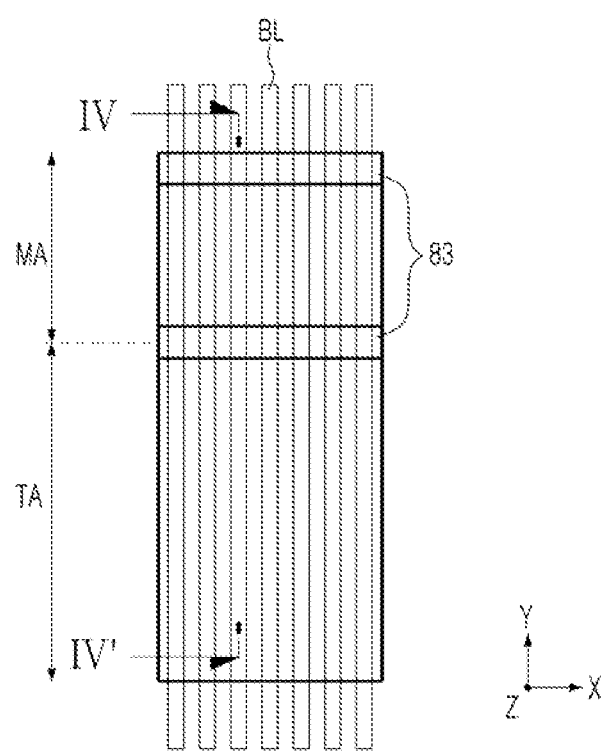
Figure 6B:
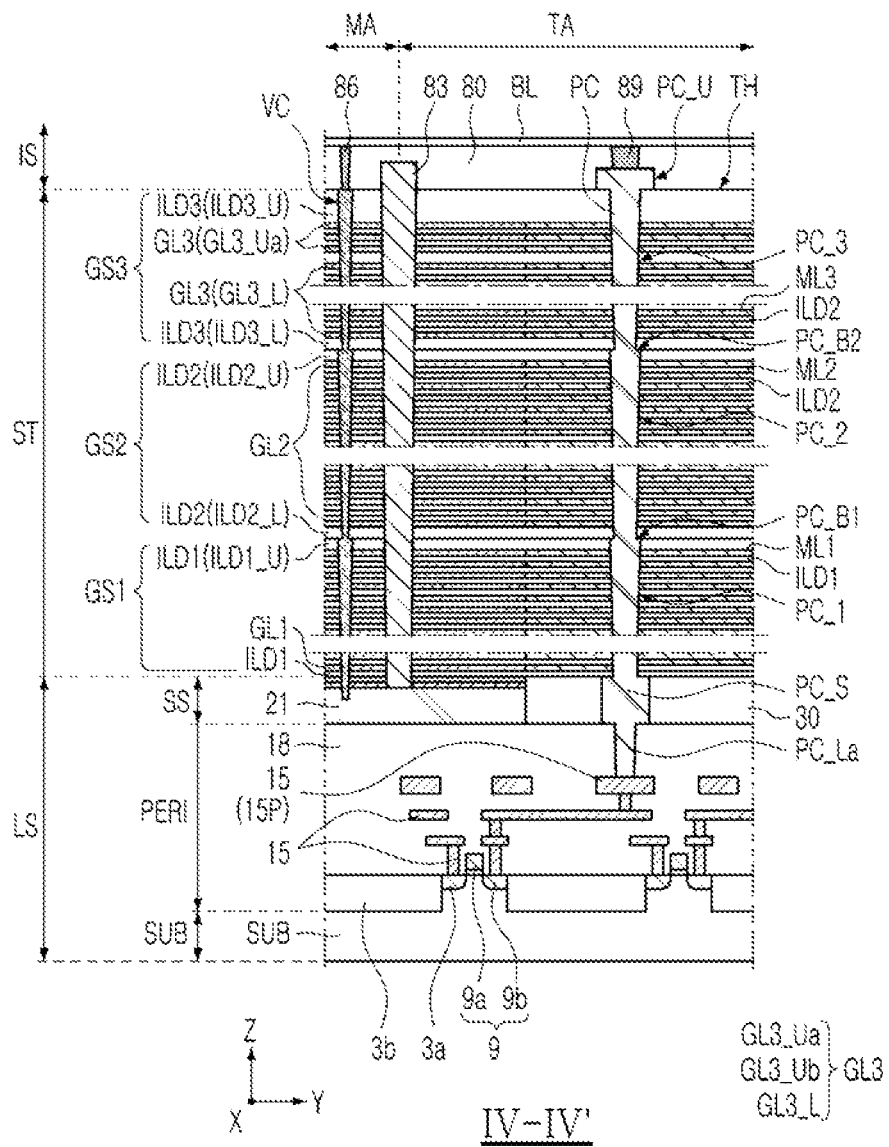

A semiconductor device according to an example embodiment will be described with reference to FIGS. 1, 2A, 2B, 3A to 3E, 4, 5A to 5C, 6A and 6B. In FIGS. 1 to 6E, FIG. 1 is a diagram illustrating a semiconductor device according to an example embodiment, viewed from above, FIG. 2A is a cross-sectional diagram illustrating a region taken along line I-I' in FIG. 1, FIG. 2B is a cross-sectional diagram illustrating region taken along line II-IF in FIG. 2A, FIG. 3A is an enlarged diagram region "Ab" in FIG. 2A, FIG. 3C is an enlarged diagram illustrating region "Ac" in FIG. 2A, FIG. 3D is an enlarged diagram illustrating region "Ba" and "Bb" in FIG. 2B, FIG. 3E is an enlarged diagram illustrating region "Be" in FIG. 2B, FIG. 4 is a cross-sectional diagram illustrating region taken along line in FIG. 1, FIG. 5A is an enlarged diagram illustrating region "Da" in FIG. 2B, FIG. 5B is an enlarged diagram illustrating region "Db" in FIG. 2B, FIG. 5C is an enlarged diagram illustrating region "Dc" in FIG. 2B, FIG. 6A is a diagram illustrating a semiconductor device according to an example embodiment, viewed from above, and FIG. 6B is a cross-sectional diagram illustrating region taken along line IV-IV' in FIG. 6B.

First, a semiconductor device according to an example embodiment will be described with reference to FIGS. 1, 2A, 2B, 3A to 3E, and 4.

Among FIGS. 1 to 4, referring to FIGS. 1, 2A, 2B, and 3A to 3E, the semiconductor device 1 according to an example embodiment may include a lower structure LS and an upper structure US on the lower structure LS.

The lower structure LS may include a source structure SS. The source structure SS may include polysilicon having N-type conductivity.

The lower structure LS may further include a substrate SUB and a peripheral circuit structure PERI on the substrate SUB.

The substrate SUB may be referred to as a semiconductor substrate. For example, the substrate SUB may be referred to as a semiconductor substrate including single crystal silicon. The peripheral circuit structure PERI may include a peripheral circuit such as a peripheral transistor. The source structure SS may be disposed on the peripheral circuit structure PERI.

The upper structure US may include a plurality of structures ST stacked in a vertical direction Z perpendicular to the upper surface of the substrate SUB and an upper wiring region IS on the plurality of structures ST.

The semiconductor device 1 may include a memory cell array region MA and a connection region CA disposed on at least one side of the memory cell array region MA. In the memory cell array region MA, memory cells storing data may be three-dimensionally arranged. The connection region CA may be referred to as an extension region, a contact region, a pad region, or a step region.

The plurality of structures ST may be disposed in the memory cell array region MA and the connection region CA.

The plurality of structures ST may include a first structure ST1 and a second structure ST2 on the first structure ST1. The plurality of structures ST may further include a third structure ST3 on the second structure ST2.

In example embodiments, the first structure ST1 may be referred to as a lower structure, the second structure ST2 may be referred to as an intermediate structure, and the third structure ST3 may be referred to as an upper structure.

The lower structure ST1 may include a lower stack structure GS1. The intermediate structure ST2 may include an intermediate stack structure GS2. The upper structure ST3 may include an upper stack structure GS3.

The lower stack structure GS1 may include lower interlayer insulating layers ILD1 and lower gate layers GL1 alternately stacked in the vertical direction Z. The lower interlayer insulating layers ILD1 may include a lowermost lower interlayer insulating layer, an uppermost lower interlayer insulating layer ILD1_U, and lower interlayer insulating layers ILD1_M between the lowermost lower interlayer insulating layer and the uppermost lower interlayer insulating layer ILD1_U. Among the lower interlayer insulating layers ILD1 and the lower gate layers GL1, the lowermost layer may be the lowermost lower interlayer insulating layer, and the uppermost layer may be the uppermost lower interlayer insulating layer ILD1_U.

The intermediate stack structure GS2 may include intermediate interlayer insulating layers ILD2 and intermediate gate layers GL2 alternately stacked. The intermediate interlayer insulating layers ILD2 may include a lowermost intermediate interlayer insulating layer ILD2_L, an uppermost intermediate interlayer insulating layer ILD2_U, and intermediate interlayer insulating layers ILD2_M between the lowermost intermediate interlayer insulating layer ILD2_L and the uppermost intermediate interlayer insulating layer ILD2_U. Among the intermediate interlayer insulating layers ILD2 and the intermediate gate layers GL2, the lowermost layer may be the lowermost intermediate interlayer insulating layer ILD2_L, and the uppermost layer may be the uppermost intermediate interlayer insulating layer ILD2_U.

The upper stack structure GS3 may include upper interlayer insulating layers ILD3 and upper gate layers GL3 alternately stacked. The upper interlayer insulating layers ILD3 may include a lowermost upper interlayer insulating layer ILD3_L, an uppermost upper interlayer insulating layer ILD3_U, and upper interlayer insulating layers ILD3_M between the lowermost upper interlayer insulating layer ILD3_L and the uppermost upper interlayer insulating layer ILD3_U. Among the upper interlayer insulating layers ILD3 and the upper gate layers GL3, the lowermost layer may be the lowermost upper interlayer insulating layer ILD3_L, and the uppermost layer may be the uppermost upper interlayer insulating layer ILD3_U.

In an example embodiment, each of the lower, intermediate, and upper interlayer insulating layers ILD1, ILD2, and ILD3 may include an insulating material such as silicon oxide.

In an example embodiment, each of the lower, intermediate, and upper gate layers GL1, GL2, and GL3 may include a gate electrode. Each of the lower, intermediate, and upper gate layers GL1, GL2, and GL3 may further include a gate dielectric layer covering upper and lower surfaces of the gate electrode and covering at least a portion of a side surface of the gate electrode.

The lower stack structure GS1 may include at least one lower pad recess region PR1a and PR1b and at least one lower buffer recess region BR1a and BR1b.

The at least one lower pad recess regions PR1a and PR1b and the at least one lower buffer recess region BR1a and BR1b may be disposed in the connection region CA.

In the lower stack structure GS1, the at least one lower pad recess regions PR1a and PR1b may have an open upper portion. The at least one lower buffer recess regions BR1a and BR1b may have an open upper portion.

The at least one lower pad recess region PR1a and PR1b may include a first lower pad recess region PR1a and a second lower pad recess region PR1b spaced apart further from the memory cell array region MA than the first lower pad recess region PR1a.

The first lower pad recess region PR1a may include a first lower gate pad region GP1a and a first dummy sidewall PR_Sd1a. The second lower pad recess region PR1b may include a second lower gate pad region GP1b and second dummy sidewalls PR_Sd1b, PR_Sd1c, and PR_Sd1d.

The first lower gate pad region GP1a may have a step shape lowering in a direction away from the memory cell array region MA with a first average slope.

The first dummy sidewall PR_Sd1a may have a step shape lowering in a direction toward the memory cell array region MA with a second average slope greater than the first average slope. The first dummy sidewall PR_Sd1a may have a steeper slope than the first lower gate pad region GP1a. The first dummy sidewall PR_Sd1a and the first lower gate pad region GP1a may oppose each other and may be disposed at substantially the same level. A distance between the first dummy sidewall PR_Sd1a and the first lower gate pad region GP1a may decrease downwardly.

The second lower gate pad region GP1b may have substantially the same step shape as that of the first lower gate pad region GP1a. The second lower gate pad region GP1b may have a step shape lowering in a direction away from the memory cell array region MA with a first average slope.

The second dummy sidewalls PR_Sd1b, PR_Sd1c, and PR_Sd1d of the second lower pad recess region PR1b may include a first dummy portion PR_Sd1b, a second dummy portion PR_Sd1c, and a third dummy portion PR_Sd1d.

The first dummy portion PR_Sd1b may have substantially the same shape as that of the first dummy sidewall PR_Sd1a. For example, the first dummy portion PR_Sd1b may have a step shape lowering with the second average slope in a direction toward the memory cell array region MA. The first dummy portion PR_Sd1b may have a steeper slope than that of the second lower gate pad region GP1b. The first dummy portion PR_Sd1b and the second lower gate pad region GP1b may oppose each other and may be disposed at substantially the same level. A distance between the first dummy portion PR_Sd1b and the second lower gate pad region GP1b may decrease downwardly.

The second dummy portion PR_Sd1c may be adjacent to the first dummy portion PR_Sd1b at a level higher than a level of that of the first dummy portion PR_Sd1b and may have a slope steeper than that of the first dummy portion PR_Sd1b. The third dummy portion PR_Sd1d may be adjacent to the second lower gate pad region GP1b at a level higher than a level of the second lower gate pad region GP1b and may oppose the second dummy portion PR_Sd1c. The third dummy portion PR_Sd1d may have a steeper slope than that of the first dummy portion PR_Sd1b. A distance between the second dummy portion PR_Sd1c and the third dummy portion PR_Sd1d may decrease downwardly. A minimum distance between the second dummy portion PR_Sd1c and the third dummy portion PR_Sd1d may be greater than or equal to a maximum distance between the first dummy portion PR_Sd1b and the second lower gate pad region GP1b. The second dummy portion PR_Sd1c and the third dummy portion PR_Sd1d may be disposed at substantially the same level as a level of the first dummy sidewall PR_Sd1a and the first lower gate pad region GP1a.

The first lower gate pad region GP1a and the second lower gate pad region GP1b may include gate pads of the lower gate layers GL1.

At least one of the first lower gate pad region GP1a and the second lower gate pad region GP1b may have a first upper pad Pb1_U, first stepped pad groups Pb1_S at a level lower than a level of the first upper pad Pb1_U, and one or more first intermediate pads Pb1_M disposed between the first stepped pad groups Pb1_S. At least one of the first lower gate pad region GP1*a* and the second lower gate pad region GP1*b* may further include a first lower pad Pb1_L at a level lower than a level of the first stepped pad groups Pb1_S.

The first lower pad Pb1_L of the first lower gate pad region GP1*a* may be disposed on a bottom surface of the first lower pad recess region PR1*a*.

The first stepped pad groups Pb1_S may include gate pads arranged in a stair shape lowering in the first horizontal direction X. The first horizontal direction X may be parallel to the upper surface of the substrate SUB and may be a direction from the memory cell array region MA toward the connection region CA.

Here, "n" number of first stepped pad groups Pb1_S may be disposed, and "n−1" number of first intermediate pads Pb1_M may be disposed. Here, "n" may be 2 or a natural number greater than 2.

In an example embodiment, the one or more first intermediate pads Pb1_M may be a plurality of first intermediate pads Pb1_M. Hereinafter, the plurality of first intermediate pads Pb1_M will be mainly described.

Each of the first intermediate pads Pb1_M may be disposed between the first stepped pad groups Pb1_S adjacent to each other. For example, one first intermediate pad Pb1_M may be disposed between the adjacent first stepped pad groups Pb1_S. The width of each of the first intermediate pads Pb1_M in the first horizontal direction X may be greater than the width of each of the gate pads of the first stepped pad groups Pb1_S in the first horizontal direction X.

The at least one lower buffer recess region BR1*a* and BR1*b* may include a first lower buffer recess region BR1*a* and a second lower buffer recess region BR1*b* disposed at substantially the same level. The first lower buffer recess region BR1*a* and the second lower buffer recess region BR1*b* may have substantially the same or similar shapes.

Each of the first lower buffer recess region BR1*a* and the second lower buffer recess region BR1*b* may include a bottom surface BR_L and sidewalls BR_S. The sidewalls BR_S may have a step shape gradually lowering in a direction toward the bottom surface BR_L.

In the one or more lower buffer recess regions BR1*a* and BR1*b*, the bottom surface BR_L may be at a level higher than a level of the bottom surface of the first lower pad recess region PR1*a*.

In the at least one lower buffer recess regions BR1*a* and BR1*b*, the bottom surface BR_L may be disposed at substantially the same level or similar levels as that of the uppermost first intermediate pad among the first intermediate pads Pb1_M of the first lower gate pad region GP1*a*.

In the at least one lower buffer recess regions BR1*a* and BR1*b*, the bottom surface BR_L may be disposed between an uppermost first stepped pad group and a next highest first stepped pad group among the first stepped pad groups Pb1_S.

The lower structure ST1 may include at least one lower pad capping patterns PC1*a* and PC1*b* on the at least one lower pad recess regions PR1*a* and PR1*b* and at least one lower buffer capping patterns BC1*a* and BC1*b* on the at least one lower buffer recess regions BR1*a* and BR1*b*. The at least one lower pad capping patterns PC1*a* and PC1*b* may fill the at least one lower pad recess region PR1*a* and PR1*b*, and the at least one lower buffer capping patterns BC1*a* and BC1*b* may fill the at least one lower buffer recess regions BR1*a* and BR1*b*.

The at least one lower pad capping patterns PC1*a* and PC1*b* and the at least one lower buffer capping patterns BC1*a* and BC1*b* may be formed of the same insulating material. For example, the at least one lower pad capping patterns PC1*a* and PC1*b* and the at least one lower buffer capping patterns BC1*a* and BC1*b* may include an insulating material such as silicon oxide.

The at least one lower pad capping patterns PC1*a* and PC1*b* may include a first lower pad capping pattern PC1*a* filling the first lower pad recess region PR1*a* on the first lower pad recess region PR1*a*, and a second lower pad capping pattern PC1*b* filling the second lower pad recess region PR1*b* on the second lower pad recess region PR1*b*. The maximum thickness of the second lower pad capping pattern PC1*b* in the vertical direction Z may be greater than the maximum thickness of the first lower pad capping pattern PC1*a* in the vertical direction Z.

The at least one lower buffer capping patterns BC1*a* and BC1*b* may include a first lower buffer capping pattern BC1*a* filling the first lower buffer recess region BR1*a* on the first lower buffer recess region BR1*a*, and a second lower buffer capping pattern BC1*b* filling the second lower buffer recess region BR1*b* on the second lower buffer recess region BR1*b*.

The first lower buffer capping pattern BC1*a* and the second lower buffer capping pattern BC1*b* may have the same thickness. A thickness of each of the first lower buffer capping pattern BC1*a* and the second lower buffer capping pattern BC1*b* may be smaller than the maximum thickness of the first lower pad capping pattern PC1*a* in the vertical direction Z.

The intermediate stack structure GS2 may include at least one intermediate pad recess region PR2*a* and PR2*b* and at least one intermediate buffer recess region BR2*a* and BR2*b*.

The at least one intermediate pad recess regions PR2*a* and PR2*b* and the at least one intermediate buffer recess region BR2*a* and BR2*b* may be disposed in the connection region CA.

In the intermediate stack structure GS2, the at least one intermediate pad recess regions PR2*a* and PR2*b* may have an open upper portion. The at least one intermediate buffer recess regions BR2*a* and BR2*b* may have an open upper portion.

The at least one intermediate pad recess region PR2*a* and PR2*b* may include a first intermediate pad recess region PR2*a* and a second middle pad recess region PR2*b* spaced apart further from the memory cell array region MA than the first intermediate pad recess region PR2*a*.

The first intermediate pad recess region PR2*a* may include a first intermediate gate pad region GP2*a* and a first dummy sidewall PR_Sd2*a*. The second intermediate pad recess region PR2*b* may include a second intermediate gate pad region GP2*b* and second dummy sidewalls PR_Sd2*b*, PR_Sd2*c*, and PR_Sd2*d*.

The first intermediate gate pad region GP2*a* may have a step shape lowering with substantially the same slope as that of the first lower gate pad region GP1*a*.

The first dummy sidewall PR_Sd2*a* of the first intermediate pad recess region PR2*a* may have a step shape lowering with substantially the same slope as that of the first dummy sidewall PR_Sd1*a* of the first lower pad recess region PR1*a*. The first dummy sidewall PR_Sd2*a* may have a steeper slope than that of the first intermediate gate pad region GP2*a*. The first dummy sidewall PR_Sd2*a* and the first intermediate gate pad region GP2*a* may oppose each other and may be disposed at substantially the same level. A distance between the first dummy sidewall PR_Sd2a and the first intermediate gate pad region GP2a may decrease downwardly.

The second intermediate gate pad region GP2b may have substantially the same step shape as that of the first intermediate gate pad region GP2a.

The second dummy sidewalls PR_Sd2b, PR_Sd2c, and PR_Sd2d of the first intermediate pad recess region PR2a may include a first dummy portion PR_Sd2b, a second dummy portion PR_Sd2c, and a third dummy portion PR_Sd2d.

The first dummy portion PR_Sd2b may have substantially the same shape as that of the first dummy sidewall PR_Sd2a. For example, the first dummy portion PR_Sd2b may have a step shape lowering with the second average slope in a direction toward the memory cell array region MA. The first dummy portion PR_Sd2b may have a steeper slope than that of the second intermediate gate pad region GP2b. The first dummy portion PR_Sd2b and the second intermediate gate pad region GP2b may oppose each other and may be disposed at substantially the same level. A distance between the first dummy portion PR_Sd2b and the second intermediate gate pad region GP2b may decrease downwardly.

The second dummy portion PR_Sd2c may be adjacent to the first dummy portion PR_Sd2b at a level higher than a level of that of the first dummy portion PR_Sd2b, and may have a slope steeper than that of the first dummy portion PR_Sd2b. The third dummy portion PR_Sd2d may be adjacent to the second intermediate gate pad region GP2b at a level higher than a level of the second intermediate gate pad region GP2b and may oppose the second dummy portion PR_Sd2c. The third dummy portion PR_Sd2d may have a steeper slope than that of the first dummy portion PR_Sd2b. A distance between the second dummy portion PR_Sd2c and the third dummy portion PR_Sd2d may decrease downwardly. A minimum distance between the second dummy portion PR_Sd2c and the third dummy portion PR_Sd2d may be greater than or equal to a maximum distance between the first dummy portion PR_Sd2b and the second intermediate gate pad region GP2b. The second dummy portion PR_Sd2c and the third dummy portion PR_Sd2d may be disposed at substantially the same level as a level of the first dummy sidewall PR_Sd2a and the first intermediate gate pad region GP2a.

The first intermediate gate pad region GP2a and the second intermediate gate pad region GP2b may include gate pads of the intermediate gate layers GL2.

At least one of the first intermediate gate pad region GP2a and the second intermediate gate pad region GP2b may include a second upper pad Pb2_U, second stepped pad groups Pb2_S at a level lower than a level of the second upper pad Pb2_U, and one or more second intermediate pads Pb2_M disposed between the second stepped pad groups Pb2_S. At least one of the first intermediate gate pad region GP2a and the second intermediate gate pad region GP2b may further include a second lower pad Pb2_L at a level lower than a level of the second stepped pad groups Pb2_S.

The second lower pad Pb2_L of the first intermediate gate pad region GP2a may be disposed on a bottom surface of the first intermediate pad recess region PR2a. The second stepped pad groups Pb2_S may include gate pads arranged in a step shape lowering in the first horizontal direction X.

Here, "n" number of first stepped pad groups Pb1_S may be disposed, "m" number of second stepped pad groups Pb2_S may be disposed, and "m−1" of the one or more second intermediate pads Pb2_M may be disposed.

Here, "m" may be a natural number different from "n." For example, "m" may be a natural number smaller than "n." For example, "n" may be "m+1." For example, four first stepped pad groups Pb1_S may be disposed and three second stepped pad groups Pb2_S may be disposed, but an example embodiment thereof is not limited thereto. For example, five first stepped pad groups Pb1_S may be disposed, and four second stepped pad groups Pb2_S may be disposed.

In an example embodiment, the one or more second intermediate pads Pb2_M may be a plurality of second intermediate pads Pb2_M. Hereinafter, the plurality of second intermediate pads Pb2_M will be mainly described.

Each of the second intermediate pads Pb2_M may be disposed between the second stepped pad groups Pb2_S adjacent to each other. For example, one second intermediate pad Pb2_M may be disposed between the second stepped pad groups Pb2_S adjacent to each other. The width of each of the second intermediate pads Pb2_M in the first horizontal direction X may be greater than the width of each of the gate pads of the second stepped pad groups Pb2_S in the first horizontal direction X.

The at least one intermediate buffer recess region BR2a and BR2b may include a first intermediate buffer recess region BR2a and a second intermediate buffer recess region BR2b disposed at substantially the same level. The first intermediate buffer recess region BR2a and the second intermediate buffer recess region BR2b may have substantially the same shape or similar shapes.

Each of the first intermediate buffer recess region BR2a and the second intermediate buffer recess region BR2b may include a bottom surface BR_L and sidewalls BR_S. The sidewalls BR_S may have a step shape gradually lowering in a direction toward the bottom surface BR_L.

In the at least one intermediate buffer recess regions BR2a and BR2b, the bottom surface BR_L may be at a level higher than a level of the bottom surface of the first intermediate pad recess region PR2a.

In the at least one intermediate buffer recess regions BR2a and BR2b, the bottom surface BR_L may be disposed at substantially the same level or similar level as a level of the second gate layer including an uppermost second intermediate pad among the second intermediate pads Pb2_M of the first intermediate gate pad region GP2a.

In the at least one of the intermediate buffer recess regions BR2a and BR2b, the bottom surface BR_L may be disposed at a level between the uppermost second stepped pad group and the next highest second stepped pad group.

The intermediate structure ST2 may include at least one intermediate pad capping patterns PC2a and PC2b on the at least one intermediate pad recess regions PR2a and PR2b and at least one intermediate buffer capping pattern BC2a and BC2b on the at least one intermediate buffer recess regions BR2a and BR2b.

The at least one intermediate pad capping patterns PC2a and PC2b may fill the at least one intermediate pad recess regions PR2a and PR2b, and the at least one intermediate buffer capping patterns BC2a and BC2b may fill the at least one of the intermediate buffer recess regions BR2a and BR2b.

The at least one intermediate pad capping patterns PC2a and PC2b and the at least one intermediate buffer capping patterns BC2a and BC2b may be formed of the same insulating material. For example, the at least one intermediate pad capping patterns PC2a and PC2b and the at least one intermediate buffer capping patterns BC2a and BC2b may include an insulating material such as silicon oxide.

The at least one intermediate pad capping patterns PC2a and PC2b may include a first intermediate pad capping pattern PC2a filling the first intermediate pad recess region PR2a on the first intermediate pad recess region PR2a, and a second intermediate pad capping pattern PC2b filling the second intermediate pad recess region PR2b on the second intermediate pad recess region PR2b.

The maximum thickness of the second intermediate pad capping pattern PC2b in the vertical direction Z may be greater than the maximum thickness of the first intermediate pad capping pattern PC2a in the vertical direction Z.

The at least one intermediate buffer capping patterns BC2a and BC2b may be a first intermediate buffer capping pattern filling the first intermediate buffer recess region BR2a on the first intermediate buffer recess region BR2a and a second intermediate buffer capping pattern BC2b filling the second intermediate buffer recess region BR2b on the second intermediate buffer recess region BR2b.

The first intermediate buffer capping pattern BC2a and the second intermediate buffer capping pattern BC2b may have the same thickness. A thickness of each of the first intermediate buffer capping pattern BC2a and the second intermediate buffer capping pattern BC2b may be smaller than the maximum thickness of the first intermediate pad capping pattern PC2a in the vertical direction Z.

The term "overlap" or "overlapping" may indicate that a layer is either above or below another layer while being located at least partially in the same area with respect to a reference direction, e.g., a vertical direction. It will be understood that when a layer is referred to as "overlapping" another layer, it can be directly over or under that layer or one or more intervening layers may be present.

The first lower buffer recess region BR1a and the first lower buffer capping pattern BC1a may vertically overlap the first intermediate pad recess region PR2a and the first intermediate pad capping pattern PC2a. The second lower buffer recess region BR1b and the second lower buffer capping pattern BC1b may vertically overlap the second intermediate pad recess region PR2b and the second intermediate pad capping pattern PC2b.

The upper stack structure GS3 may include a first upper stack structure GS3a and a second upper stack structure GS3b on the first upper stack structure GS3a. The first upper stack structure GS3a may include at least one upper pad recess region PR3a and PR3b. The at least one intermediate pad recess region PR3a and PR3b may be disposed in the connection region CA.

In the first upper stack structure GS3a, the at least one upper pad recess regions PR3a and PR3b may have an open upper portion. The at least one upper pad recess region PR3a and PR3b may include a first upper pad recess region PR3a and a second upper pad recess region PR3b spaced apart further from the memory cell array region MA.

The first upper pad recess region PR3a may include a first upper gate pad region GP3a and a first dummy sidewall PR_Sd3a. The second upper pad recess region PR3b may include a second upper gate pad region GP3b and second dummy sidewalls PR_Sd3b, PR_Sd3c, and PR_Sd3d.

The first upper gate pad region GP3a may have a step shape lowering at substantially the same slope as that of the first intermediate gate pad region GP2a. The first dummy sidewall PR_Sd3a of the first upper pad recess region PR3a may have a step shape with substantially the same slope as that of the first dummy sidewall PR_Sd2a of the first intermediate pad recess region PR2a. The first dummy sidewall PR_Sd3a may have a steeper slope than that of the first upper gate pad region GP3a. The first dummy sidewall PR_Sd3a and the first upper gate pad region GP3a may oppose each other and may be disposed at substantially the same level. A distance between the first dummy sidewall PR_Sd3a and the first upper gate pad region GP3a may decrease downwardly.

The second upper gate pad region GP3b may have substantially the same step shape as that of the first upper gate pad region GP3a.

The second dummy sidewalls PR_Sd3b, PR_Sd3c, and PR_Sd3d of the second upper pad recess region PR3b may include a first dummy portion PR_Sd3b, a second dummy portion PR_Sd3c, and a third dummy portion PR_Sd3d.

The first dummy portion PR_Sd3b may have substantially the same shape as the first dummy sidewall PR_Sd3a. For example, the first dummy portion PR_Sd3b may have a step shape lowering with the second average slope in a direction toward the memory cell array region MA. The first dummy portion PR_Sd3b may have a steeper slope than that of the second upper gate pad region GP3b. The first dummy portion PR_Sd3b and the second upper gate pad region GP3b may oppose each other and may be disposed at substantially the same level. A distance between the first dummy portion PR_Sd3b and the second upper gate pad region GP3b may decrease downwardly. The second dummy portion PR_Sd3c may be adjacent to the first dummy portion PR_Sd3b at a level higher than a level of that of the first dummy portion PR_Sd3b, and may have a slope steeper than that of the first dummy portion PR_Sd3b. The third dummy portion PR_Sd3d may be adjacent to the second upper gate pad region GP3b at a level higher than a level of the second upper gate pad region GP3b and may oppose the second dummy portion PR_Sd3c. The third dummy portion PR_Sd3d may have a steeper slope than that of the first dummy portion PR_Sd3b. A distance between the second dummy portion PR_Sd3c and the third dummy portion PR_Sd3d may decrease downwardly. A minimum distance between the second dummy portion PR_Sd3c and the third dummy portion PR_Sd3d may be greater than or equal to a maximum distance between the first dummy portion PR_Sd3b and the second upper gate pad region GP3b. The second dummy portion PR_Sd3c and the third dummy portion PR_Sd3d may be disposed at substantially the same level as a level of the first dummy sidewall PR_Sd3a and the first upper gate pad region GP3a.

At least one of the first upper gate pad region GP3a and the second upper gate pad region GP3b may include a third upper pad Pb3_U, a third stepped pad groups Pb3_S at a level lower level than a level of the third upper pad Pb3_U, and one or more third intermediate pads Pb3_M disposed between the third stepped pad groups Pb3_S. At least one of the first upper gate pad region GP33a and the second upper gate pad region GP3b may include a third lower pad Pb3_L at a level lower than a level of the third stepped pad groups Pb3_S.

The second lower pad Pb3_L of the first upper gate pad region GP3a may be disposed on a bottom surface of the first upper pad recess region PR3a.

The third stepped pad groups Pb3_S may include gate pads arranged in a step shape lowering in the first horizontal direction X.

Here, "n" number of first stepped pad groups Pb1_S may be disposed, "m" number of second stepped pad groups Pb2_S may be disposed, and "m" number of the third stepped pad groups Pb3_S may be disposed.

Here, 'm–1' number of the one or more third intermediate pads Pb3_M may be disposed. Here, "m" may be a natural number greater than "n." For example, "m" may be "n–1".

For example, fourth first stepped pad groups Pb1_S may be disposed, three second stepped pad groups Pb2_S may be disposed, and three third stepped pad group may be disposed, but an example embodiment thereof is not limited thereto. For example, five first stepped pad groups Pb1_S may be disposed, fourth second stepped pad groups Pb2_S may be disposed, and fourth third stepped pad groups Pb3_S may be disposed.

In an example embodiment, the one or more third intermediate pads Pb3_M may be a plurality of third intermediate pads Pb3_M. Hereinafter, the plurality of third intermediate pads Pb3_M will be mainly described.

Each of the third intermediate pads Pb3_M may be disposed between the third stepped pad groups Pb3_S adjacent to each other. For example, one third intermediate pad Pb3_M may be disposed between the adjacent third stepped pad groups Pb3_S. The width of each of the third intermediate pads Pb3_M in the first horizontal direction X may be greater than the width of each of the gate pads of the third stepped pad groups Pb3_S in the first horizontal direction X.

The second upper stack structure GS3b may expose the at least one upper pad recess region PR3a and PR3b. The upper stack structure GS3b may further include a third upper pad recess region PR3c. The third upper pad recess region PR3c may include a gate pad region GP_U having a step shape and lowering in a direction away from the memory cell array region MA, and a dummy pad region GP_D having a step shape and lowering in a direction toward the memory cell array region MA.

The upper structure ST3 may further include at least one upper pad capping pattern PC3a or PC3b on the at least one upper pad recess region PR3a or PR3b. The at least one upper pad capping patterns PC3a and PC3b may fill the at least one upper pad recess region PR3a and PR3b. The at least one upper pad capping patterns PC3a and PC3b may include an insulating material such as silicon oxide. The at least one upper pad capping patterns PC3a and PC3b may include a first upper pad capping pattern PC3a filling the first upper pad recess region PR3a on the first upper pad recess region PR3a, and a second upper pad capping pattern PC3b filling the second upper pad recess region PR3b on the second upper pad recess region PR3b. The maximum thickness of the second upper pad capping pattern PC3b in the vertical direction Z may be greater than the maximum thickness of the first upper pad capping pattern PC3a in the vertical direction Z.

The upper structure ST3 may further include a third pad capping pattern PC3c filling the third upper pad recess region PR3c on the third upper pad recess region PR3c. The first intermediate buffer recess region BR2a and the first intermediate buffer capping pattern BC2a may vertically overlap the first upper pad recess region PR3a and the first upper pad capping pattern PC3a. The second intermediate buffer recess region BR2b and the second intermediate buffer capping pattern BC2b may vertically overlap the second upper pad recess region PR3b and the second upper pad capping pattern PC3b.

Gate pads of the third gate layers GL3 of the upper stack structure GS3 may form the first and second upper gate pad regions GP3a and GP3b, and gate pads of the third gate layers GL3 of the second upper stack structure GS3 may form the third upper gate pad region GP_U.

Among the third gate layers GL3, the third gate layers of the first upper stack structure GS3a may be referred to as first upper gate layers GL3_L, and the third gate layers of the second upper stack structure GS3b may be referred to as second and third upper gate layers GL3_Ua and GL3_Ub.

Among the second and third upper gate layers GL3_Ua and GL3_Ub, the second upper gate layers GL3_Ua may extend from the memory cell array region MA into the connection region CA, the third upper gate layers GL3_Ub may be spaced apart from the second upper gate layers GL3_Ua and may be disposed within the connection region CA. The third upper gate layers GL3_Ub may also be referred to as dummy upper gate layers which may be electrically isolated.

In the first structure ST1, the first lower pad capping pattern PC1a, the first lower buffer capping pattern BC1a, the second lower buffer capping pattern BC1b, and the second pad capping pattern PC1b may be disposed in order in a direction away from the memory cell array region MA, that is, in the first horizontal direction X, and may be spaced apart from each other. The first lower pad capping pattern PC1a, the first lower buffer capping pattern BC1a, the second lower buffer capping pattern BC1b, and the second lower pad capping pattern PC1b may have a shape extending downwardly from the upper surface of the lower stack structure GS1. Lower surfaces of the first lower buffer capping pattern BC1a and the second lower buffer capping pattern BC1b may be disposed at substantially the same level, and may be disposed at a level higher than a level of the lower end of the first lower pad capping pattern PC1a. A portion of the first gate layers GL1 may be disposed between the first lower pad capping pattern PC1a and the first lower buffer capping pattern BC1a, a portion of the first gate layers GL1 may be disposed between the first lower buffer capping pattern BC1a and the second lower buffer capping pattern BC1b, and a portion of the first gate layers GL1 may be disposed between the second lower buffer capping pattern BC1b and the second lower pad capping pattern PC1b.

In the second structure ST2, the first intermediate pad capping pattern PC2a, the first intermediate buffer capping pattern BC2a, the second intermediate buffer capping pattern BC2b, and the second intermediate buffer capping pattern PC2b may be disposed in order in the first horizontal direction X and may be spaced apart from each. The first intermediate pad capping pattern PC2a, the first intermediate buffer capping pattern BC2a, the second intermediate buffer capping pattern BC2b, and the second intermediate pad capping pattern PC2b may have a shape extending downwardly from the upper surface of the intermediate stack structure GS2. Bottom surfaces of the first intermediate buffer capping pattern BC2a and the second intermediate buffer capping pattern BC2b may be disposed at substantially the same level, and may be disposed at a level higher than a level of the lower end of the first intermediate pad capping pattern PC2a. A portion of the second gate layers GL2 may be disposed between the first intermediate pad capping pattern PC2a and the first intermediate buffer capping pattern BC2a, a portion of the second gate layers GL2 may be disposed between the first intermediate buffer capping pattern BC2a and the second intermediate buffer capping pattern BC2b, and a portion of the second gate layers GL2 may be disposed between the second intermediate buffer capping pattern BC2b and the second intermediate pad capping pattern PC2b.

In the third structure ST3, the third upper pad capping pattern PC3c, the first upper pad capping pattern PC3a, and the second upper pad capping pattern PC3b may be disposed in order in the direction X. A portion of the first upper gate layers GL3_L may be disposed between the first upper pad capping pattern PC3a and the second upper pad capping pattern PC3b.

In example embodiments, in each of the plurality of structures ST, intermediate insulating layers and gate layers alternately stacked may be disposed between patterns spaced apart from each other. For example, in the first structure ST1, the first lower pad capping pattern PC1a and the first lower buffer capping pattern BC1a may be spaced apart from each other by the first lower gate layers GL1 and the lower interlayer insulating layers ILD1 alternately stacked. That is, the first lower gate layers GL1 and the lower interlayer insulating layers ILD1 may be disposed between the first lower pad capping pattern PC1a and the first lower buffer capping pattern BC1a. Accordingly, in the first structure ST1, patterns adjacent to each other among the patterns PC1a, BC1a, BC1b, and PC1b may be spaced apart from each other by the first interlayer insulating layers ILD1 and the first gate layers GL1 alternately stacked. Similarly, in the second structure ST2, the patterns PC2a, BC2a, BC2b, and PC2b may be spaced apart from each other by the second interlayer insulating layers ILD2 and the second gate layers GL2 alternately stacked, and in the second structure ST1, the patterns PC3a and PC3b are alternately stacked with each other by the third interlayer insulating layers ILD3 and the third gate layers GL3 alternately stacked.

The first to third gate layers GL1, GL2, and GL3 may include lower gate layers, intermediate gate layers on the lower gate layers, and upper gate layers on the intermediate gate layers. The lower gate layers may include a lower select gate electrode and a lower erase control gate electrode. The intermediate gate layers may include word lines. The upper gate layers may include an upper select gate electrode and an upper erase control gate electrode.

The first gate layers GL1 may form a portion of the lower gate layers and the intermediate gate layers. The second gate layers GL2 may form a portion of the intermediate gate layers. Among the third gate layers GL3, the first upper gate layers GL3_L may form a portion of the intermediate gate layers, the second upper gate layers GL3_Ua may form the upper gate layers. Accordingly, the first gate layers GL1 may include a portion of the word lines together with the lower select gate electrode and the lower erase control gate electrode, the second gate layers GL2 may include a portion of the word lines, the first upper gate layers GL3_L may include a portion of the word lines, and the second upper gate layers GL3_Ua may include the upper select gate electrode and the upper erase control gate electrode.

The semiconductor device 1 may further include vertical memory structures VC penetrating through the stack structures GS1, GS2, and GS3 in the memory cell array region MA. The vertical memory structures VC may be electrically connected to the source structure SS penetrating through the stack structures GS1, GS2, and GS3. The vertical memory structures VC may also be referred to as vertical channel structures. The semiconductor device 1 may further include contact plugs GC and PCa penetrating through at least the structures ST. The contact plugs GC and PCa may be disposed in the connection region CA. The contact plugs GC and PCa may penetrate through the structures ST and the source structure SS and extend into the peripheral circuit structure PERI.

The contact plugs GC and PCa may include gate contact plugs GC and GCa and first peripheral contact plugs PCa.

The gate contact plugs GC and GCa may include first gate contact plugs GC and second gate contact plugs GCa.

The lower stack structure GS1 may further include first isolation insulating layers SP1, the intermediate stack structure GS2 may further include second isolation insulating layers SP2, and the upper stack structure GS3 may further include third isolation insulating layers SP3.

The first isolation insulating layers SP1 may be disposed between the first gate layers GL1 not electrically connected to the first gate contact plugs GC among the first gate layers GL1 and the first gate contact plugs GC. The second isolation insulating layers SP2 may be disposed between the second gate layers GL2 not electrically connected to the first gate contact plugs GC among the second gate layers GL2 and the first gate contact plugs GC. The third isolation insulating layers SP3 may be disposed between third gate layers GL3 not electrically connected to the first gate contact plugs GC among the third gate layers GL3 and the first gate contact plugs GC. The first to third isolation insulating layers SP1, SP2, and SP3 may be formed of an insulating material such as silicon oxide.

The first gate contact plugs GC may be electrically connected to gate pads of the gate layers GL1, GL2, and GL3_L of the lower stack structure GS1, the intermediate stack structure GS2, and the first upper stack structure GS3a. The first gate contact plugs GC may penetrate through the gate pads GP of the gate layers GL1, GL2, and GL3_L of the lower stack structure GS1, the intermediate stack structure GS2, and the first upper stack structure GS3a and may be in contact with the gate pads GP of the gate layers GL1, GL2, and GL3_L of the lower stack structure GS1, the intermediate stack structure GS2, and the first upper stack structure GS3a.

The first gate contact plugs GC may include a horizontal extension portion PE in contact with each of the gate pads GP of the gate layers GL1, GL2, and GL3_L of the lower stack structure GS1, the intermediate stack structure GS2, and the first upper stack structure GS3a. The horizontal extension portion PE of one of the first gate contact plugs GC may be in contact with one of the gate pads GP. The horizontal extension portion PE may have a shape penetrating through and in contact with the gate pad GP. For example, a side surface of the horizontal extension portion PE may be in contact with the gate pad GP. In one first gate contact plug PE, the horizontal extension portion PE may extend or may be protruding from the center of the first gate contact plug PE toward the gate pad GP.

The second gate contact plugs GCa may be electrically connected to gate pads of the second upper gate layers GL3_Ua of the second upper stack structure GS3b. The second gate contact plugs GCa may be in contact with gate pads of the second upper gate layers GL3_Ua of the second upper stack structure GS3b on the gate pads of the second upper gate layers GL3_Ua of the second upper stack structure GS3b.

The first gate contact plugs GC may be disposed on substantially the same level. For example, the first gate contact plugs GC may have upper ends disposed on substantially the same level and lower ends disposed on substantially the same level. The first gate contact plugs GC may include first lower gate contact plugs GC1a disposed in order in the first direction, X away from the memory cell array region MA, first intermediate gate contact plugs GC2a, first upper gate contact plugs GC3a, second upper gate contact plugs GC3b, second intermediate gate contact plugs GC2b, and second lower gate contact plugs GC1b.

The first lower gate contact plugs GC1a may penetrate through the lower stack structure GS1, the first lower pad capping pattern PC1a, the intermediate stack structure GS2, and the upper stack structure GS3, may be electrically connected to gate pads of the first lower gate pad region GP1a of the first lower pad recess region PR1a of the lower stack structure GS1, and may be electrically insulated with, that is, isolated from, the other gate layers by the first to third isolation insulating layers SP1, SP2, and SP3. The second lower gate contact plugs GC1b may penetrate through the lower stack structure GS1, the second lower pad capping pattern PC1b, the intermediate stack structure GS2, and the upper stack structure GS3, may be electrically connected to gate pads of the second lower gate pad region GP1b of the second lower pad recess region PR1b of the lower stack structure GS1, and may be electrically insulated with, that is, isolated from, the other gate layers by the first to third isolation insulating layers SP1, SP2, and SP3. The first and second lower gate contact plugs GC1a and GC1b may be electrically connected to the lower gate layers GL1 through gate pads of the first and second lower gate pad regions GP1a and GP1b, and may be electrically insulated from the intermediate and upper gate layers GL2 and GL3.

The first intermediate gate contact plugs GC2a may penetrate through the lower stack structure GS1, the first lower buffer capping pattern BC1a, the intermediate stack structure GS2, the first intermediate pad capping pattern PC2a, and the upper stack structure GS3, may be electrically connected to the gate pads GP2a of the first intermediate gate pad region GP2a of the first intermediate pad recess region PR2a of the intermediate laminate structure GS2, and may be electrically insulated with, that is, isolated from, the other gate layers by the first to third isolation insulating layers SP1, SP2, and SP3. The second intermediate gate contact plugs GC2b may penetrate through the lower stack structure GS1, the second lower buffer capping pattern BC1b, the intermediate stack structure GS2, the second intermediate pad capping pattern PC2b, and the upper stack structure GS3, may be electrically connected to gate pads of the second intermediate gate pad region GP2b of the second intermediate pad recess region PR2b of the intermediate stack structure GS2, and may be electrically insulated with, that is, isolated from the other gate layers by the first to third isolation insulating layers SP1, SP2, and SP3. The first and second intermediate gate contact plugs GC2a and GC2b may be electrically connected to the intermediate gate layers GL2 through gate pads of the first and second intermediate gate pad regions GP2a and GP2b, and may be electrically insulated from the lower and upper gate layers GL1 and GL3.

The first upper gate contact plugs GC3a may penetrate through the lower stack structure GS1, the intermediate stack structure GS2, the first intermediate buffer capping pattern BC2a, the upper stack structure GS3, and the first upper pad capping pattern PC3a, may be electrically connected to the gate pads of the first upper gate pad region GP3a of the first upper pad recess region PR3a of the first upper stack structure GS3a, and may be electrically insulated with, that is, isolated from the other gate layers by the first to third isolation insulating layers SP1, SP2, and SP3. The second upper gate contact plugs GC3b penetrate through the lower stack structure GS1, the intermediate stack structure GS2, the second intermediate buffer capping pattern BC2b, the upper stack structure GS3, and the upper pad capping pattern PC3b, may be electrically connected to the gate pads of the second upper gate pad region GP3b of the second upper pad recess region PR3b of the first upper stack structure GS3a, and may be electrically insulated with, that is, isolated from the other gate layers by the first to third isolation insulating layers SP1, SP2, and SP3. The first and second upper gate contact plugs GC3a and GC3b may be electrically connected to the first upper gate layers GL3_L through gate pads of the first and second upper gate pad regions GP3a and GP3b, and may be electrically insulated from the lower and intermediate gate layers GL1 and GL2 and the second and third upper gate layers GL3_Ua and GL3_Ub.

The first gate contact plugs GC may be integrated with each other. For example, each of the first gate contact plugs GC may include at least one material layer extending from a lower region to an upper region.

Each of the first gate contact plugs GC may include a lower plug portion P_1, an intermediate plug portion P_2 on the lower plug portion P_1, an upper plug portion P_3 on the intermediate plug portion P_2, a lower bonding region BP_L between the lower plug portion P_1 and the intermediate plug portion P_2, and an upper bonding region BP_U between the intermediate plug portion P_2 and the upper plug portion P_3.

In each of the first gate contact plugs GC, a width of an upper region of the lower plug portion P_1 and a width of a lower region of the intermediate plug portion P_2 may be different, and a width of an upper region of the intermediate plug portion P_2 and a width of a lower region of the upper plug portion P_3 may be different. In each of the first gate contact plugs GC, as the width of the upper region of the lower plug portion P_1 and the lower region of the intermediate plug portion P_2 are different, a lower bending portion may be formed in the lower bonding region BP_L, and an upper bending portion may be formed in the upper bonding region BP_U. The lower bonding region BP_L may be referred to as a lower bending portion of a side surface of each of the first gate contact plugs GC, and the upper bonding region BP_U may be referred to as a bending portion of each side surface of the first gate contact plugs GC. Side surfaces of each of the first gate contact plugs GC may include the lower bending portion BP_L and the upper bending portion BP_U.

Among FIGS. 1 to 4, referring to FIG. 4, the peripheral circuit structure PERI of the lower structure LS may include a field region 3b defining a peripheral active region 3a on the substrate SUB, a peripheral circuit device 9 on the substrate SUB, the peripheral interconnection structure 15 electrically connected to the peripheral circuit device 9 on the substrate SUB, and a peripheral insulating structure 18 covering the peripheral circuit device 9 and the peripheral interconnection structure 15 on the substrate SUB.

The peripheral circuit device 9 may include a peripheral transistor including a gate 9a on the peripheral active region 3a and a peripheral source/drain 9b in the peripheral active region 3a adjacent to both sides of the gate 9a. The peripheral interconnection structure 15 may have a multilayer interconnection structure.

The source structure SS may include a first layer 21, a second layer 23a on the first layer 21, and a third layer 25 on the second layer 23a. At least one of the first to third layers 21, 23a, and 25 may be a common source. At least one of the first to third layers 21, 23a, and 25 may include doped silicon, for example, polysilicon having N-type conductivity. The first layer 21 may include at least one of a metal layer and a polysilicon layer. The second layer 23a may include a polysilicon layer. The third layer 25 may include a polysilicon layer.

The vertical memory structure VC may include a lower vertical portion VC_L, an intermediate vertical portion VC_M on the lower vertical portion VC_L, an upper vertical portion VC U on the intermediate vertical portion VC_M, a lower bonding region VC_B1 between the lower vertical portion VC_L and the intermediate vertical portion VC_M, and an upper bonding region VC_B2 between the intermediate vertical portion VC_M and the upper vertical portion VC U.

In the vertical memory structure VC, a width of an upper region of the lower vertical portion VC_L and a width of a lower region of the intermediate vertical portion VC_M may be different, and width of an upper region of the intermediate vertical portion VC_M may be different from a width of a lower region of the upper vertical portion VC U.

In the vertical memory structure VC, since the width of the upper region of the lower vertical portion VC_L and the width of the lower region of the intermediate vertical portion VC_M are different, a lower bending portion may be formed in the lower bonding region VC_B1, and an upper bending portion may be formed in the upper bonding region VC_B2. The lower bonding region VC_B1 may be referred to as a lower bending portion of a side surface of the vertical memory structure VC, and the upper bonding region VC_B2 may be referred to as an upper bending portion of a side surface of the vertical memory structure VC. The side surface of the vertical memory structure VC may include the lower bending portion VC_B1 and the upper bending portion VC_B2.

The vertical memory structure VC may include an insulating core region 56, a channel layer 53 covering side surfaces and a bottom surface of the insulating core region 56, a pad pattern 59 in contact with the channel layer 53 on the insulating core region 56, and a data storage structure 50 covering at least an external side surface of the channel layer 53. The data storage structure 50 may include a first dielectric layer 50a, a second dielectric layer 50c, and a data storage layer 50b between the first and second dielectric layers 50a and 50c. The first dielectric layer 50a may be interposed between the data storage layer 50b and the channel layer 53.

The insulating core region 56 may continuously extend from the internal region of the lower vertical portion VC_L to the upper vertical portion VC U. The channel layer 53 may continuously extend from within the lower vertical portion VC_L to the upper vertical portion VC U. At least a portion of the data storage structure 50 may continuously extend from the internal region of the lower vertical portion VC_L to the upper vertical portion VC U.

The insulating core region 56 may include silicon oxide, for example, silicon oxide which may be formed through an atomic layer deposition process, or silicon oxide having voids formed therein. The first dielectric layer 50a may include silicon oxide or silicon oxide doped with impurities. The second dielectric layer 50c may include at least one of silicon oxide and a high dielectric.

In an example, the data storage layer 50b may include a material for storing data by trapping a charge, for example, silicon nitride. The data storage layer 50b may include data storage regions for storing data in a semiconductor device such as a flash memory device.

In another example, the data storage layer 50b may be replaced with a floating gate for storing data using an injected charge.

In another example, the data storage structure 50 may include a variable resistance material layer storing data using a change in resistance according to a change in oxygen vacancy concentration, a phase change material layer that stores information using a resistance change due to a phase change, and a data storage structure including at least one of ferroelectric material layers for storing data using a ferroelectric. The channel layer 53 may include a silicon layer.

For example, at least a portion of the channel layer 53 may include an undoped silicon layer.

The pad pattern 59 may include at least one of doped polysilicon, metal nitride (e.g., TiN), metal (e.g., W), and metal-semiconductor compound (e.g., TiSi).

In an example, the pad pattern 59 may be disposed at a level higher than a level of an uppermost gate layer among the gate layers GL1, GL2, and GL3.

In an example, at least a portion of the pad pattern 59 may be disposed at substantially the same level as a level of at least a portion of an uppermost gate layer among the gate layers GL1, GL2, and GL3.

The vertical memory structure VC disposed in the memory cell array region MA may penetrate the lower, intermediate, and upper stack structures GS1, GS2, and GS3 and may extend into the source structure SS. The vertical memory structure VC may be in contact with the source structure SS. For example, the vertical memory structure VC may sequentially penetrate through the third layer 25 and the second layer 23a and may extend into the first layer 21.

At least one of the first, second, and third layers 21, 23a, and 25 may be in contact with the channel layer 53. For example, the second layer 23a may penetrate through the data storage structure 50 and may be in contact with the channel layer 53. A portion of the channel layer 53 in contact with the second layer 23a may be a silicon layer having the same conductivity type as that of the second layer 23a, for example, N-type conductivity.

Each of the gate layers GL1, GL2, and GL3 may include a first layer GLa and a second layer GLb. The first layer GLa may cover upper and lower surfaces of the second layer GLb and may extend to a region between the vertical memory structure VC and the second layer GLb.

In an example embodiment, the first layer GLa may include a dielectric material, and the second layer GLb may include a conductive material. For example, the first layer GLa may include a high-k dielectric such as AlO, and the second layer GLb may include a conductive material such as TiN, WN, Ti, or W.

In another example, the first layer GLa may include a first conductive material (e.g., TiN or W), and the second layer GLb may include a second conductive material (e.g., Ti or W) different from the first conductive material.

In another example, each of the gate layers GL1, GL2, and GL3 may be formed of doped polysilicon, a metal-semiconductor compound (e.g., TiSi, TaSi, CoSi, NiSi or WSi), a metal nitride (e.g., TiN, TaN or WN) or metal (e.g., Ti or W).

The lower gate layers GL1, the intermediate gate layers GL2, and the first upper gate layers GL3_L may include lower gate electrodes and intermediate gate electrodes on the lower gate electrodes, and the second upper gate layers GL3_Ua may include upper gate electrodes.

The lower gate layers GL1 may include a portion of the intermediate gate electrodes and the lower gate electrodes disposed below the intermediate gate electrodes.

Among the lower gate layers GL1, the lower gate electrodes may include a lower select gate electrode. Among the lower gate layers GL1, the lower gate electrodes may further include a lower erase control gate electrode below the lower select gate electrode.

The intermediate gate electrodes of the lower gate layers GL1, the intermediate gate layers GL2, and the first upper gate layers GL3_L may include word lines.

The upper gate electrodes of the second upper gate layers GL3_Ua may include an upper select gate electrode. The upper gate electrodes of the second upper gate layers GL3_Ua may further include an upper erase control gate electrode.

In an example, the upper select gate electrode of the second upper gate layers GL3_Ua may be disposed below the upper erase control gate electrode.

In another example, the upper select gate electrode of the second upper gate layers GL3_Ua may be disposed on the upper erase control gate electrode.

The semiconductor device 1 may further include a string isolation pattern 60 penetrating the second upper gate layers GL3_Ua. The second upper gate layers GL3_Ua may be isolated from each other in a second direction, Y perpendicular to the first direction, X by the string isolation pattern 60. The string isolation pattern 60 may include an insulating material such as silicon oxide.

The upper wiring region IS may include an upper insulating layer 80, a bit line contact plug 86 penetrating the upper insulating layer 80, and a bit line BL disposed on the upper insulating layer 80 and electrically connected to the bit line contact plug 86. The bit line BL may have a line shape extending in the second direction, Y.

The semiconductor device 1 may further include separation structures 83 penetrating the plurality of structures ST. The separation structures 83 may define memory blocks. At least a portion of the separation structures 83 may have a line shape extending in the first direction, X.

In an example, each of the separation structures 83 may be formed of an insulating material such as silicon oxide.

In another example, each of the separation structures 83 may include a conductive pattern electrically connected to the source structure SS and an insulating spacer on a side surface of the conductive pattern.

In the description below, an example of a semiconductor device according to an example embodiment will be described with reference to FIGS. 5A to 5C. FIG. 5A is an enlarged diagram illustrating a region indicated by arrow "Ca" in FIG. 2B, mainly illustrating one of the second intermediate gate contact plugs GC2b. FIG. 5B is an enlarged diagram illustrating a region indicated by arrow "Cb" in FIG. 2B, mainly illustrating one of the second upper gate contact plugs GC3b. FIG. 5C is an enlarged diagram illustrating a region indicated by arrow "Cc" in FIG. 2B, mainly illustrating one of the first lower gate contact plugs GC1a.

Referring to FIGS. 5A to 5C together with FIGS. 1 to 4, each of the first gate contact plugs GC may include the lower plug portion P_1, the intermediate plug portion P_2, the upper plug portion P_3, the lower bonding region BP_L, and the upper bonding region BP_U as described in the aforementioned example embodiment.

Each of the first gate contact plugs GC may further include a first lower portion P_S extending downwardly from the lower plug portion P_1 and penetrating the source structure SS, and a second lower portion P_La extending downwardly from the first lower portion P_S and electrically connected to the peripheral pad 15P of the peripheral interconnection structure 15. In each of the first gate contact plugs GC, a width of the first lower portion P_S may be greater than a width of the lower plug portion P_1 and a width of the second lower portion P_La. Accordingly, a side surface of each of the first gate contact plugs GC may include a bending portion between a side surface of the first lower portion P_S and a side surface of the lower plug portion P_1 and a bending portion between a side surface of the first lower portion P_S and a side surface of the second lower portion P_La.

Each of the first gate contact plugs GC may further include an upper portion P_U extending upwardly from the upper plug portion P_3 into the upper insulating layer 80. In each of the first gate contact plugs GC, the width of the upper portion P_U may be different from that of the upper plug portion P_3. For example, the width of the upper portion P_U may be greater than that of the upper plug portion P_3. Accordingly, the side surface of each of the first gate contact plugs GC may further include a bending portion between the side surface of the upper portion P_U and the side surface of the upper plug portion P_3.

Each of the first gate contact plugs GC may include at least one material layer extending from a lower region to an upper region of each of the first gate contact plugs GC. For example, each of the first gate contact plugs GC may include a first conductive material layer GCp and a second conductive material layer GCb covering side and lower surfaces of the first conductive material layer G_Cp. The second conductive material layer GCb may be a barrier layer. A material of the first conductive material layer GCp may be different from a material of the second conductive material layer GCb. The first conductive material layer GCp may include at least one of tungsten (W), molybdenum (Mo), copper (Cu), and aluminum (Al), and the second conductive material layer GCb may include at least one of titanium (Ti), titanium nitride (TiN), tantalum (Ta), tantalum nitride (TaN), tungsten nitride (WN), and combinations thereof.

A lower end of the first conductive material layer G_Cp may be disposed at a level lower than a level a lowermost gate layer among the first to third gate layers GL1 and GL2, and an upper end of the first conductive material layer G_Cp may be disposed at a level higher than a level of an uppermost gate layer among the first to third gate layers GL1 and GL2.

The first conductive material layer G_Cp may extend from a lower region to an upper region of each of the first gate contact plugs GC.

The semiconductor device 1 further may include an insulating layer 30 surrounding a side surface of the first lower portion P_S and isolating the first lower portion P_S from the source/structure SS. The insulating layer 30 may include an insulating material such as silicon oxide.

In the connection region CA, the source structure SS may include the first layer 21, the third layer 25, and a fourth layer 23b disposed between the first layer 21 and the third layer 25. The fourth layer 23b may be formed of a single insulating layer or multiple insulating layers. For example, the fourth layer 23b may include a silicon oxide layer, a silicon nitride layer, and a silicon oxide layer stacked in order.

In the source structure SS, the first layer 21 and the third layer 25 may be disposed in the memory cell array region MA and the connection region CA, the second layer 23a may be disposed in the memory cell array region MA, and the fourth layer 23b may be disposed in the connection region CA.

In each of the first gate contact plugs GC, the horizontal extension portion PE may have a width smaller than that of at least one isolation insulating layer among the first to third isolation insulating layers SP1, SP2, and SP3.

In example embodiments, in expressions such as "component A may include portion B, portion C on portion B, and the "bonding region" between portion B and portion C," portion B and portion C may be integrated with each other, and the bonding region may be understood as a region between the side of portion B and the side of portion C formed as the side of portion B and the side of portion C are not vertically aligned. For example, component A may include at least one layer of material, and such at least one layer of material may continuously extend from a lower region of portion B to an upper region of portion C.

In the description below, an example of a semiconductor device 1 according to an example embodiment will be described with reference to FIGS. 6A and 6B. FIG. 6A is a diagram illustrating the memory cell array region MA and the through region TA disposed in the second direction, Y of the memory cell array region MA, viewed from above, and FIG. 6B a cross-sectional diagram illustrating a region taken along line IV-IV' in FIG. 6A.

Referring to FIGS. 6A and 6B together with FIGS. 1 to 5, the above-described semiconductor device 1 may further include a through region TA disposed in the second direction, Y of the memory cell array region MA.

The lower, intermediate, and upper stack structures GS1, GS2, and GS3 may be disposed in the memory cell array region MA, and may be disposed in a portion of the through region TA adjacent to the memory cell array region MA.

The through region TA may further include a through insulating region TH. The through insulating region TH may include lower, intermediate, and upper horizontal layers ML1, ML2, and ML3 disposed at substantially the same level as a level of the lower, intermediate, and upper gate layers GL1, GL2, and GL3. The lower, intermediate, and upper horizontal layers ML1, ML2, and ML3 may include an insulating material different from the lower, intermediate, and upper interlayer insulating layers ILD1, ILD2, and ILD3, for example, silicon nitride.

The lower, intermediate, and upper interlayer insulating layers ILD1, ILD2, and ILD3 of the lower, intermediate, and upper stack structures GS1, GS2, and GS3 may extend into the through insulating region TH. Accordingly, the through insulating region TH may include the lower, intermediate, and upper horizontal insulating layers ML1, ML2, and ML3 and the lower, intermediate, and upper interlayer insulating layers ILD1, ILD2, and ILD3. Accordingly, within the through insulating region TH, the lower stack structure GS1 may include the lower interlayer insulating layers ILD1 and the lower horizontal layers ML1 alternately stacked, the intermediate stack structure GS2 may include the intermediate interlayer insulating layers ILD2 and the intermediate horizontal layers ML2 alternately stacked, and the upper stack structure GS3 may include upper interlayer insulating layers ILD3 and the upper horizontal layers ML3 alternately stacked.

The through region TA may further include a second peripheral contact plug PC penetrating through at least the through insulating region TH. The second peripheral contact plug PC may be spaced apart from the gate layers GL1, GL2, and GL3 by the lower, intermediate, and upper horizontal insulating layers ML1, ML2, and ML3.

The second peripheral contact plug PC may include a lower plug portion PC_1 penetrating the lower stack structure GS1 in the through insulating region TH, an intermediate plug portion PC_2 penetrating the intermediate stack structure GS2 in the through insulating region TH, an upper plug portion PC_3 penetrating the upper stack structure GS3 in the through insulating region TH, a lower bonding region PC_B1 between the lower plug portion PC_1 and the intermediate plug portion PC_2, and an upper bonding region PC_B2 between the intermediate plug portion PC_2 and the upper plug portion PC_3. A side surface of the peripheral contact plug PC may have a bending portion in the lower bonding region PC_B1 and a bending portion in the upper bonding region PC_B1.

The second peripheral contact plug PC may include a first lower portion PC_S extending downwardly from the lower plug portion PC_1 and penetrating the source structure SS, and a second lower portion PC_La extending downwardly from the first lower portion PC_S and electrically connected to the peripheral pad 15P of the peripheral interconnection structure 15. The first lower portion PC_S may be spaced apart from the source structure SS by the insulating layer 30.

In the second peripheral contact plug PC, the width of the first lower portion PC_S may be greater than the width of the lower plug portion PC_1 and the width of the second lower portion PC_La. Accordingly, the side surface of the peripheral contact plug PC may include a bending portion between the side surface of the first lower portion PC_S and the side surface of the lower plug portion PC_1 and a bending portion between the side surface of the first lower portion PC_S and the side surface of the second lower portion PC_La.

The second peripheral contact plug PC may further include an upper portion PC_U extending from the upper plug portion PC_3 into the upper insulating layer 80. In the peripheral contact plug PC, the width of the upper portion PC_U may be different from that of the upper plug portion PC_3. For example, the width of the upper portion PC_U may be greater than that of the upper plug portion PC_3. Accordingly, the side surface of the peripheral contact plug PC may further include a bending portion between the side surface of the upper portion PC_U and the side surface of the upper plug portion PC_3.

The second peripheral contact plug PC may be disposed on substantially the same level as a level of the first gate contact plugs GC, and may be formed of the same material as that of the first gate contact plugs GC.

Each of the aforementioned first peripheral contact plugs PCa (in FIG. 2B) may have substantially the same structure as the structure of the second peripheral contact plug PC. Similarly to the second peripheral contact plug PC, each of the first peripheral contact plugs PCa (in FIG. 2B) may be spaced apart from the gate layers GL1, GL2, and GL3 by the lower, intermediate, and upper horizontal insulating layers ML1, ML2, and ML3.

The bit line BL may extend from the memory cell array region MA into the through region TA.

The semiconductor device 1 may include a plug 89 electrically connecting the bit line BL to the peripheral contact plug PC between the bit line BL and the peripheral contact plug PC. Accordingly, the vertical memory structure VC may be electrically connected to a peripheral circuit in the peripheral circuit structure PERI through the bit line BL and the peripheral contact plug PC.

Hereinafter, various example embodiments of the components of the above-described example embodiment will be described. Various example embodiments of the components of the above-described example embodiment will be described. Also, components which may be modified or replaced described below will be described with reference to the drawings, but may be combined with each other.

Figure 7:
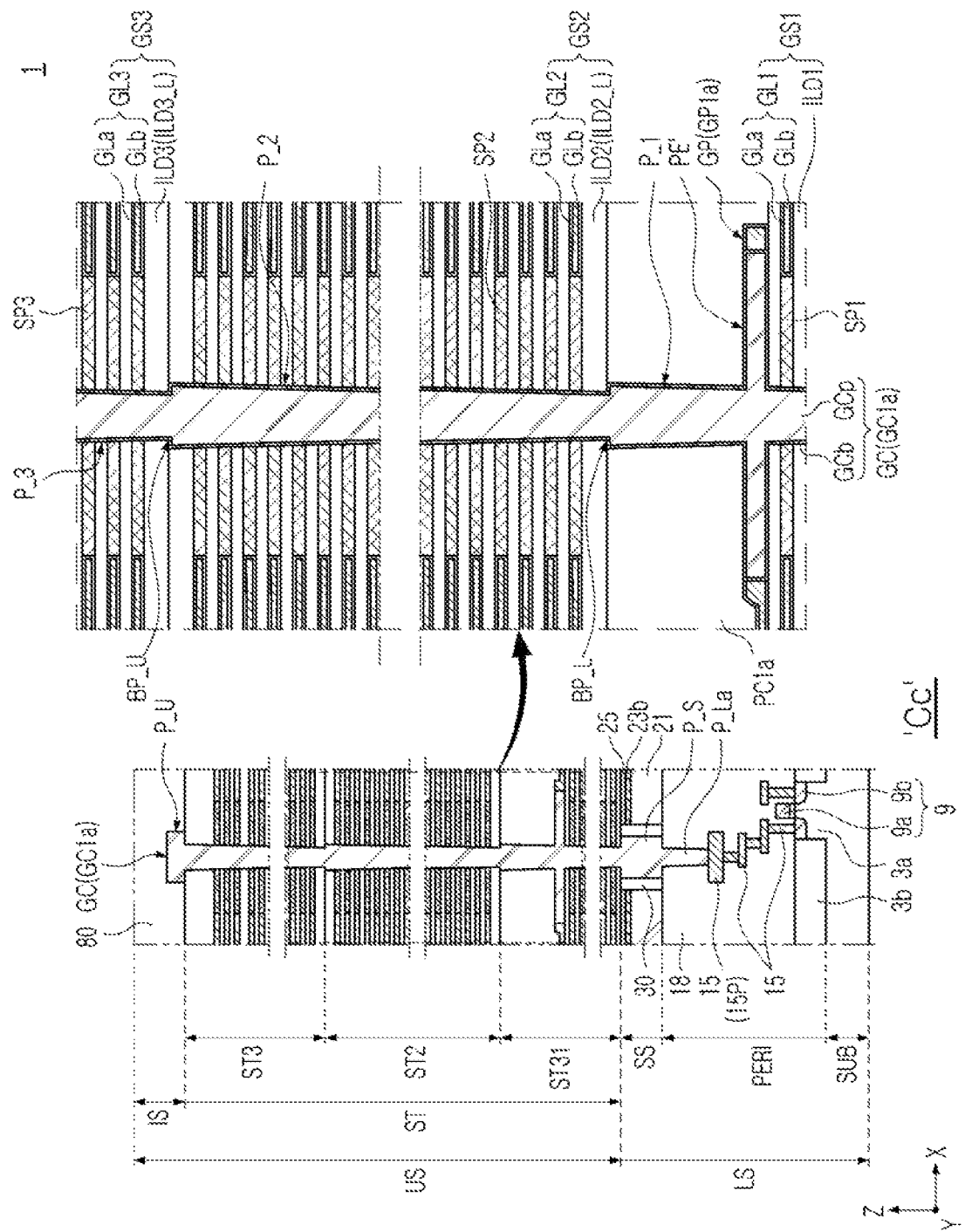
FIG. 7 is a cross-sectional diagram illustrating an example embodiment of a semiconductor device according to an example embodiment.

As described with reference to FIGS. 5A to 5C, in each of the first gate contact plugs GC, the horizontal extension portion PE may have a width smaller than that of at least one isolation insulating layer among the first to third isolation insulating layers SP1 and SP2, SP3, but an example embodiment thereof is not limited thereto. The example in which the horizontal extension portion PE has a width equal to or greater than that of at least one isolation insulating layer among the first to third isolation insulating layers SP1, SP2, and SP3 in each of the first gate contact plugs GC will be described with reference to FIG. 7. FIG. 7 is an enlarged diagram illustrating a region indicated by arrow "Cc" in FIG. 2B, illustrating one of the first lower gate contact plugs GC1a, and also illustrating an example embodiment of the first gate contact plugs GC described above.

In an example embodiment, referring to FIG. 7, the horizontal extension portion PE of each of the first gate contact plugs GC described with reference to FIGS. 5A to 5C may be modified to a horizontal extension portion PE' having a width equal to or greater than that of at least one isolation insulating layer among the first to third isolation insulating layers SP1, SP2, and SP3.

Figure 8A:
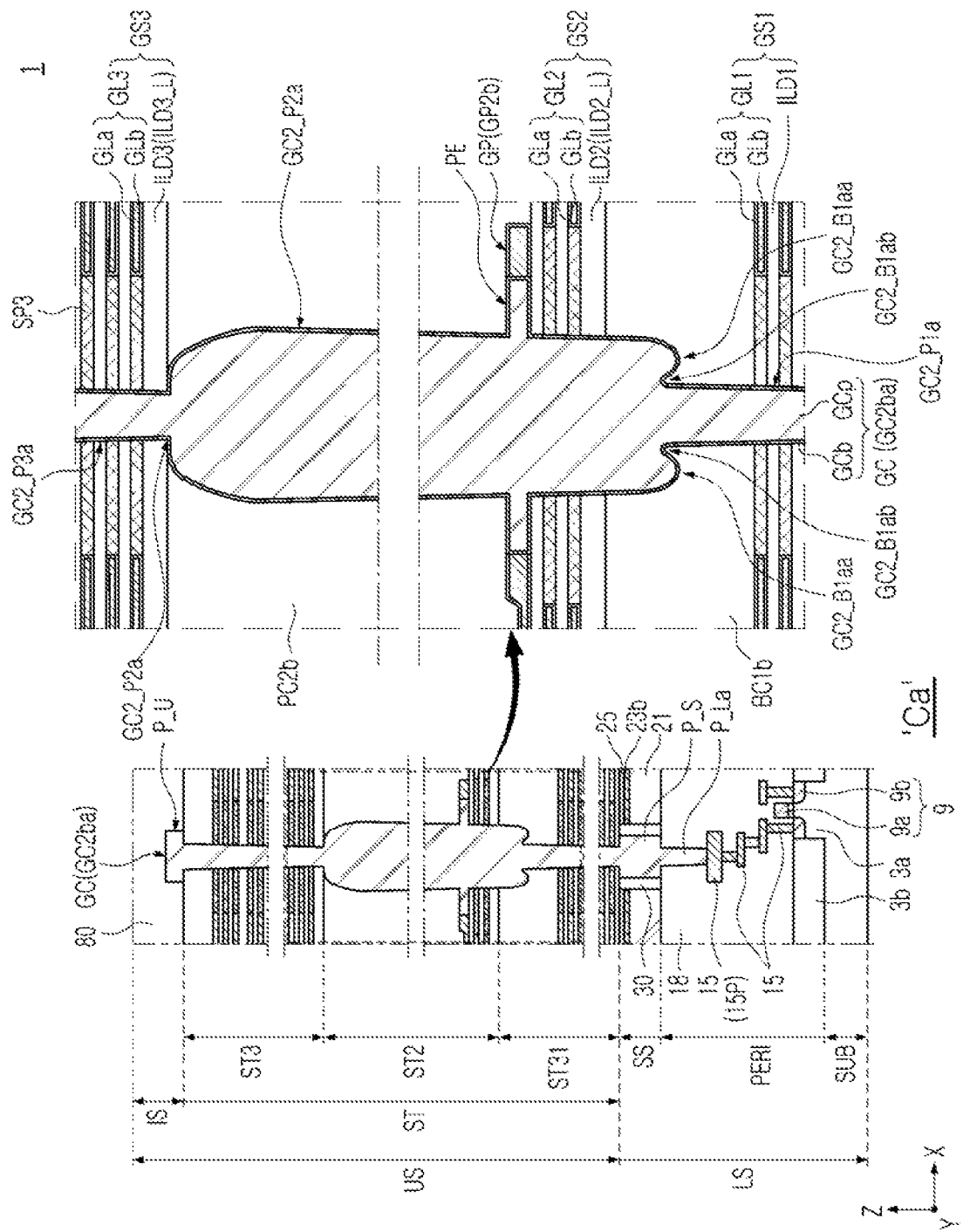
FIG. 8A is an enlarged cross-sectional diagram illustrating an example embodiment of a semiconductor device according to an example embodiment.
Figure 8B:
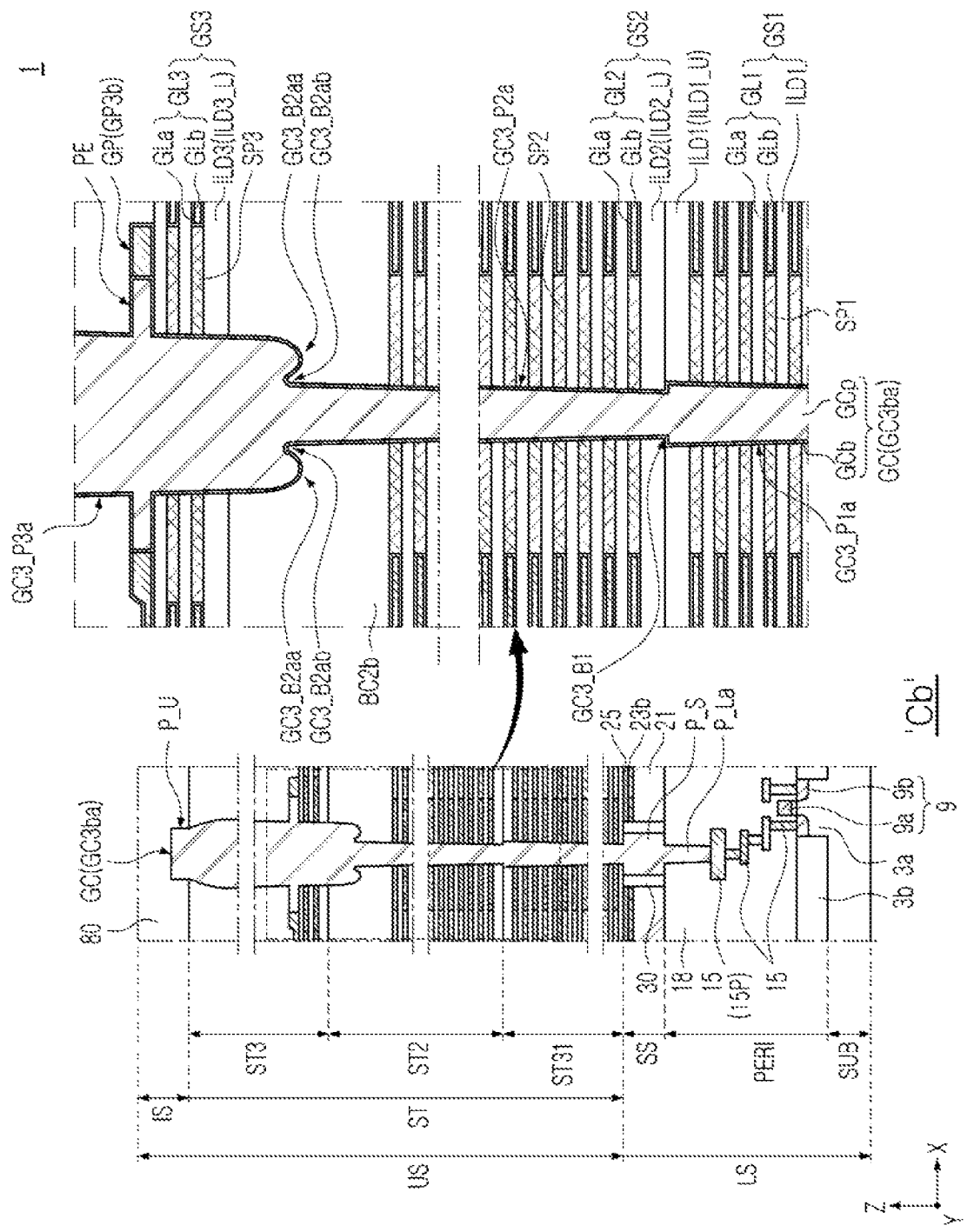
FIG. 8B is an enlarged cross-sectional diagram illustrating an example embodiment of a semiconductor device according to an example embodiment.
Figure 9:
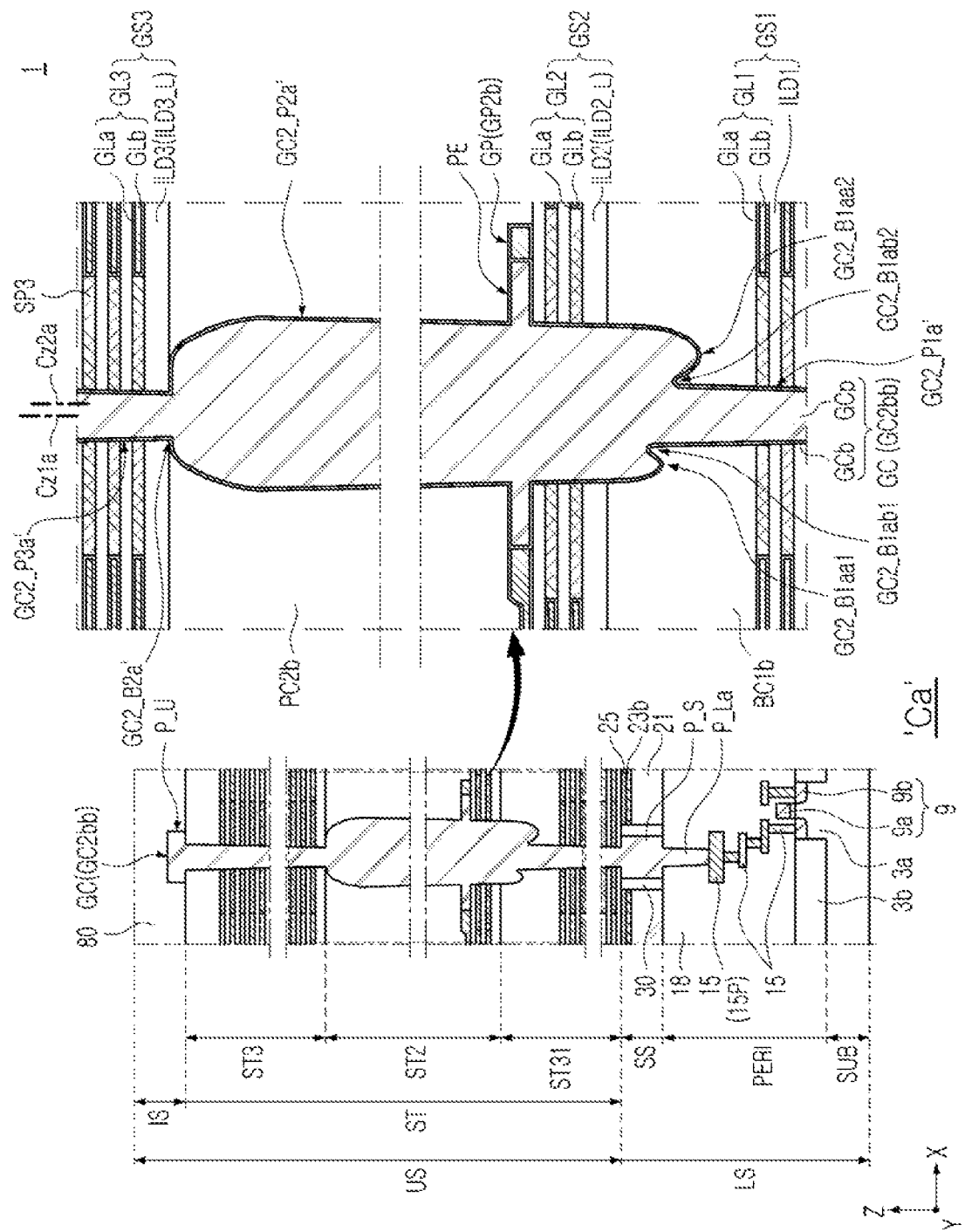
FIG. 9 is an enlarged cross-sectional diagram illustrating an example embodiment of a semiconductor device according to an example embodiment.
Figure 10:
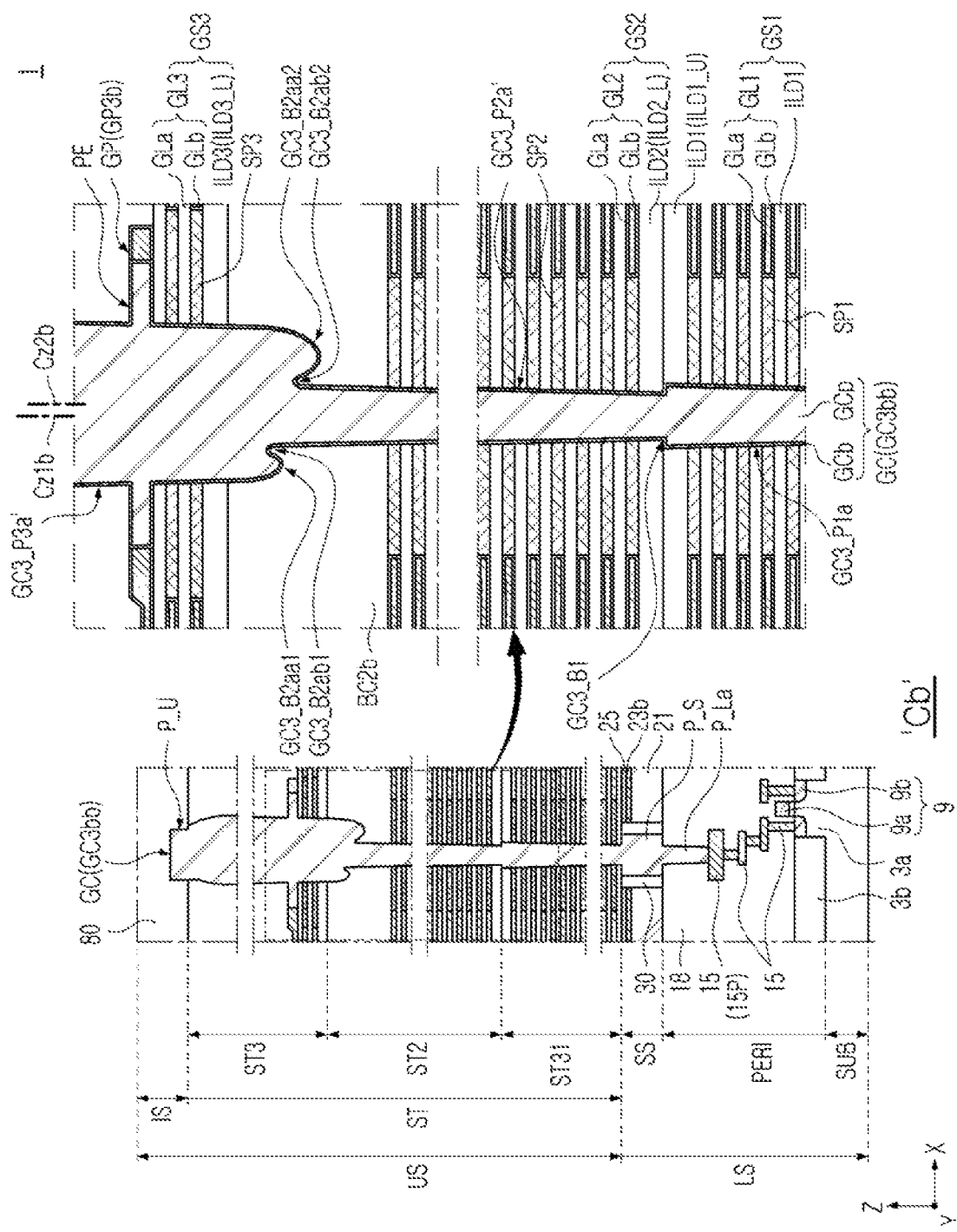
FIG. 10 is an enlarged cross-sectional diagram illustrating an example embodiment of a semiconductor device according to an example embodiment.

In the description below, referring to FIGS. 8A, 8B, 9, and 10, various example embodiments of the first gate contact plugs GC described above with reference to FIGS. 5A to 5C will be described. FIG. 8A is a cross-sectional diagram corresponding to the cross-sectional diagram in FIG. 5A, illustrating a second intermediate gate contact plug GC2ba which may replace the second intermediate gate contact plug GC2b in FIG. 5A. FIG. 8B is a cross-sectional diagram corresponding to FIG. 5B and illustrating a second upper gate contact plug GC3ba which may replace the second upper gate contact plug GC3b illustrated in FIG. 5B. FIG. 9 is a cross-sectional diagram corresponding to the cross-sectional diagram in FIG. 8A and illustrating a second intermediate gate contact plug GC2bb which may replace the second intermediate gate contact plug GC2ba in FIG. 8A. FIG. 10 is a cross-sectional diagram illustrating a second upper gate contact plug GC3bb which may replace the second upper gate contact plug GC3ba in FIG. 9B. In an example embodiment, referring to FIG. 8A, the second intermediate gate contact plug GC2b (FIG. 5A) in FIG. 5A may be modified to a second intermediate gate contact plug GC2ba as in FIG. 8A. For example, the intermediate plug portion P_2 of the second intermediate gate contact plug GC2b (FIG. 5A) in FIG. 5A may be modified to an intermediate plug portion GC2_P2a having an increased width as illustrated in FIG. 8A, the lower plug portion P_1 of the second intermediate gate contact plug GC2b (FIG. 5A) in FIG. 5A may be modified to a lower plug portion GC2_P1a bonded to the intermediate plug portion GC2_P2a as illustrated in FIG. 8A, and the upper plug portion P_3 of the second intermediate gate contact plug GC2b (FIG. 5A) in FIG. 5A may be modified to an upper plug portion GC2_P3a bonded to the intermediate plug portion GC2_P2a as illustrated in FIG. 8A. Accordingly, the second intermediate gate contact plug GC2ba may include the lower plug portion GC2_P1a, the intermediate plug portion GC2_P2a, the upper plug portion GC2_P3a, a lower bonding region GC2_B lab between the lower plug portion GC2_P1a and the intermediate plug portion GC2_P2a, and an upper bonding region GC2_B2a between the intermediate plug portion GC2_P2a and the upper plug portion GC2_P3a.

A width of a lower region of the intermediate plug portion GC2_P2a may be greater than a width of an upper region of the lower plug portion GC2_P1a. The maximum width of the intermediate plug portion GC2_P2a may be about 1.5 times greater than the minimum width of the lower plug portion GC2_P1a. The maximum width of the intermediate plug portion GC2_P2a may be about twice or more the minimum width of the lower plug portion GC2_P1a. A width of an upper region of the intermediate plug portion GC2_P2a may be greater than a width of a lower region of the upper plug portion GC2_P3a. The maximum width of the intermediate plug portion GC2_P2a may be 1.5 times greater than the minimum width of the upper plug portion GC2_P3a. The maximum width of the intermediate plug portion GC2_P2a may be twice or more the minimum width of the upper plug portion GC2_P3a.

The lower end GC2_B1aa of the intermediate plug portion GC2_P2a may be disposed at a level lower than a level of the lower bonding region GC2_B1ab. The lower end GC2_B1aa of the intermediate plug portion GC2_P2a may be spaced apart from the upper region of the lower plug portion GC2_P1a and may surround the upper region of the lower plug portion GC2_P1a.

The lower end GC2_B1aa of the intermediate plug portion GC2_P2a may be a first bending portion on the side of the second intermediate gate contact plug GC2ba, and the upper end of the side surface of the lower plug portion GC2_P1a or the lower bonding region GC2_B1ab may be a second bending portion of a side surface of the second intermediate gate contact plug GC2ba.

At least one of the lower end GC2_B1aa of the intermediate plug portion GC2_P2a and the lower bonding region GC2_B lab may be disposed within the second lower buffer capping pattern BC1b. Accordingly, at least one of the lower end GC2_B1aa of the intermediate plug portion GC2_P2a and the lower bonding region GC2_B1ab may be disposed at a level lower than a level of the upper surface of the second lower buffer capping pattern BC1b, and may be disposed at a level higher than a level of the lower surface of the lower buffer capping pattern BC1b.

At least one of the lower end GC2_B1aa of the intermediate plug portion GC2_P2a and the lower bonding region GC2_B lab may be disposed at a level lower than a level of the uppermost first gate layer among the first gate layers GL1 not vertically overlapping the second lower buffer capping pattern BC1b. At least one of the lower end GC2_B1aa of the intermediate plug portion GC2_P2a and the lower bonding region GC2_B1ab may be disposed at a level lower than a level of the next highest first gate layer among the first gate layers GL1 vertically overlapping the second lower buffer capping pattern BC1b.

The maximum width of the intermediate plug portion GC2_P2a may be greater than the maximum width of the intermediate plug portion P_2 (in FIG. 5C) of the first lower gate contact plug GC1a (in FIG. 5C).

The lower bonding region GC2_B lab may be disposed at a level lower than a level of the lower bonding region BP_L (in FIG. 5C) of the first lower gate contact plug GC1a (in FIG. 5C).

According to the example embodiment, when the lower bonding region GC2_B lab is formed at a level lower than a level of the uppermost first gate layer among the first gate layers GL1, the second lower buffer capping pattern BC1b may prevent an electrical short or leakage current between the second intermediate gate contact plug GC2ba and the first gate layers GL1.

In an example embodiment, referring to FIG. 8B, the second upper gate contact plug GC3b (FIG. 5B) in FIG. 5B may be modified to a second upper gate contact plug GC3ba as in FIG. 8B. For example, the upper plug portion P_3 of the second upper gate contact plug GC3b (FIG. 5B) in FIG. 5B may be modified to an upper plug portion GC3_P3a having an increased width as illustrated in FIG. 8B. The intermediate plug portion P_2 of the second upper gate contact plug GC3b (FIG. 5B) in FIG. 5B may be modified to an intermediate plug portion GC3_P2a bonded to the upper plug portion GC3_P3a as illustrated in FIG. 8B. Accordingly, the second upper gate contact plug GC3_P3a may include the intermediate plug portion GC3_P2a and the upper plug portion GC3_P3a. The second upper gate contact plug GC3_P3a may further include a lower plug portion GC3_P1a substantially the same as the lower plug portion P_1 of the second upper gate contact plug GC3b (FIG. 5B) in FIG. 5B. Accordingly, the second upper gate contact plug GC3_P3a may include the lower plug portion GC3_P1a, the intermediate plug portion GC3_P2a, the upper plug portion GC3_P3a, the lower plug portion GC3_P1a, the intermediate plug portion GC3_P2a, the upper plug portion GC3_P3a, the lower bonding region GC3_B1 between the lower plug portion GC3_P2a and the intermediate plug portion GC3_P2a, and the upper bonding region GC3_B2ab between the intermediate plug portion GC3_P2a and the upper plug portion GC3_P3a. The lower bonding region GC3_B1 may be substantially the same as the lower bonding region BP_L (in FIG. 5B) of the second upper gate contact plug GC3b (FIG. 5B) in FIG. 5B.

A width of a lower region of the upper plug portion GC3_P3a may be greater than a width of an upper region of the intermediate plug portion GC3_P2a. The maximum width of the upper plug portion GC3_P3a may be about 1.5 times greater than the minimum width of the intermediate plug portion GC3_P2a. The maximum width of the upper plug portion GC3_P3a may be about twice or more the minimum width of the intermediate plug portion GC3_P2a.

The lower end GC3_B2aa of the upper plug portion GC3_P3a may be disposed at a level lower than a level of the upper end of the intermediate plug portion GC3_P2a and the upper bonding region GC3_B2ab. The lower end GC3_B2aa of the upper plug portion GC3_P3a may be disposed to be spaced apart from the upper region of the intermediate plug portion GC3_P2a and may surround the upper region of the intermediate plug portion GC3_P2a.

The lower end GC3_B2aa of the upper plug portion GC3_P3a may be a first bending portion on the side surface of the second upper gate contact plug GC3ba, and the upper end of the side of the intermediate plug portion GC3_P2a or the upper bonding region GC3_B2ab may be a second bending portion of a side surface of the second upper gate contact plug GC3ba.

The lower end GC3_B2aa of the upper plug portion GC3_P3a and the upper bonding region GC3_B2ab may be disposed within the second intermediate buffer capping pattern BC2b. Accordingly, the lower end GC3_B2aa of the upper plug portion GC3_P3a and the upper bonding region GC3_B2ab may be disposed at a level lower than a level of the upper surface of the second intermediate buffer capping pattern BC2b, and may be disposed at a level higher than a level of the lower surface of the second intermediate buffer capping pattern BC2b.

At least one of the lower end GC3_B2aa of the upper plug portion GC3_P3a and the upper bonding region GC3_B2ab may be disposed at a level lower than a level of the uppermost second gate layer not vertically overlapping the second intermediate buffer capping pattern BC2b. At least one of the lower end GC3_B2aa of the upper plug portion GC3_P3a and the upper bonding region GC3_B2ab may be disposed at a level lower than a level of the next highest second gate layer of the second gate layers GL2 not vertically overlapping the second intermediate buffer capping pattern BC2b.

In an example embodiment, referring to FIG. 9, the second intermediate gate contact plug GCba (FIG. 8A) in FIG. 8A may be modified to a second intermediate gate contact plug GC2bb as in FIG. 9. The intermediate plug portion GC2_P2a (FIG. 8A) in FIG. 8A may be modified to an intermediate plug portion GC2_P2a' shifted in one horizontal direction as illustrated in FIG. 9, the lower plug portion in FIG. 8A (GC2_P1a) may be modified to a lower plug portion GC_P1a' bonded to the intermediate plug portion GC2_P2a', and the upper plug portion GC2_P3a in FIG. 8A may be modified to the upper plug portion GC_P3a' bonded to the intermediate plug portion GC2_P2a'. Accordingly, the second intermediate gate contact plug GC2bb may include the lower plug portion GC_P1a', the intermediate plug portion GC2_P2a', the upper plug portion GC_P3a', the lower bonding regions GC2_B1aa1, GC2_B1aa2, GC2_B1ab1, and GC2_Bab2 between the lower plug portion GC_P1a' and the intermediate plug portion GC2_P2a', and the upper bonding region GC2_B2a' between the intermediate plug portion GC2_P2a' and the upper plug portion GC_P3a'.

The vertical central axis Cz2a of the intermediate plug portion GC2_P2a' may be misaligned with the vertical central axis Cz1a of the upper plug portion GC2_P3a' or the vertical central axis Cz1a of the lower plug portion GC_P1a'. For example, the vertical central axis Cz2a of the intermediate plug portion GC2_P2a' may be shifted in one direction from the vertical central axis Cz1a of the upper plug portion GC2_P3a' or the vertical central axis Cz1a of the lower plug portion GC_P1a'.

When viewed with reference to the vertical central axis Cz2a of the intermediate plug portion GC2_P2a', the lower bonding regions GC2_B1ab1 and GC2_B1ab2 may include a first lower bonding region GC2_B1ab1 disposed on the first side of the vertical central axis Cz2a and a second lower bonding region GC2_B1ab2 disposed on the second side of the vertical central axis Cz2a. Here, the first side and the second side of the vertical central axis Cz2a may be opposite to each other. The first lower bonding region GC2_B1ab1 may be disposed at a level higher than a level of the second lower bonding region GC2_B1ab2.

When viewed with reference to the vertical central axis Cz2a of the intermediate plug portion GC2_P2a', the intermediate plug portion GC2_P2a' may include a first lower end GC2_B1aa1 disposed on the first side of the vertical central axis Cz2a and a second lower end GC2_B1aa2 disposed on the second side of the vertical central axis Cz2a.

In an example, in the intermediate plug portion GC2_P2a', the first lower end GC2_B1aa1 of the vertical central axis Cz2a may be disposed at a level lower than a level of the first lower bonding region GC2_B1ab1, and may be disposed at a level higher than a level of the second lower bonding region GC2_B1ab2.

In another example, in the intermediate plug portion GC2_P2a', the first lower end GC2_B1aa1 of the vertical central axis Cz2a may be disposed at a level lower than a level of the first lower bonding region GC2_B1ab1, and may be disposed at a level higher than a level of the second lower bonding region GC2_B1ab2.

On the first side of the vertical central axis Cz2a, the first lower end GC2_B1aa1 of the intermediate plug portion GC2_P2a' may be a first bending portion on the side surface of the second intermediate gate contact plug GC2bb, and the first lower bonding region GC2_B1ab1 may be a second bending portion on a side surface of the second intermediate gate contact plug GC2bb. On the second side of the vertical central axis Cz2a, the second lower end GC2_B1aa2 of the intermediate plug portion GC2_P2a' may be a third bending portion of a side surface of the second intermediate gate contact plug GC2bb, and the second lower bonding region GC2_B1ab2 may be a fourth bending portion on a side surface of the second intermediate gate contact plug GC2bb. Here, the level relationship between the first to fourth bending portions may be the same as the level relationship between the first lower end GC2_B1aa1, the first lower bonding region GC2_B1*ab*1, the second lower end GC2_B1*aa*2, and the second lower bonding region GC2_B1*ab*1 described above.

At least one of the first and second lower ends GC2_B1*aa*1 and GC2_B1*aa*2 and the first and second lower bonding regions GC2_B1*ab*1 and GC2_B1*ab*2 of the intermediate plug portion GC2_P2*a'* may be disposed within the second lower buffer capping pattern BC1*b*. For example, the first and second lower ends GC2_B1*aa*1 and GC2_B1*aa*2 of the intermediate plug portion GC2_P2*a'* and the first and second lower bonding regions GC2_B1*ab*1 and GC2_B1*ab*2 may be disposed in the second lower buffer capping pattern BC1*b*. Accordingly, the first and second lower ends GC2_B1*aa*1 and GC2_B1*aa*2 of the intermediate plug portion GC2_P2*a'* and the first and second lower bonding regions GC2_B1*ab*1 and GC2_B1*ab*2 may be disposed at a level lower than a level of the upper surface of the second lower buffer capping pattern, and may be disposed at a level higher than a level of the lower surface of the second lower buffer capping pattern BC1*b*.

The first and second lower ends GC2_B1*aa*1 and GC2_B1*aa*2 of the intermediate plug portion GC2_P2*a'* and the first and second lower bonding regions GC2_B1*ab*1 and GC2_B1*ab*2 may be disposed at a level lower than a level of the uppermost first gate layer among the first gate layers GL1 not vertically overlapping the second lower buffer capping pattern BC1*b*. The first and second lower ends GC2_B1*aa*1 and GC2_B1*aa*2 of the intermediate plug portion GC2_P2*a'* and the first and second lower bonding regions GC2_B1*ab*1 and GC2_B1*ab*2 may be disposed at a level lower than a level of the next highest first gate layer among the first gate layers GL1 not vertically overlapping the second lower buffer capping pattern BC1*b*.

In an example embodiment, referring to FIG. 10, the second upper gate contact plug GC3*ba* (FIG. 8B) in FIG. 8B may be modified to a second upper gate contact plug GC3*bb* as in FIG. 10. For example, the upper plug portion GC3_P3*a* of the second upper gate contact plug GC3*ba* (FIG. 8B) in FIG. 8B may be modified to the upper plug portion GC3_P3*a'* shifted in one horizontal direction as illustrated in FIG. 10, and the intermediate plug portion GC3_P2*a* of the second upper gate contact plug in FIG. 8B GC3*ba* (FIG. 8B) may be modified to the intermediate plug portion GC3_P2*a'* bonded to the upper plug portion GC3_P3*a'* as illustrated in FIG. 10. Accordingly, the second upper gate contact plug GC3_P3*a'* may include the intermediate plug portion GC3_P2*a'* and the upper plug portion GC3_P3*a'*. The second upper gate contact plug GC3_P3*a'* may further include a lower plug portion GC3_P1*a* substantially the same as the lower plug portion GC3_P1*a* of the second upper gate contact plug GC3*ba* in FIG. 8B. Accordingly, the second upper gate contact plug GC3_P3*a'* may include the lower plug portion GC3_P1*a*, the intermediate plug portion GC3_P2*a'*, the upper plug portion GC3_P3*a'*, a lower bonding region GC3_B1 between the lower plug portion GC3_P1*a* and the intermediate plug portion GC3_P1*a*, and an upper bonding regions GC3_B2*ab*1 and GC3_B2*ab*2 between the intermediate plug portion GC3_P2*a'* and the upper plug portion GC3_P3*a'*. The lower bonding region GC3_B1 may be substantially the same as the lower bonding region GC3_B1 (in FIG. 8B) of the second upper gate contact plug GC3*ba* (FIG. 8B) in FIG. 8B.

The vertical central axis Cz2*b* of the upper plug portion GC3_P3*a'* may be misaligned with the vertical central axis Cz1*b* of the intermediate plug portion GC3_P2*a'*. For example, the vertical central axis Cz2*b* of the upper plug portion GC3_P3*a'* may be shifted in one direction from the vertical central axis Cz1*b* of the intermediate plug portion GC3_P2*a'*.

A width of a lower region of the upper plug portion GC3_P3*a'* may be greater than a width of an upper region of the intermediate plug portion GC3_P2*a'*. The maximum width of the upper plug portion GC3_P3*a'* may be about 1.5 times greater than the minimum width of the intermediate plug portion GC3_P2*a'*. The maximum width of the upper plug portion GC3_P3*a'* may be about twice or more the minimum width of the intermediate plug portion GC3_P2*a'*.

When viewed with respect to the vertical central axis Cz2*b* of the upper plug portion GC3_P3*a'*, the upper bonding regions GC3_B2*ab*1 and GC3_B2*ab*2 may include a first upper bonding region GC3_B2*ab*1 disposed on the first side of the vertical central axis Cz2*a* and a second upper bonding region GC3_B2*ab*2 disposed on the second side of the vertical central axis Cz2*a*. Here, the first side and the second side of the vertical central axis Cz2*b* may oppose each other. The first upper bonding region GC3_B2*ab*1 may be disposed at a level higher than a level of the second upper bonding region GC3_B2*ab*2.

When viewed with respect to the vertical central axis Cz2*b* of the upper plug portion GC3_P3*a'*, the upper plug portion GC3_P3*a'* may include a first lower end GC3_B2*aa*1 disposed on the first side of the vertical central axis Cz2*b* and a second lower end GC3_B2*aa*2 disposed on the second side of the vertical central axis Cz2*b*.

In an example, in the upper plug portion GC3_P3*a'*, the first lower end GC3_B2*aa*1 of the vertical central axis Cz2*b* may be disposed at a level lower than a level of the first upper bonding region GC3_B2*ab*1, and may be disposed at a level higher than a level of the second upper bonding region GC3_B2*ab*2.

In another example, in the upper plug portion GC3_P3*a'*, the first lower end GC3_B2*aa*1 of the vertical central axis Cz2*b* may be disposed at a level lower than a level of the first upper bonding region GC3_B2*ab*1 and the second upper bonding region GC3_B2*ab*2.

On the first side of the vertical central axis Cz2*b*, the first lower end GC3_B2*aa*1 of the upper plug portion GC3_P3*a'* may be a first bending portion of a side surface of the second upper gate contact plug GC3*bb*, and the first upper bonding region GC3_B2*ab*1 may be a second bending portion of a side surface of the second upper gate contact plug GC3*bb*. On the second side of the vertical central axis Cz2*b*, the second lower end GC3_B2*aa*2 of the upper plug portion GC3_P3*a'* may be a third bending portion of a side surface of the second upper gate contact plug GC3*bb*, and the second upper bonding region GC3_B2*ab*2 may be a fourth bending portion on a side surface of the second upper gate contact plug GC3*bb*. Here, the level relationship between the first to fourth bending portions may be the same as the level relationship between the first lower end GC3_B2*aa*1, the first upper bonding region GC3_B2*ab*1, the second lower end GC3_B2*aa*2, and the second upper bonding regions GC3_B2*ab*1 described above. At least one of the first and second lower ends GC3_B2*aa*1 and GC3_B2*aa*2 of the upper plug portion GC3_P3*a'* and the first and second upper bonding regions GC3_B2*ab*1 and GC3_B2*ab*2 may be disposed within the second intermediate buffer capping pattern BC2*b*. At least one of the first and second lower ends GC3_B2*aa*1 and GC3_B2*aa*2 of the upper plug portion GC3_P3*a'* and the first and second upper bonding regions GC3_B2*ab*1 and GC3_B2*ab*2 may be disposed at a level lower than a level of the upper surface of the second intermediate buffer capping pattern BC2*b*, and may be disposed at a level higher than a level of the lower surface of the second intermediate buffer capping pattern BC2b.

At least one of the first and second lower ends GC3_B2aa1 and GC3_B2aa2 of the upper plug portion GC3_P3a' and the first and second upper bonding regions GC3_B2ab1 and GC3_B2ab2 may be disposed at a level lower than a level of the uppermost second gate layer among the second gate layers GL2 not vertically overlap the second intermediate buffer capping pattern BC2b. At least one of the first and second lower ends GC3_B2aa1 and GC3_B2aa2 of the upper plug portion GC3_P3a' and the first and second upper bonding regions GC3_B2ab1 and GC3_B2ab2 may be disposed at a level lower than a level of the next highest second gate layer among the second gate layers GL2 not vertically overlapping the second intermediate buffer capping pattern BC2b.

Figure 11:
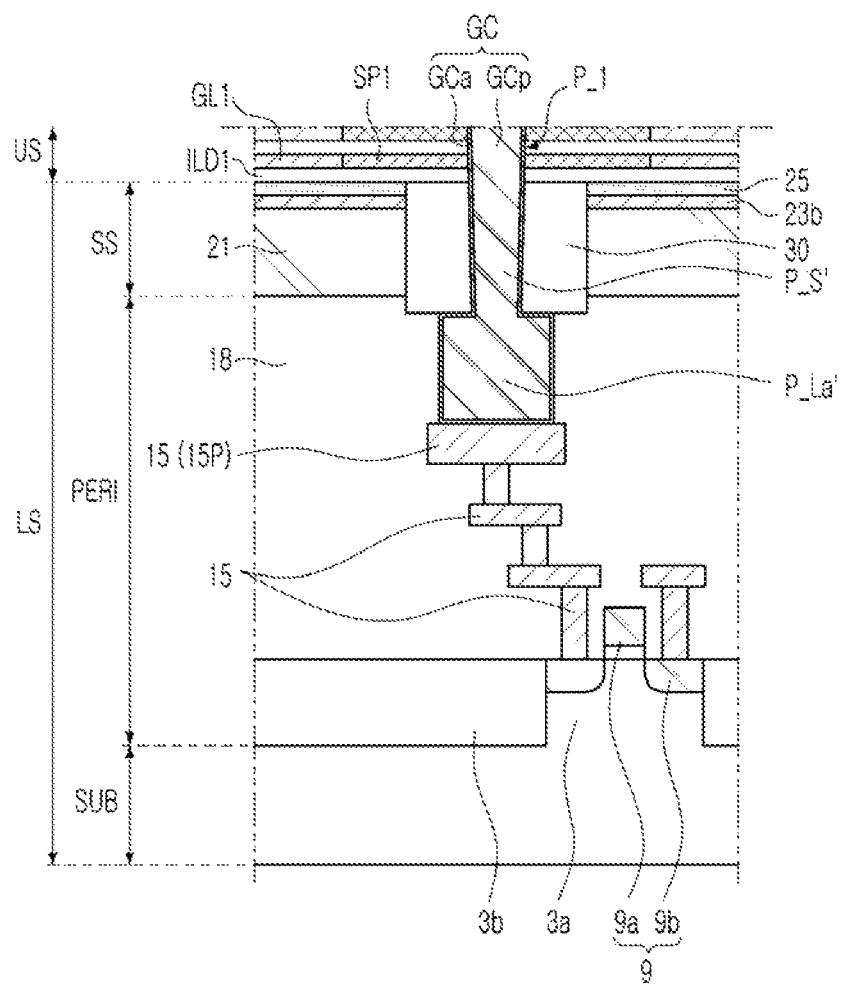
FIG. 11 is an enlarged cross-sectional diagram illustrating an example embodiment of a semiconductor device according to an example embodiment.

In the description below, referring to FIG. 11, an example embodiment of the lower region of each of the first gate contact plugs GC will be described. FIG. 11 is a partially enlarged cross-sectional diagram illustrating a portion of the lower structure LS and each of the first gate contact plugs GC as described above. Here, the first gate contact plug GC of one of the first gate contact plugs GC and the modified components from the cross-sectional structure in FIG. 5A will be mainly described.

In an example embodiment, referring to FIG. 11, in the first gate contact plug GC, the first lower portion P_S (in FIG. 5A) described above may be modified to a first lower portion P_S' extending from the lower plug portion P_1 of the first gate contact plug GC and having a side surface aligned with the side surface of the lower plug portion P_1, and the second lower portion P_La (in FIG. 5A) described above may be modified to the second lower portion P_La' having a width greater than that of the first lower portion P_S'. The second lower portion P_La' may be disposed at a level lower than a level of the source structure SS, and may be electrically connected to and in contact with the peripheral pad 15P.

In the description below, an example embodiment of the second gate contact plugs GCa (FIG. 3E) described in FIGS. 2B and 3E will be described with reference to FIG. 12.

Figure 12:
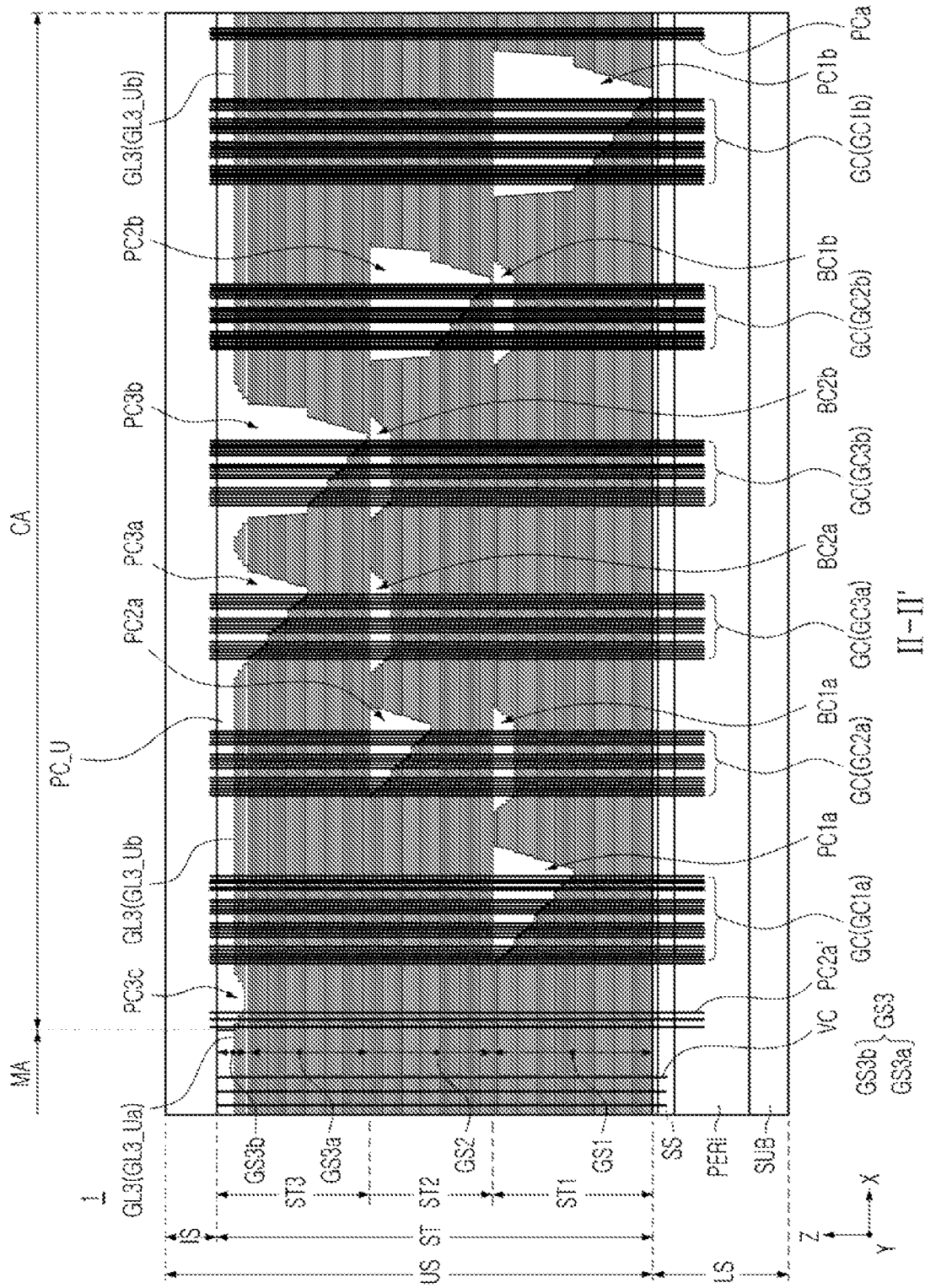
FIG. 12 is an enlarged cross-sectional diagram illustrating an example embodiment of a semiconductor device according to an example embodiment.

In the example embodiment, referring to FIG. 12, the second gate contact plugs GCa (FIG. 3E) described in FIGS. 2B and 3E may be modified to the stack structures GS1, GS2, and GS3 and the second gate contact plugs PC2a' penetrating through the source structure SS and extending into the peripheral circuit structure PERI as illustrated in FIG. 12. The second gate contact plugs PC2a' may be in contact with and electrically connected to gate pads of the second upper gate layers of the second upper stack structure GS3b, and may have a structure substantially the same as or similar to the first gate contact plugs (5A to 5C and GC in FIG. 11). Accordingly, the gate pads of the second upper gate layers of the second upper stack structure GS3b in contact with the second gate contact plugs PC2a' may have a shape the substantially the same as or similar to that of the gate pads GP in contact with the second gate contact plugs PC2a'. The second gate contact plugs PC2a' may be electrically insulated with the other gate layers not in contact with the second gate contact plugs PC2a' by substantially the same isolation insulating layers as the first to third isolation insulating layers SP1, SP2, and SP3.

Figure 13A:
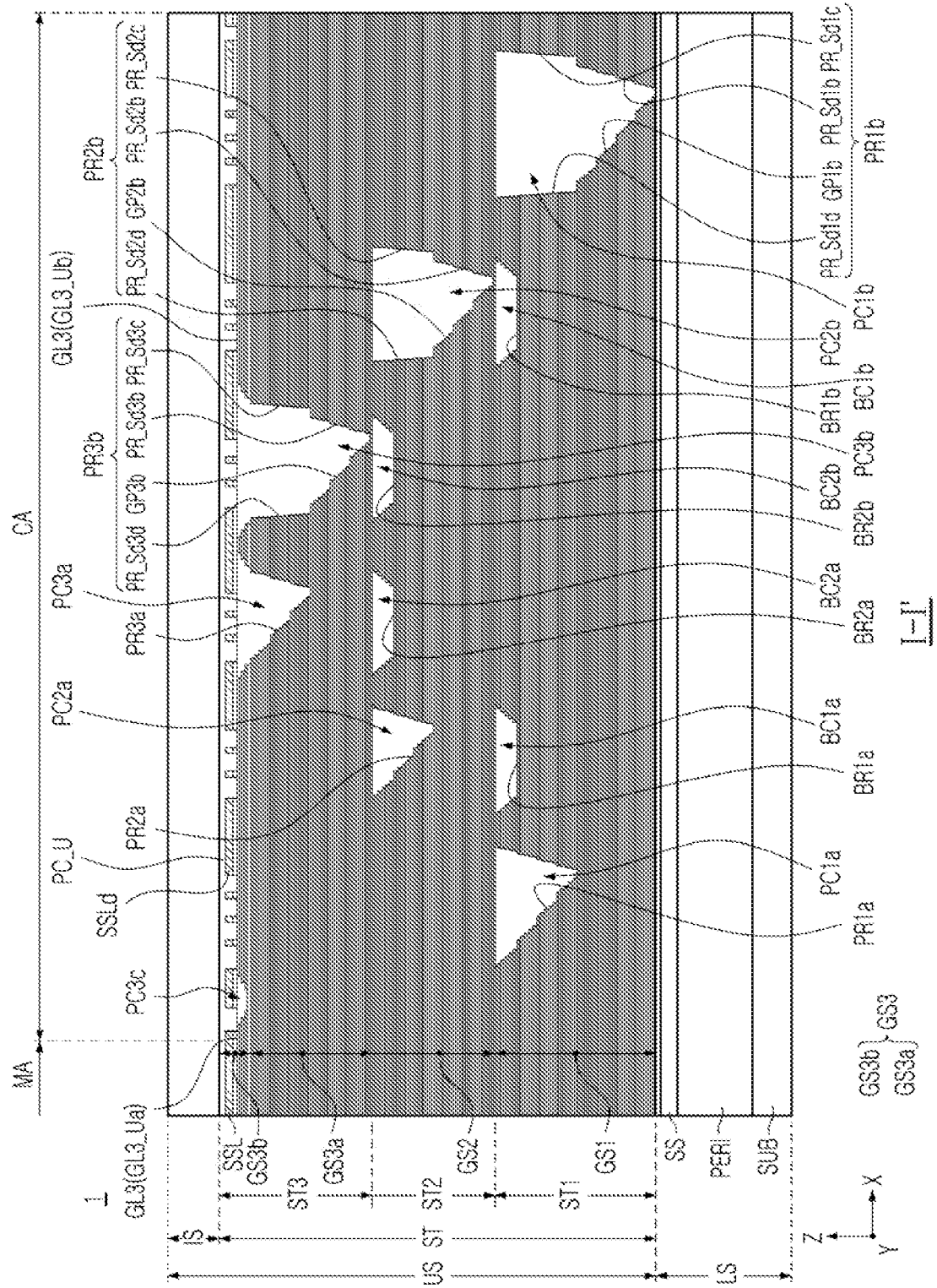
FIGS. 13A to 13C are diagrams illustrating an example embodiment of a semiconductor device according to an example embodiment.
Figure 13B:
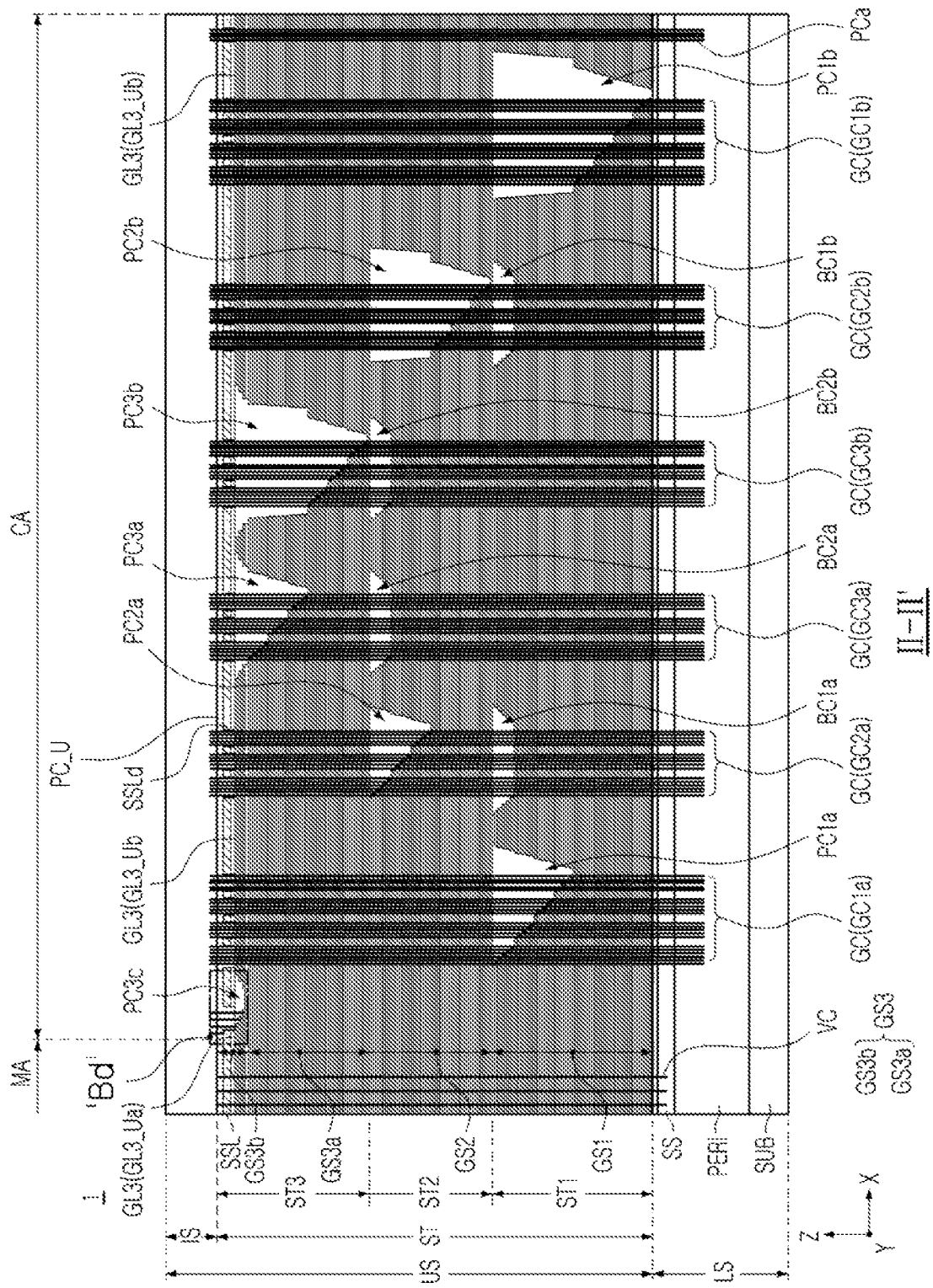
Figure 13C:
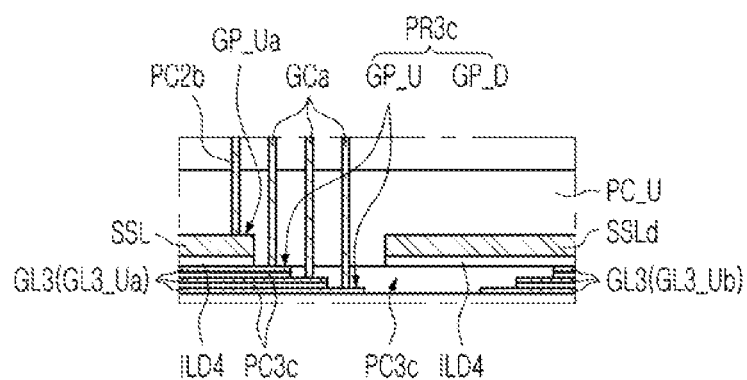

In the description below, an example embodiment of the above-described second upper stack structure GS3b will be described with reference to FIGS. 13A to 13C. FIG. 13A is a cross-sectional diagram illustrating a region taken along line I-I' in FIG. 1, FIG. 13B is a cross-sectional diagram illustrating a region taken along line II-IF in FIG. 1, and FIG. 13C is an enlarged diagram illustrating region "Bd" in FIG. 13A. Referring to FIGS. 13A, 13B, and 13C, the second upper stack structure GS3b may further include an insulating layer ILD4 and upper gate pattern SSL and SSLd disposed on the upper gate layers GL3 and stacked in order.

The stacked in order insulating layer ILD4 and the upper gate patterns SSL and SSLd may be disposed on an uppermost upper gate layer among the upper gate layers GL3, and the insulating layer ILD4 (and the upper gate patterns SSL and SSLd stacked in order may be covered by a capping insulating layer PC_U'.

The upper gate pattern SSL and SSLd may include at least one of doped polysilicon, a metal nitride (e.g., TiN, WN, or TaN), a metal (e.g., W or Mo), and a metal-semiconductor compound (e.g., TiSi, TaN, WSi, CoSi or NiSi).

The upper gate patterns SSL and SSLd may include a string select gate line SSL disposed in the memory cell array region MA extending into the connection region CA and a dummy gate pattern SSLd spaced apart from the string select gate line SSL in the connection region CA.

The first gate contact plugs GC1a and the first peripheral contact plugs PCa may penetrate through the dummy gate pattern SSLd and may be spaced apart from the dummy gate pattern SSLd.

The semiconductor device 1 may further include a contact plug PC2b disposed on the gate pad GP_Ua of the string select gate line SSL in the connection region CA and in contact with and electrically connected to the gate pad GP_Ua of the string select gate line SSL.

FIGS. 13B and 13C illustrate the second gate contact plugs GCa (FIG. 3E) as in FIGS. 2B and 3E, but an example embodiment thereof is not limited thereto. For example, the second gate contact plugs GCa (FIG. 3E) illustrated in FIGS. 13B and 13C may be replaced with the modified second gate contact plugs PC2a' as described in FIG. 12.

Figure 14:
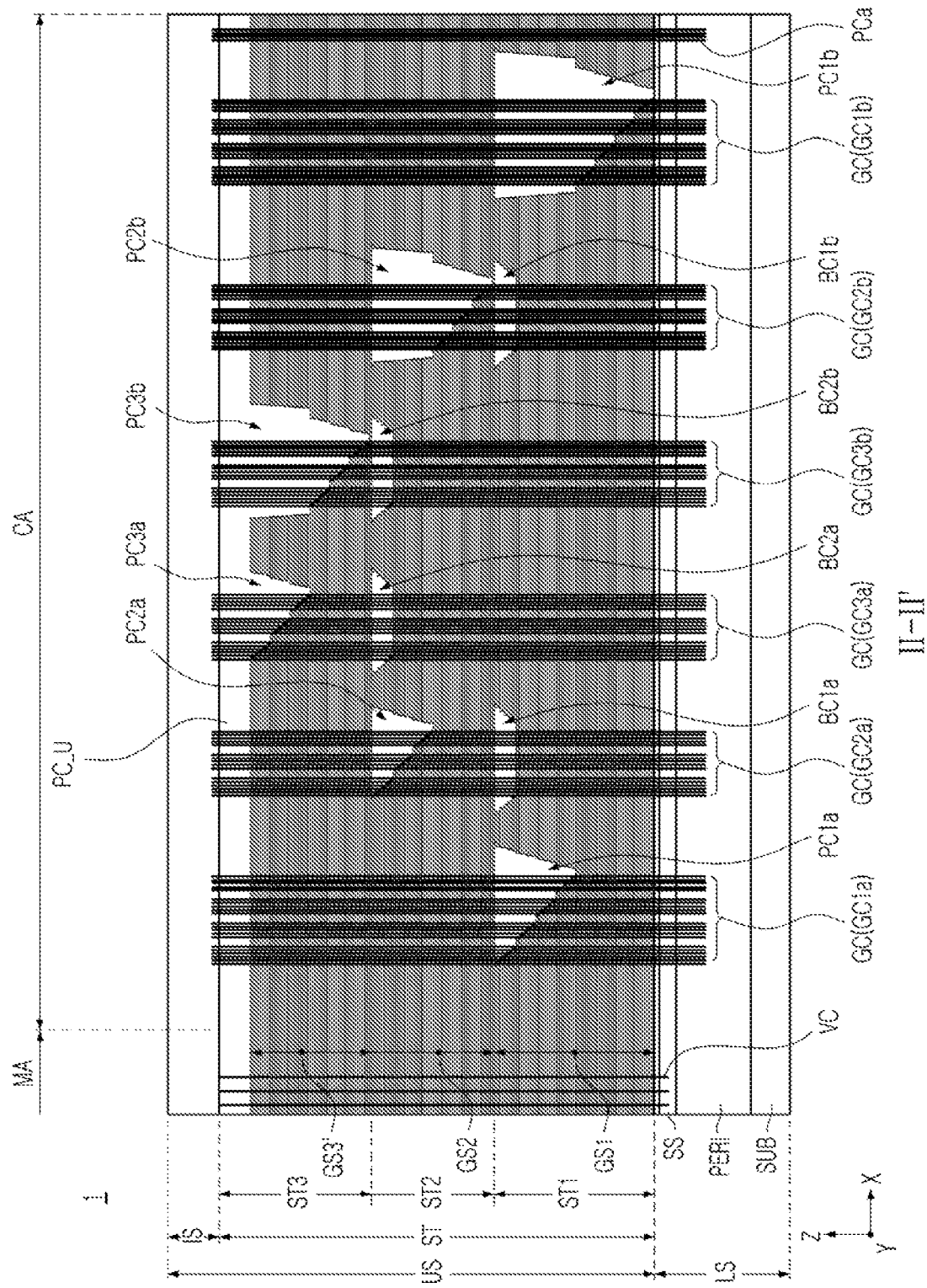
FIG. 14 is a cross-sectional diagram illustrating an example embodiment of a semiconductor device according to an example embodiment.

In the description below, an example embodiment of the above-described upper stack structure GS3 will be described with reference to FIG. 14. FIG. 14 is a cross-sectional diagram illustrating a region taken along line II-IF in FIG. 1.

Figure 15:
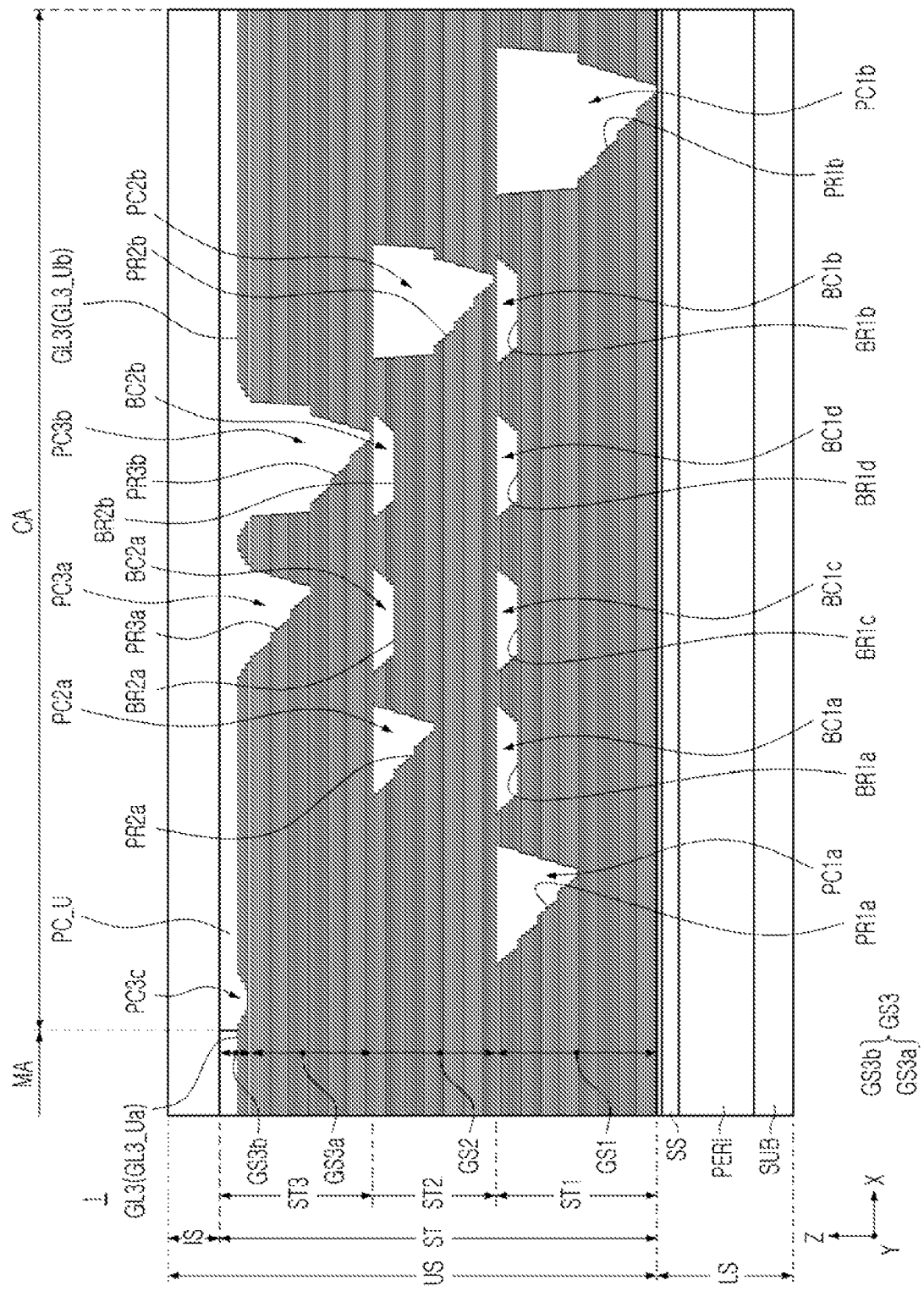
FIG. 15 is a cross-sectional diagram illustrating an example embodiment of a semiconductor device according to an example embodiment.

In the example embodiment, referring to FIG. 14, the upper stack structure GS3 including the first upper stack structure GS3a (FIGS. 2A and 2B) and the second upper stack structure GS3b (FIGS. 2A and 2B) may be replaced with the upper stack structure GS3 not including the second upper stack structure GS3b and including the first upper stack structure GS3a (FIGS. 2A and 2B). Upper gate layers of the upper stack structure GS3 may be included in upper word lines and upper select gates on the upper word lines. In the description below, with reference to FIG. 15, an example embodiment of the upper structure US described above will be described. FIG. 15 is a cross-sectional diagram illustrating a region taken along line I-I' in FIG. 1.

In an example embodiment, referring to FIG. 15, the lower stack structure GS1 of the above-described upper structure US may include a third lower buffer recess region BR1c and a fourth lower buffer recess region (BR1d), and the first structure ST1 of the upper structure US may include the third lower buffer capping pattern BC1c on the third lower buffer recess region BRIG and the fourth lower buffer capping pattern BC1d on the fourth lower buffer recess region BR1d. The first to fourth lower buffer capping patterns BC1a, BC1b, BC1c, and BC1d may be spaced apart from each other and may have substantially the same shape or structure.

The third lower buffer capping pattern BC1c may vertically overlap the first upper pad capping pattern PC3a and the first intermediate buffer capping pattern BC2a. The fourth lower buffer capping pattern BC1d may vertically overlap the second upper pad capping pattern PC3b and the second intermediate buffer capping pattern BC2b. Each of the above-described first upper gate contact plugs GC3a (in FIG. 2B) may include a portion penetrating the third lower buffer capping pattern BC1c. Each of the second upper gate contact plugs GC3b (FIG. 2B) described above may include a portion penetrating the fourth lower buffer capping pattern BC1d.

Figure 16A:
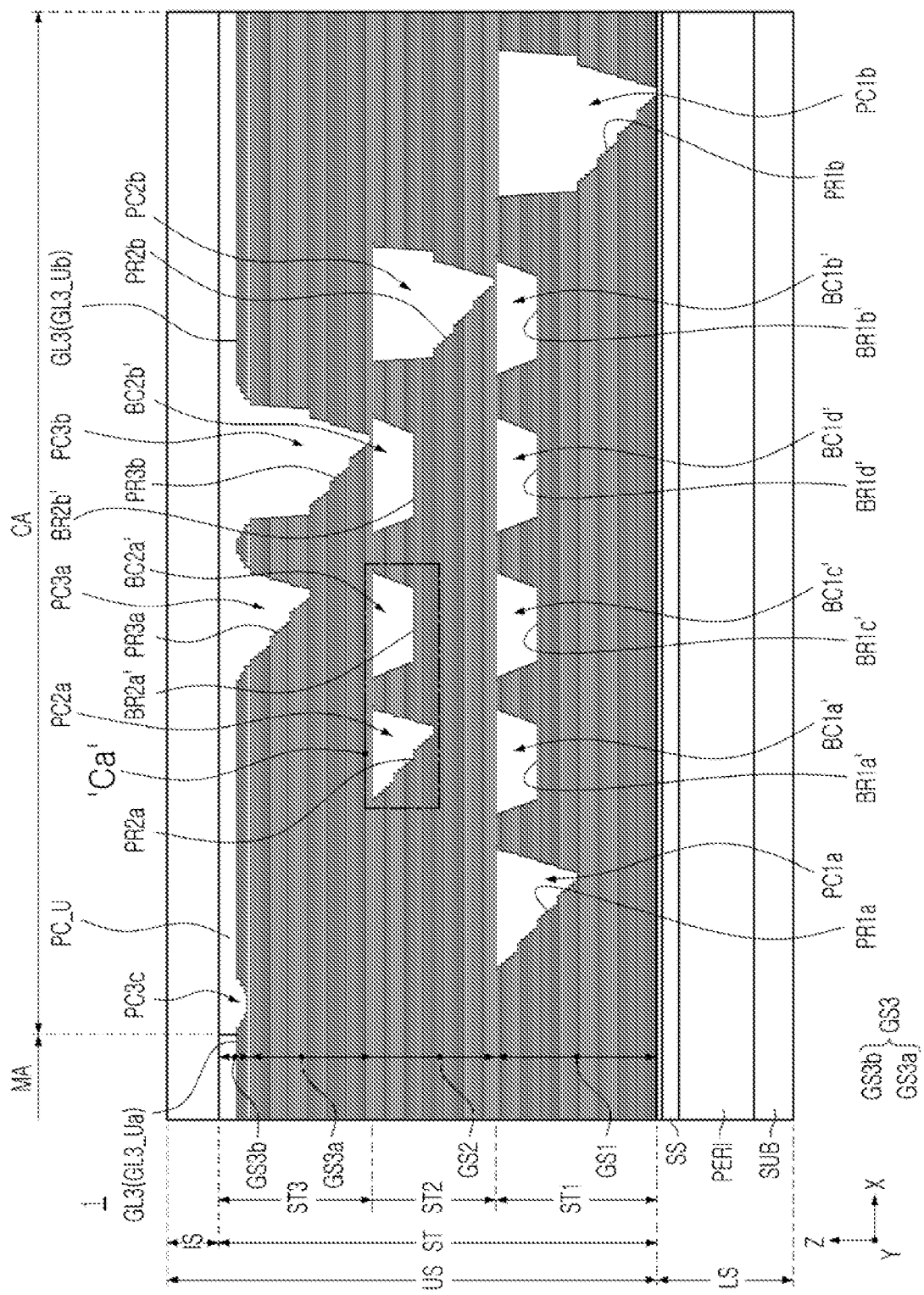
FIGS. 16A and 16B are diagrams illustrating an example embodiment of a semiconductor device according to an example embodiment.

In the description below, example embodiments of the buffer recess regions BR1a, BR1b, BR1c, BR1d, BR2a, and BR2b (in FIG. 15) and the buffer capping patterns BC1a, BC1b, BC1c, BC1d, BC2a, and BC2b (FIG. 15) will be described with reference to FIGS. 16A and 16B. FIG. 16A is a cross-sectional diagram illustrating example embodiments of the buffer recess regions BR1a, BR1b, BR1c, BR1d, BR2a, and BR2b (in FIG. 15) illustrated in FIG. 15 and the buffer capping patterns BC1a, BC1b, BC1c, BC1d, BC2a, and BC2b (in FIG. 15), and FIG. 16B is an enlarged diagram illustrating a region "Ca" in FIG. 16A.

Figure 16B:
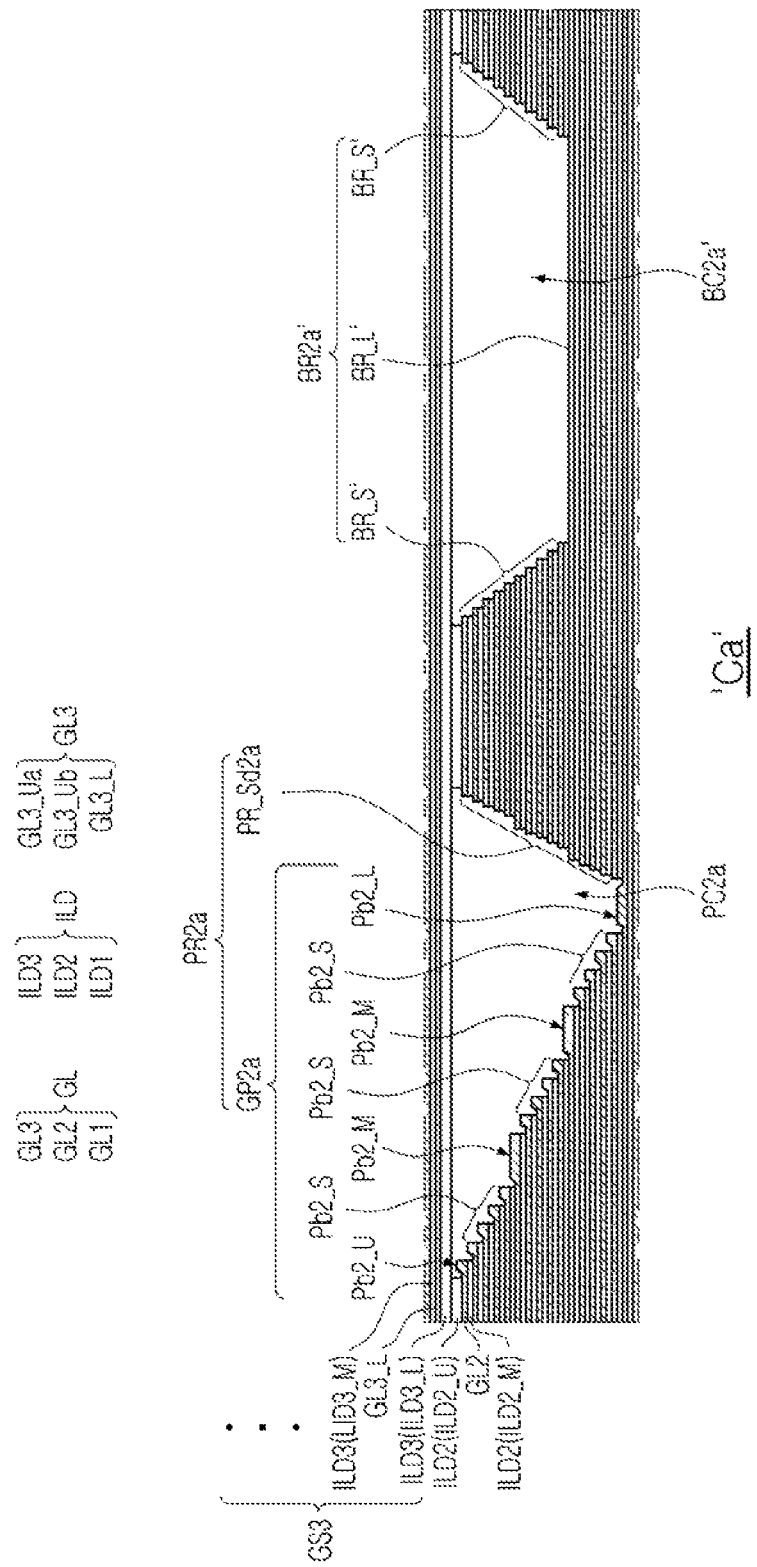

In an example embodiment, referring to FIGS. 16A and 16B, the buffer recess regions BR1a, BR1b, BR1c, BR1d, BR2a, and BR2b (in FIG. 15) described above may be modified to buffer recess regions BR1a', BR1b', BR1c', BR1d', BR2a', and BR2b' having a deeper depth, and the buffer capping patterns BC1a, BC1b, BC1c, BC1d, BC2a, BC2b (in FIG. 15) described above may be modified to buffer capping patterns BC1a', BC1b', BC1c', BC1d', BC2a', and BC2b' having an increased thickness. The buffer recess regions BR1a', BR1b', BR1c', BR1d', BR2a', and BR2b' may have substantially the same shape or similar shapes, and the buffer capping patterns BC1a', BC1b', BC1c', BC1d', BC2a', and BC2b' may have substantially the same shape or similar shapes. For example, the first intermediate buffer recess region BR2a' may include a bottom surface BR_L' and sidewalls BR_S'. The sidewalls BR_S' may have a step shape gradually lowering in a direction toward the bottom surface BR_L', and the bottom surface BR_L' of the first intermediate buffer recess region BR2a' may be disposed at a level substantially the same as or similar to a level of the second gate layer including the second intermediate pad disposed at a level lower than a level of the uppermost second intermediate pad among the second intermediate pads P2_M. The bottom surface BR_L' may be disposed at a level between the next highest second stepped pad group and the uppermost second stepped pad group among the second stepped pad groups Pb2_S.

Figure 17A:
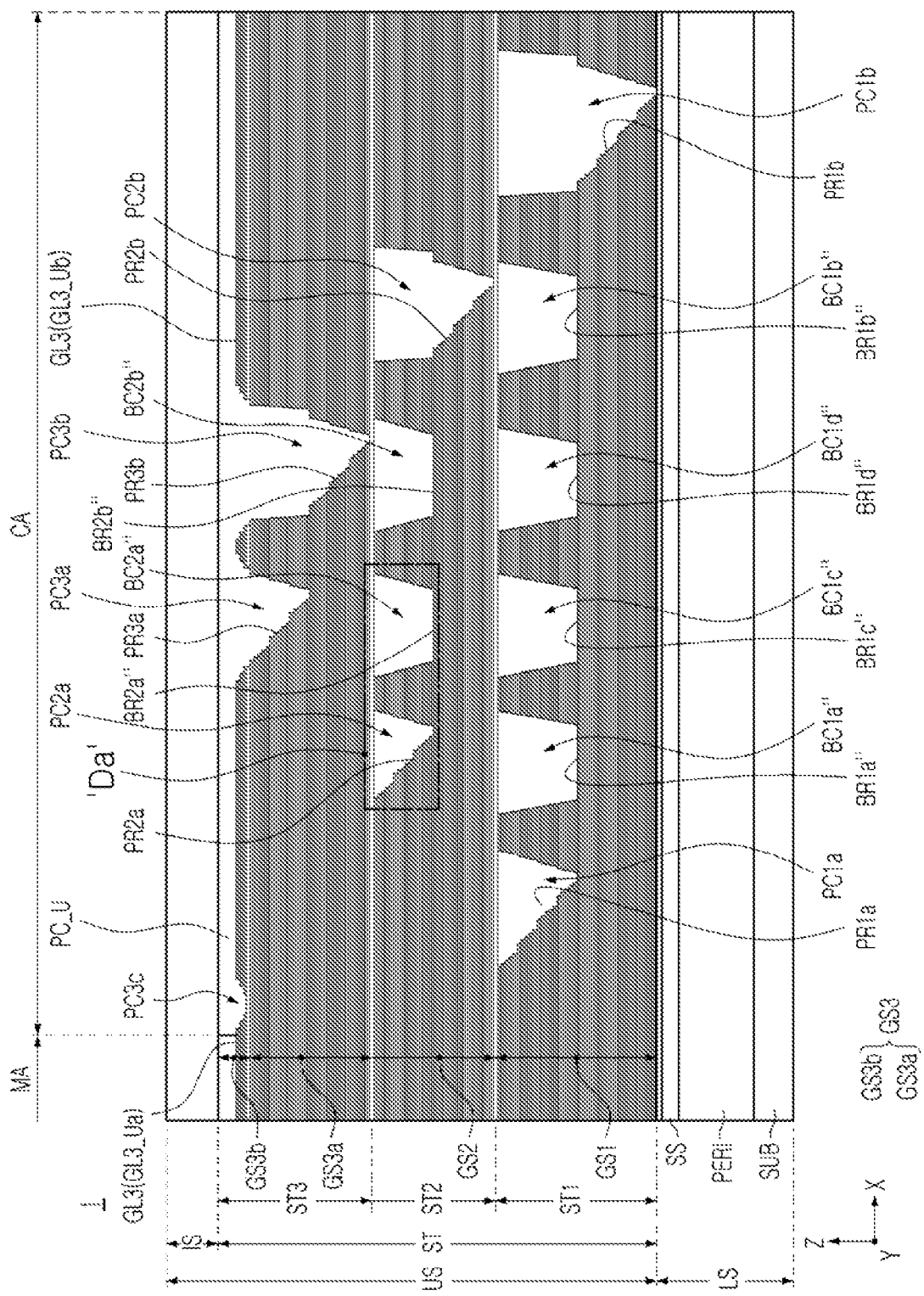
FIGS. 17A and 17B are diagrams illustrating an example embodiment of a semiconductor device according to an example embodiment.

In the description below, example embodiments of the buffer recess regions BR1a, BR1b, BR1c, BR1d, BR2a, and BR2b (in FIG. 15) and the buffer capping patterns BC1a, BC1b, BC1c, BC1d, BC2a, and BC2b (FIG. 15) will be described with reference to FIGS. 17A and 17B. FIG. 17A is a cross-sectional diagram illustrating example embodiments of the buffer recess regions BR1a, BR1b, BR1c, BR1d, BR2a, and BR2b (in FIG. 15) and the buffer capping patterns BC1a, BC1b, BC1c, BC1d, BC2a, BC2b (in FIG. 15), and FIG. 17B is an enlarged diagram illustrating region "Da" in FIG. 17A.

Figure 17B:
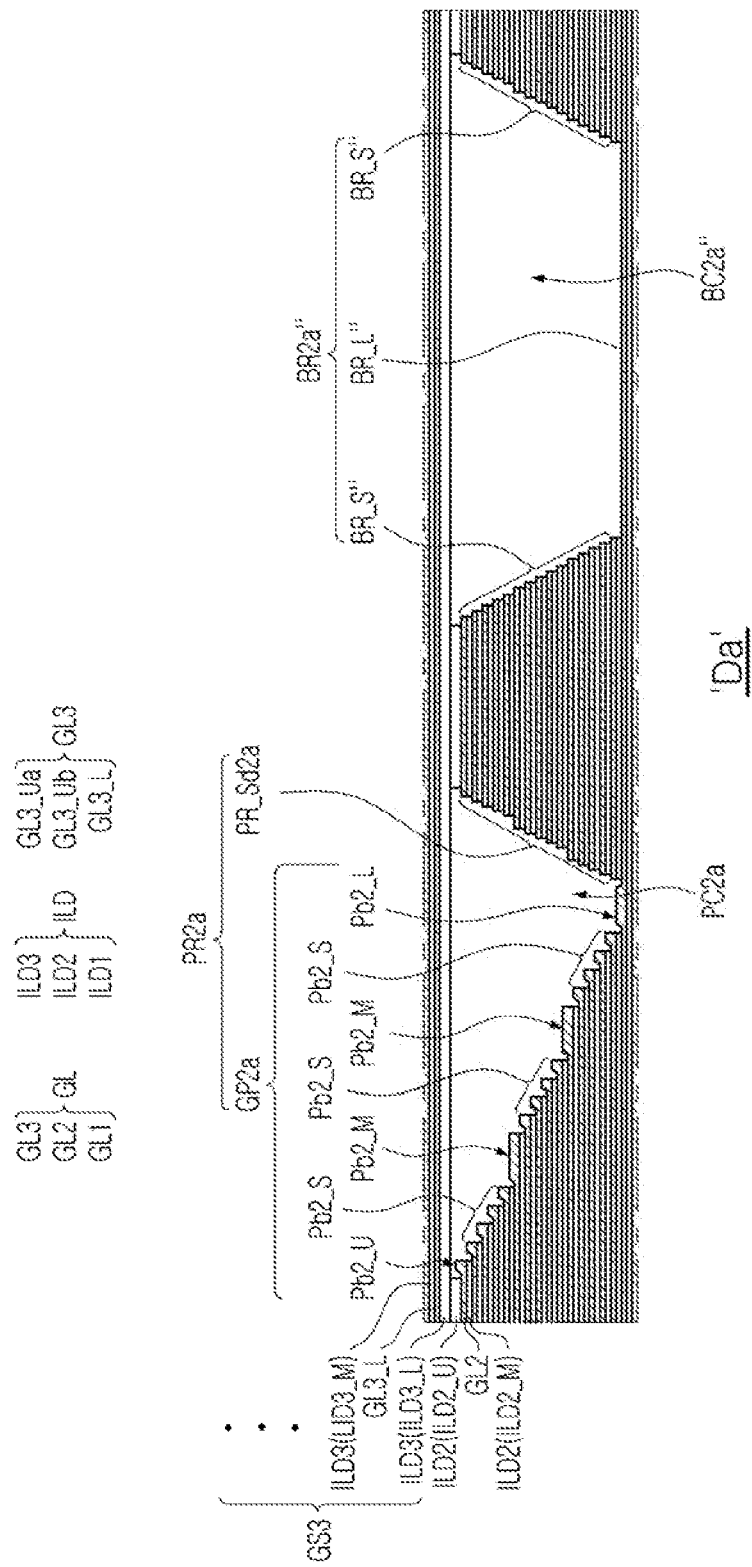

In an example embodiment, referring to FIGS. 17A and 17B, the buffer recess regions BR1a, BR1b, BR1c, BR1d, BR2a, and BR2b (in FIG. 15) described above may be modified to buffer recess regions BR1a", BR1b", BR1c", BR1d", BR2a", and BR2b" having a deeper depth, and the buffer capping patterns BC1a, BC1b, BC1c, BC1d, BC2a, and BC2b (in FIG. 15) described above may be modified to buffer capping patterns BC1a", BC1b", BC1c", BC1d", BC2a", and BC2b" having an increased thickness. The buffer recess regions BR1a", BR1b", BR1c", BR1d", BR2a", and BR2b" may have substantially the same shape or similar shapes, and the buffer capping patterns BC1a", BC1b", BC1c", BC1d", BC2a", and BC2b" may have substantially the same shape or similar shapes. For example, the first intermediate buffer recess region BR2a" may include a bottom surface BR_L" and sidewalls BR_S." The sidewalls BR_S" may have a step shape gradually lowering in a direction toward the bottom surface BR_L", and the second gate layer exposed by the bottom surface BR_L" of the first intermediate buffer recess region BR2a" may be a second gate layer including the second lower pad Pb2_L. A thickness of the first intermediate pad capping pattern PC2a and a thickness of the first intermediate buffer capping pattern BC2a" may be substantially the same. The first lower pad capping pattern PC1a and the first to fourth lower buffer capping patterns BC1a", BC1b", BC1c", and BC1d" may have substantially the same thickness, and the first intermediate pad capping pattern PC2a and the first and second intermediate buffer capping patterns BC2a" and BC2b" may have substantially the same thickness.

Figure 18:
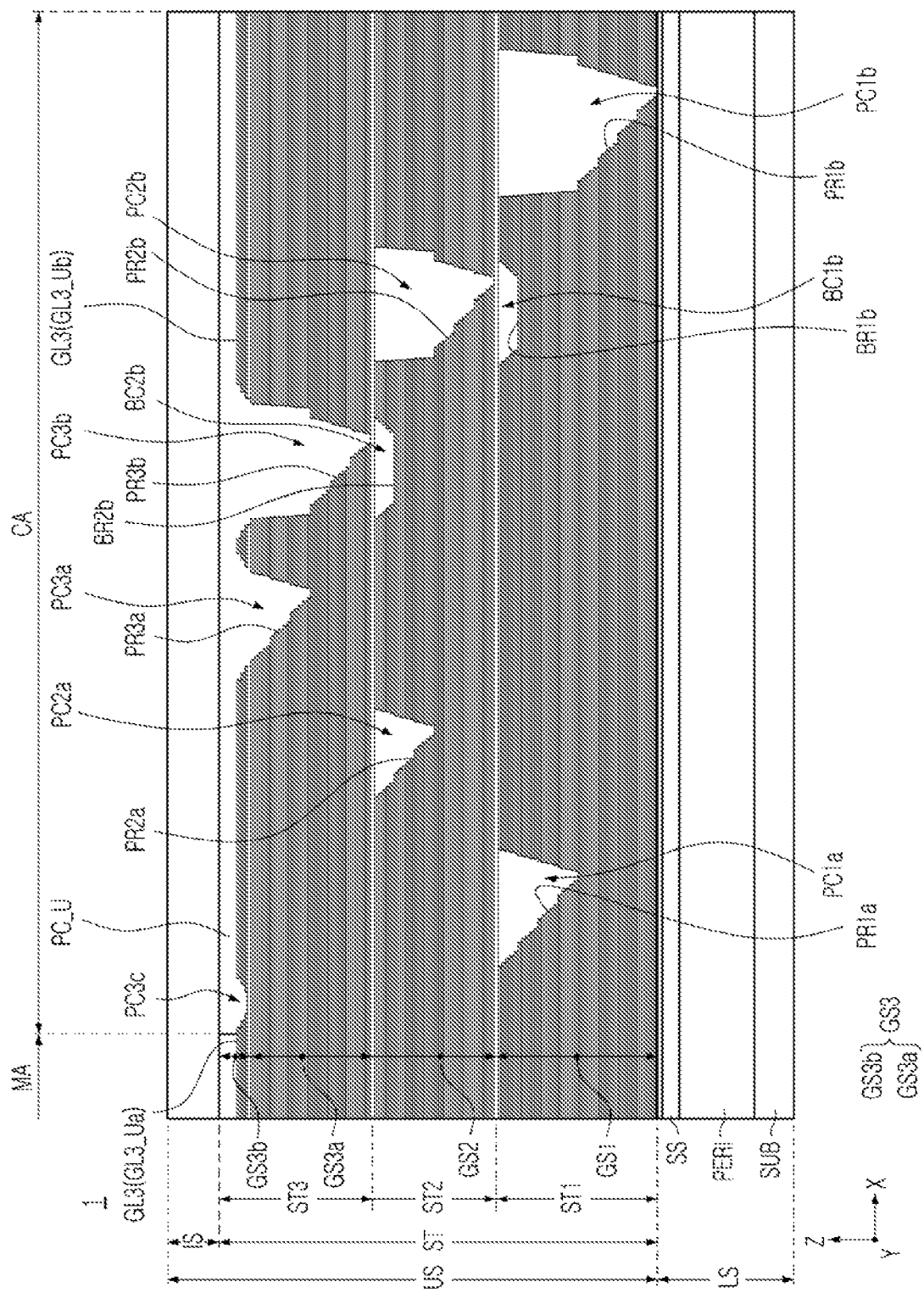
FIG. 18 is a cross-sectional diagram illustrating an example embodiment of a semiconductor device according to an example embodiment.

In the description below, an example embodiment of the above-described upper structure US will be described with reference to FIG. 18. FIG. 18 is a cross-sectional diagram illustrating a region taken along line I-I' in FIG. 1.

In the example embodiment, referring to FIG. 18, in the lower structure ST1 as in FIGS. 2A and 2B, the first lower buffer capping pattern BC1a described above may not be provided, and in the intermediate structure ST2 as in FIGS. 2A and 2B, the first intermediate buffer capping pattern BC1a not be provided. Similarly, in FIGS. 15, 16A, and 17A, the first, third, and fourth lower buffer capping patterns BC1a, BC1a', BC1a", BC1c, BC1c', BC1c", BC1d, BC1d', and BC1d" may not be provided, and the first intermediate buffer capping patterns BC2a, BC2a', and BC2a" may not be provided.

Figure 19:
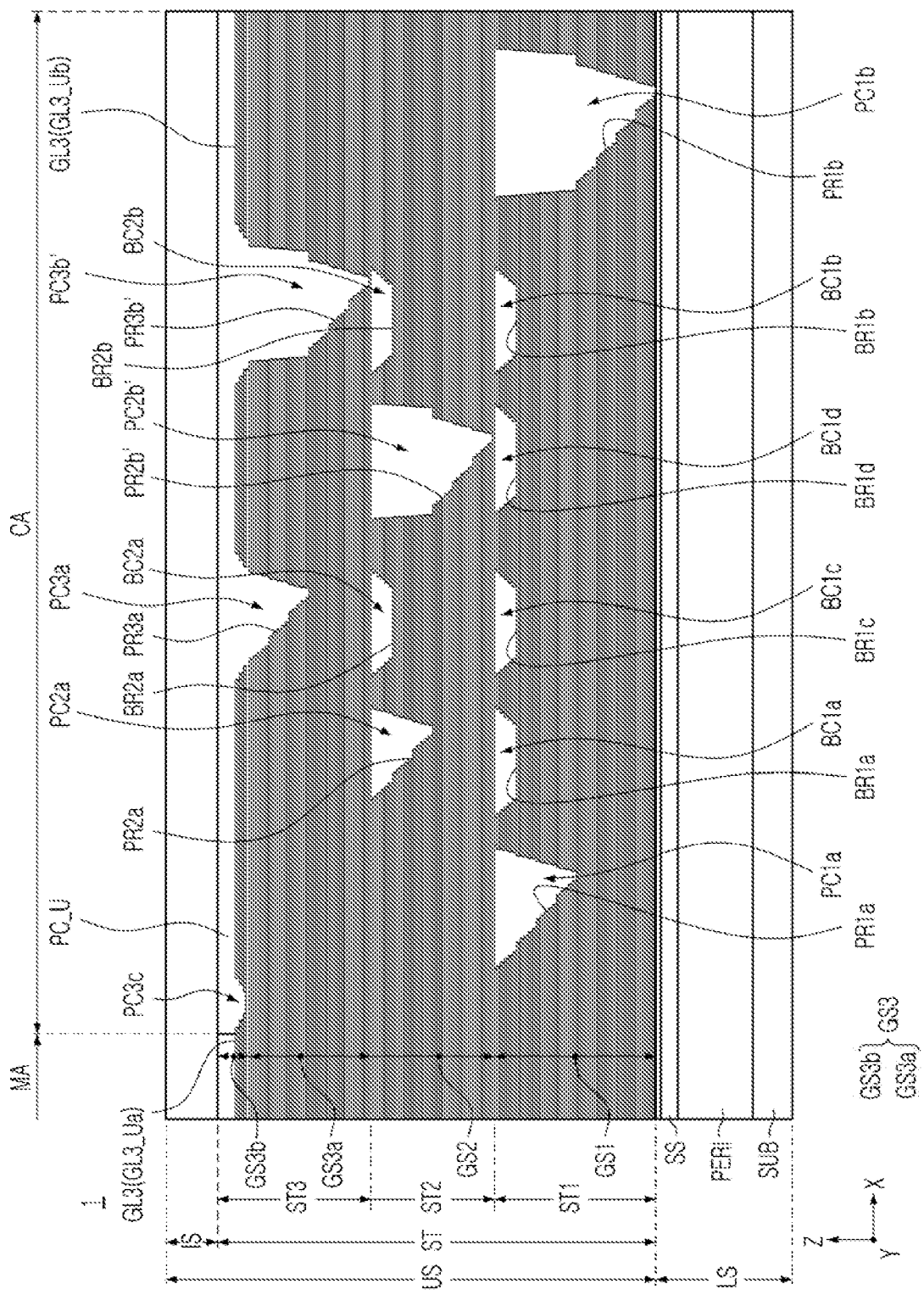
FIG. 19 is a cross-sectional diagram illustrating an example embodiment of a semiconductor device according to an example embodiment.

In the description below, an example embodiment of the above-described upper structure US will be described with reference to FIG. 19. FIG. 19 is a cross-sectional diagram illustrating a region taken along line I-I' in FIG. 1.

In the example embodiment, referring to FIG. 19, the first intermediate pad capping patterns PC2a, the first intermediate buffer capping pattern BC2a, the second intermediate buffer capping pattern BC2b, and the second intermediate pad capping pattern PC2b disposed in order and spaced apart from each other in the first direction, X described in FIGS. 2A, 2B, and 15 may be modified to the intermediate pad capping pattern PC2a, the first intermediate buffer capping pattern BC2a, the second intermediate pad capping pattern PC2b', and the second intermediate buffer capping pattern BC2b' disposed in order and spaced apart from each other in the first direction, X.

The second intermediate pad capping pattern PC2b' may have substantially the same shape and structure as those of the second intermediate pad capping pattern PC2b described in FIGS. 2A, 2B, and 15, and the second intermediate pad capping pattern PC2b' may have the same shape and structure as those of the second intermediate buffer capping pattern BC2b described with reference to FIGS. 2A, 2B, and 15.

The second intermediate pad capping pattern PC2b' may vertically overlap the fourth lower buffer capping pattern BC1d among the first to fourth lower buffer capping patterns BC1a, BC1b, BC1c, and BC1d described with reference to FIG. 15.

The second upper pad capping pattern PC3b described with reference to FIGS. 2A, 2B, and 15 may be replaced with the second upper pad capping pattern PC3b' shifted to vertically overlap the second intermediate buffer capping pattern BC2b'. The second upper pad capping pattern PC3b' may vertically overlap the second intermediate buffer capping pattern BC2b' and the second lower buffer capping pattern BC1b among the first to fourth lower buffer capping patterns BC1a, BC1b, BC1c, and BC1d described with reference to FIG. 15.

A distance between the memory cell array region MA and the second upper pad capping pattern PC3b' may be greater than a distance between the memory cell array region MA and the second intermediate pad capping pattern PC2b'.

Figure 20A:
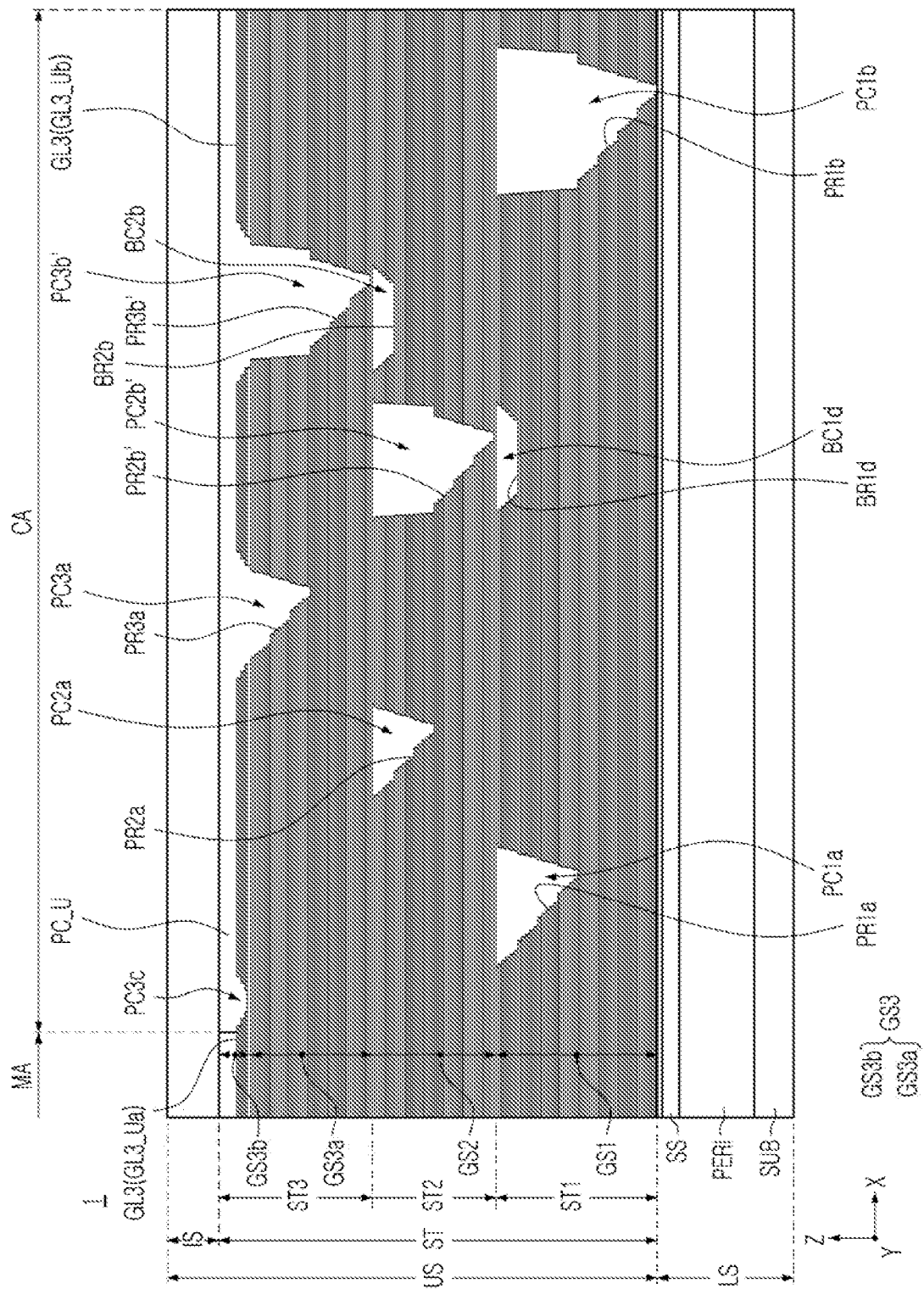
FIG. 20A is a cross-sectional diagram illustrating an example embodiment of a semiconductor device according to an example embodiment.

In the description below, an example embodiment of the above-described upper structure US will be described with reference to FIG. 20A. FIG. 20A is a cross-sectional diagram illustrating a region taken along line I-I' in FIG. 1.

In the example embodiment, referring to FIG. 20A, the first, second, and third lower buffer capping patterns BC1a, BC1b, and BC1c among the first to fourth lower buffer capping patterns BC1a, BC1b, BC1c, and BC1d in FIG. 19 may not be provided, and the first lower buffer capping pattern BC1a may remain. Among the first and second intermediate buffer capping patterns BC2a and BC2b in FIG. 19, the first intermediate buffer capping pattern BC2a may not be provided, and the second intermediate buffer capping pattern BC2b may remain.

Figure 20B:
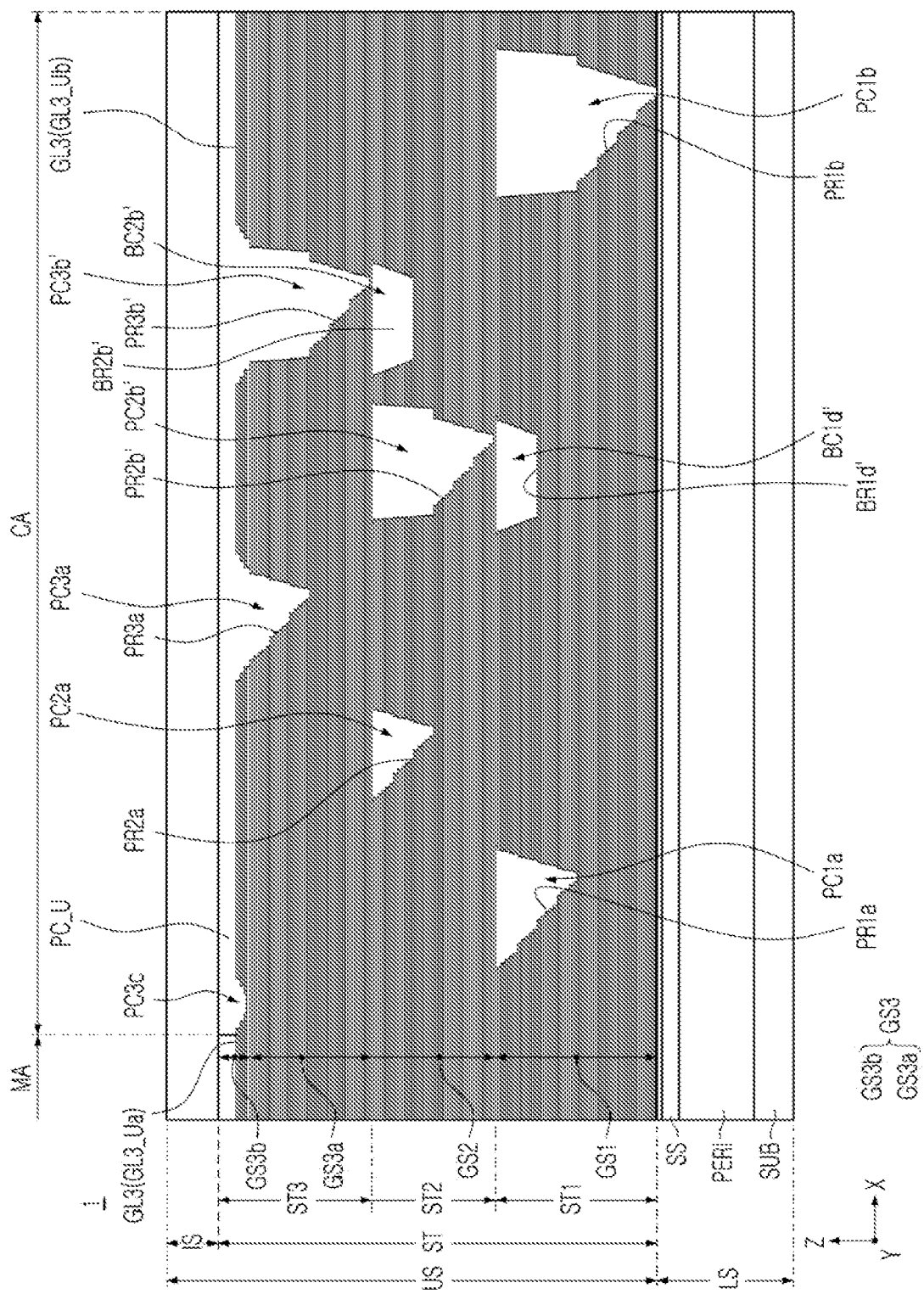
FIG. 20B is a cross-sectional diagram illustrating an example embodiment of a semiconductor device according to an example embodiment.

In the description below, an example embodiment of the upper structure US described above will be described with reference to FIG. 20B. FIG. 20B is a cross-sectional diagram illustrating a region taken along line I-I' in FIG. 1.

Figure 20C:
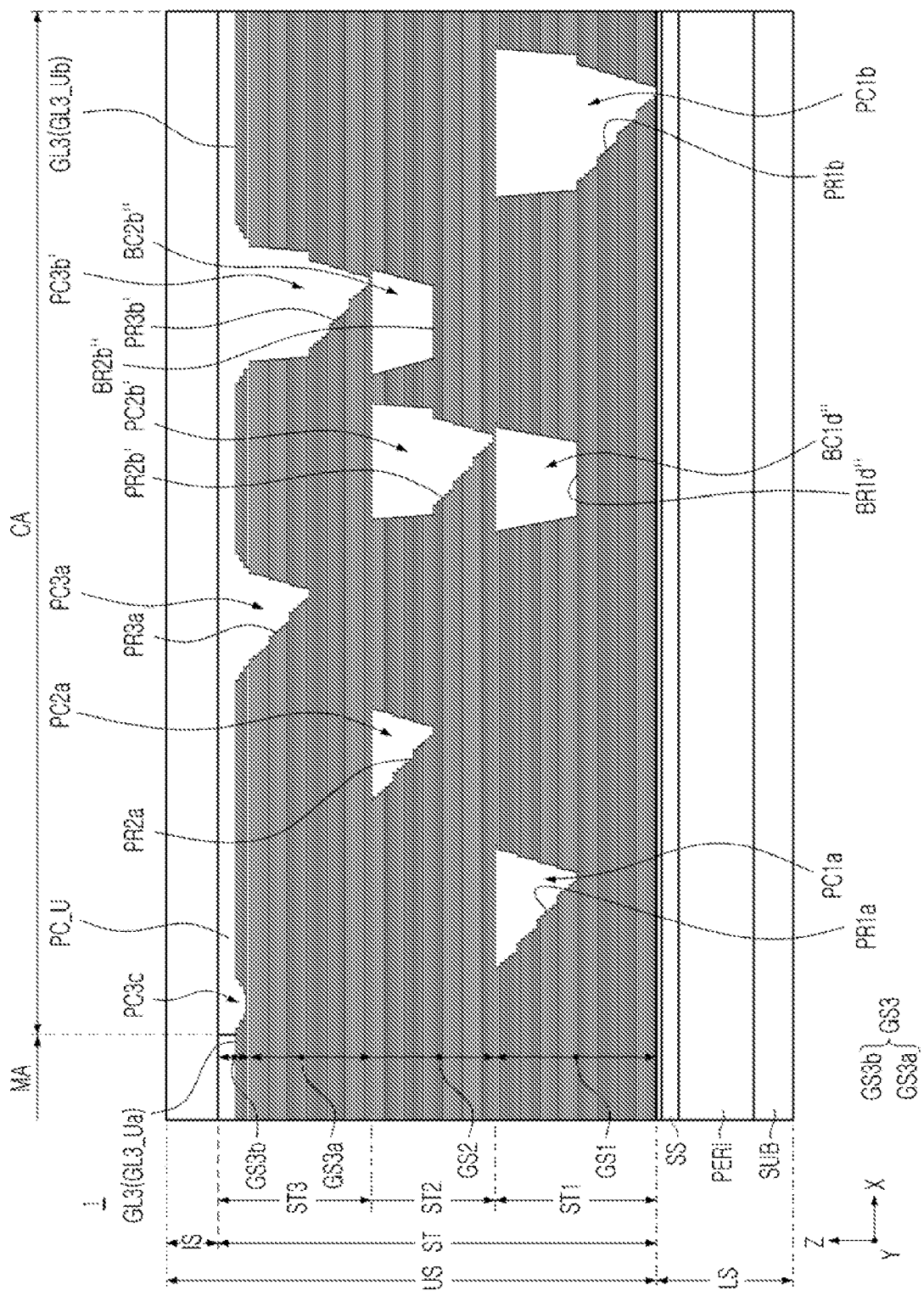
FIG. 20C is a cross-sectional diagram illustrating an example embodiment of a semiconductor device according to an example embodiment.

Referring to FIG. 20B in an example embodiment, the first lower buffer capping pattern BC1a in FIG. 20A may be modified to the first lower buffer capping pattern BC1a' having an increased thickness as in FIG. 16A. The second intermediate buffer capping pattern BC2b in FIG. 20A may be modified to the second intermediate buffer capping pattern BC2b' having an increased thickness as illustrated in FIG. 16A. In the description below, an example embodiment of the above-described upper structure US will be described with reference to FIG. 20C. FIG. 20C is a cross-sectional diagram illustrating a region taken along line I-I' in FIG. 1.

In the example embodiment, referring to FIG. 20C, the first lower buffer capping pattern BC1a in FIG. 20A may be modified to the first lower buffer capping pattern BC1a" having an increased thickness as illustrated in FIG. 17A. The second intermediate buffer capping pattern BC2b in FIG. 20A may be modified to the second intermediate buffer capping pattern BC2b" having an increased thickness as illustrated in FIG. 17A.

Figure 21A:
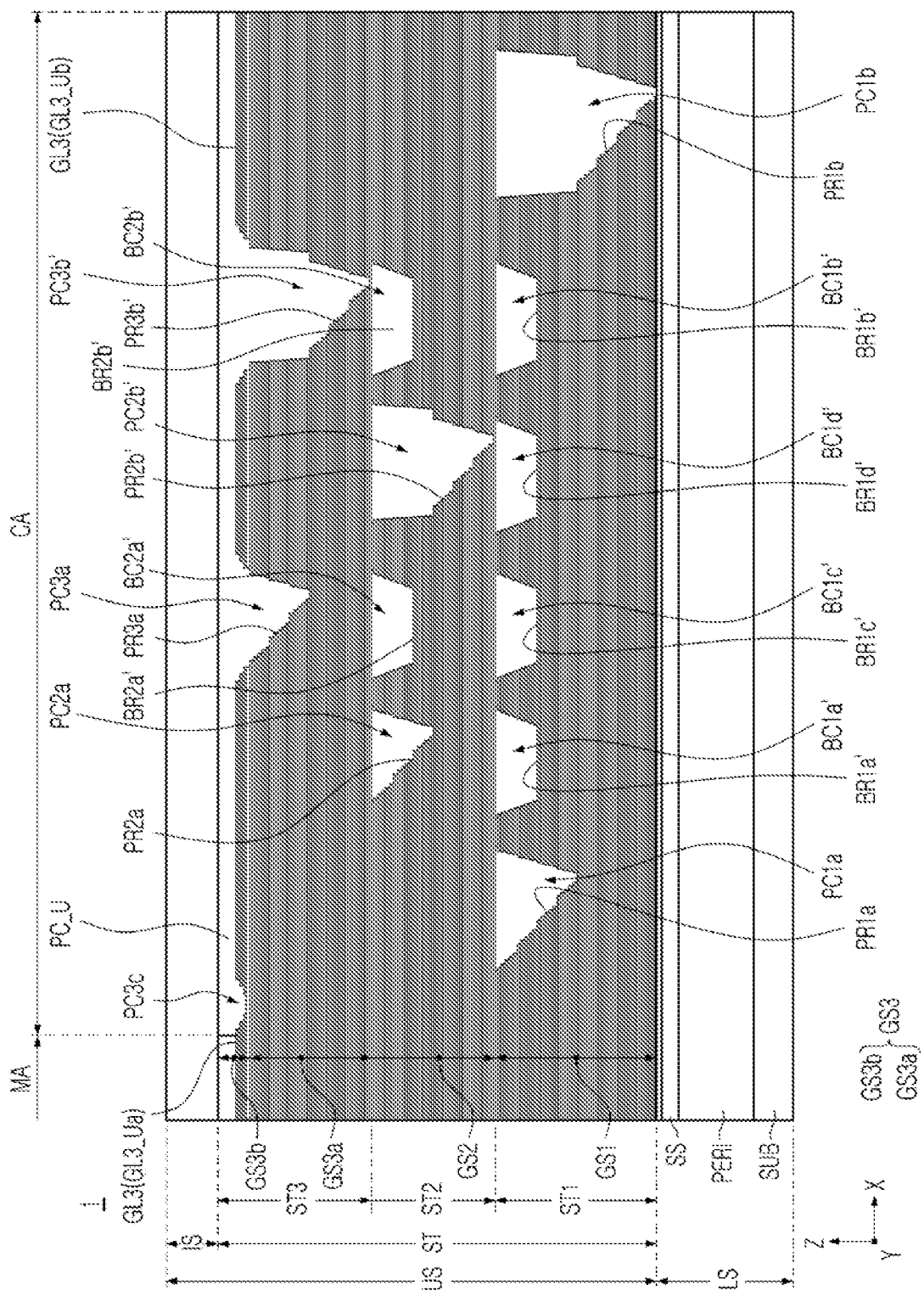
FIG. 21A is a cross-sectional diagram illustrating an example embodiment of a semiconductor device according to an example embodiment.

In the description below, an example embodiment of the above-described upper structure US will be described with reference to FIG. 21A. FIG. 21A is a cross-sectional diagram illustrating a region taken along line I-I' in FIG. 1.

In the example embodiment, referring to FIG. 21A, the first to fourth lower buffer capping patterns BC1a, BC1b, BC1c, and BC1d in FIG. 19 may be modified to the first to fourth lower buffer capping patterns BC1a', BC1b', BC1c', and BC1d' having an increased thickness as in FIG. 16A, and the first and second intermediate buffer capping patterns BC2a and BC2b in FIG. 19 may be modified to first and second intermediate buffer capping patterns BC2a' and BC2b' having an increased thickness as in FIG. 16A.

Figure 21B:
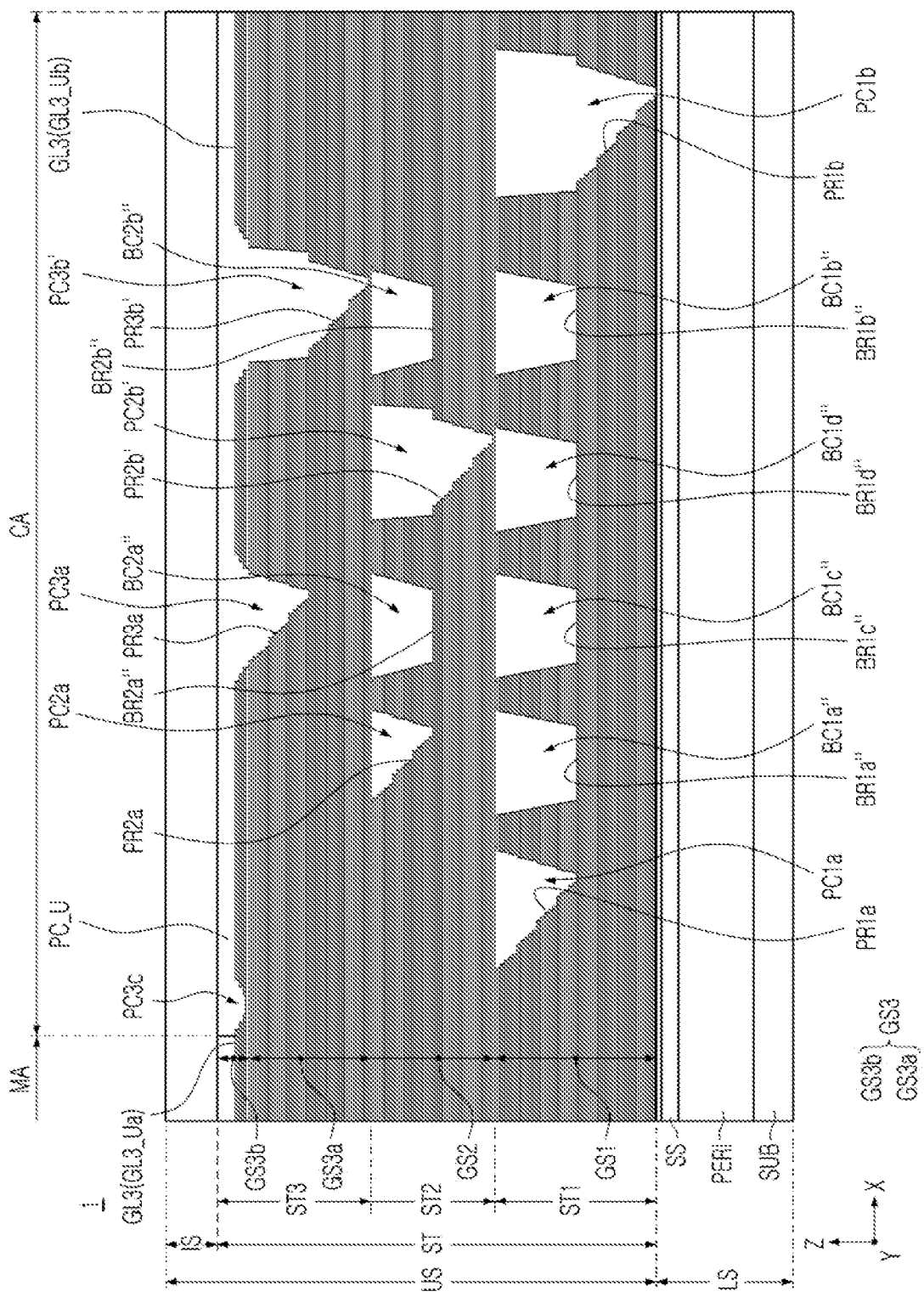
FIG. 21B is a cross-sectional diagram illustrating an example embodiment of a semiconductor device according to an example embodiment.

In the description below, an example embodiment of the above-described upper structure US will be described with reference to FIG. 21B. FIG. 21B is a cross-sectional diagram illustrating a region taken along line I-I' in FIG. 1.

In the example embodiment, referring to FIG. 21B, the first to fourth lower buffer capping patterns BC1a, BC1b, BC1c, and BC1d in FIG. 19 may be modified to the first to fourth lower buffer capping patterns BC1a", BC1b", BC1c", and BC1d" having an increased thickness as in FIG. 17A, and the first and second intermediate buffer capping patterns BC2a and BC2b in FIG. 19 may be modified to the first and second intermediate buffer capping patterns BC2a" and BC2b" having an increased thickness as in FIG. 17A.

In the description below, an example embodiment of the lower structure LS described above will be described with reference to FIG. 22. FIG. 21B is a cross-sectional diagram illustrating a region taken along line I-I' in FIG. 1.

Figure 22:
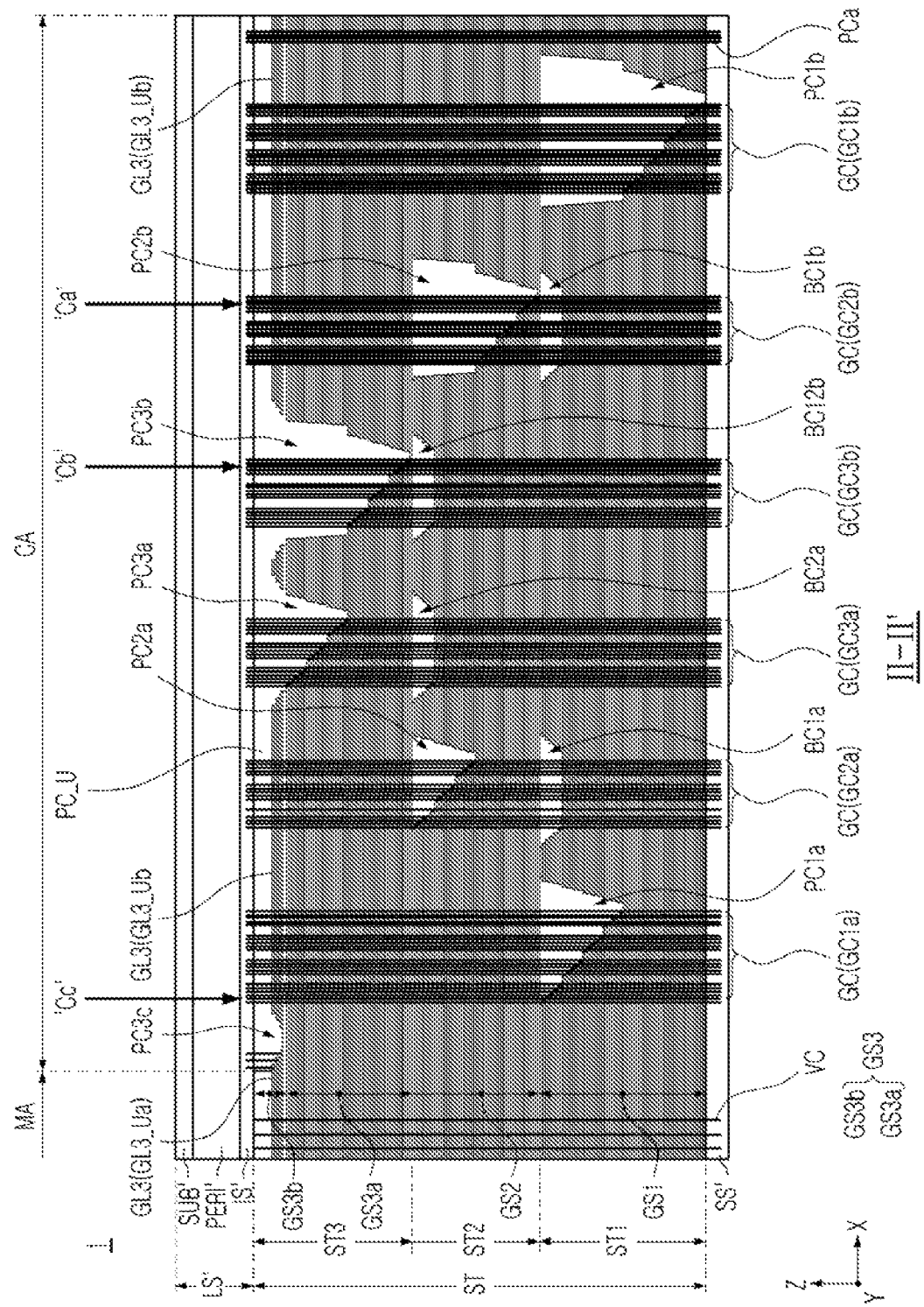
FIG. 22 is a cross-sectional diagram illustrating an example embodiment of a semiconductor device according to an example embodiment.

In the example embodiment, referring to FIG. 22, the lower structure LS including the peripheral circuit structure PERI in the example embodiments in FIGS. 1 to 21B may be replaced with a lower structure LS' disposed on the plurality of structures ST as in FIG. 22. Here, the lower structure LS' may also be referred to as a peripheral structure. The peripheral structure LS' may vertically overlap the plurality of structures ST. The peripheral structure LS' may include a connection structure IS' electrically connected to and in contact with the gate contact plugs GC, a wiring structure PERI' on the connection structure IS', and a substrate SUB' wiring structure PERI'. The vertical memory structure VC may be in contact with and may be electrically connected to a common source of the source structure SS' below the plurality of structures ST. The gate contact plugs GC may be electrically insulated from a common source of the source structure SS'.

A portion of the wiring structure PERI' may be bonded by inter-metal bonding by a wafer bonding process. The wiring structure PERI' may include a peripheral circuit such as a peripheral transistor and a peripheral circuit wiring, and the substrate SUB may be a semiconductor substrate.

Figure 23A:
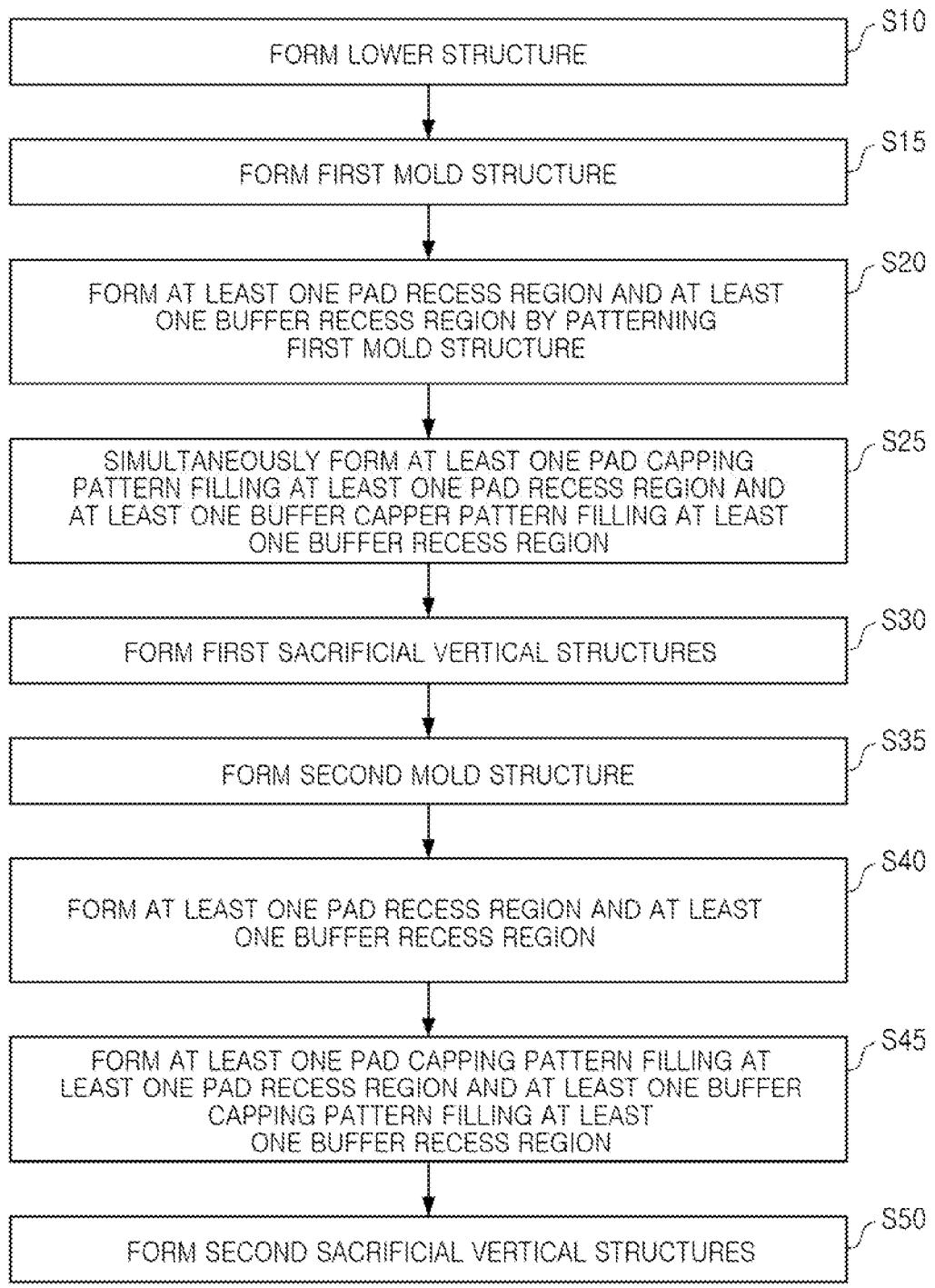
FIGS. 23A to 23C are flowcharts illustrating a method of forming a semiconductor device according to example embodiments.
Figure 23B:
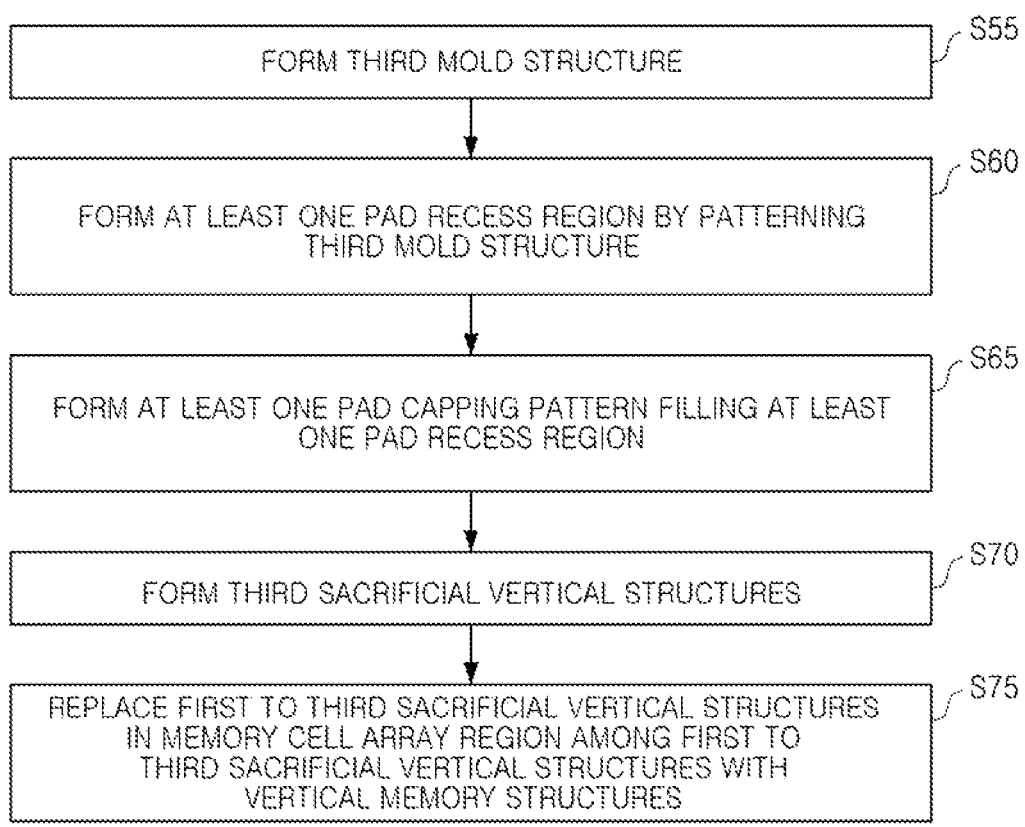
Figure 23C:
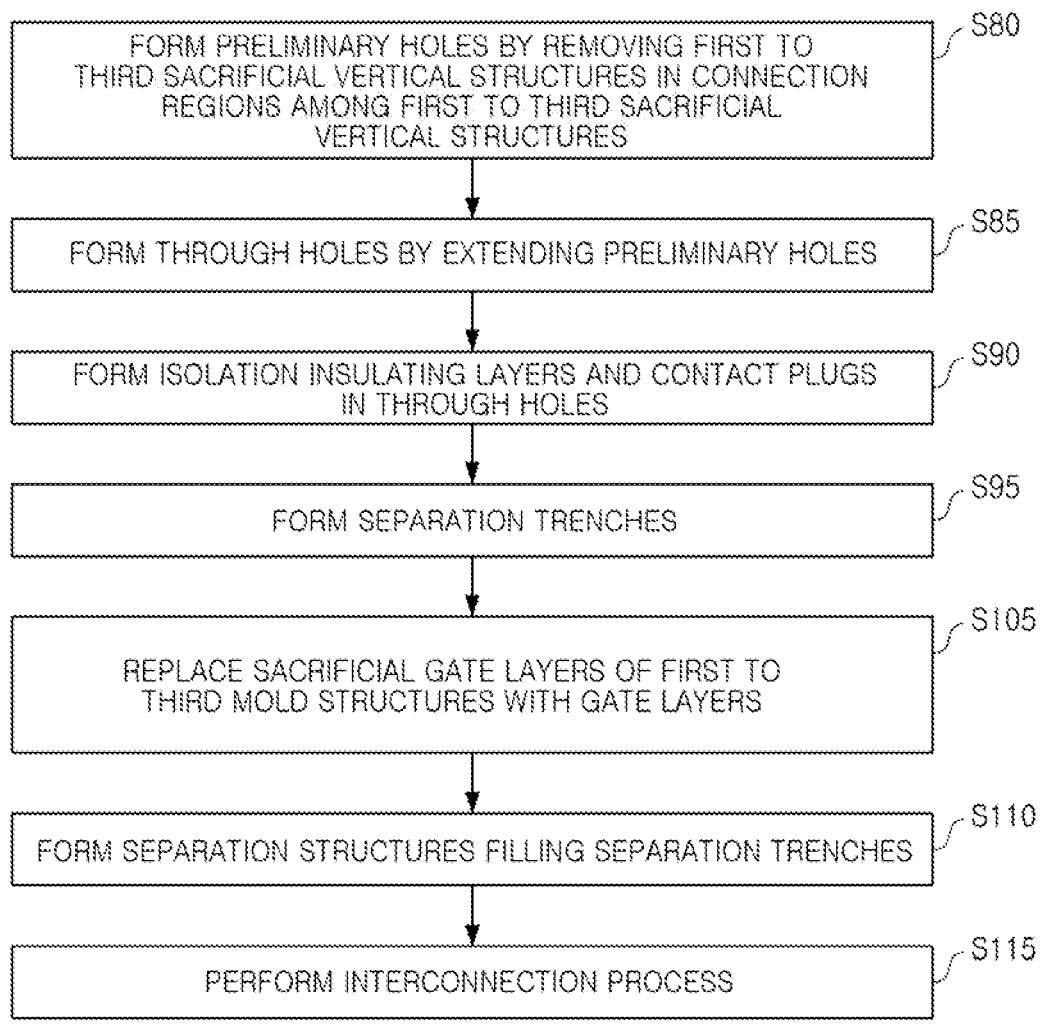

In the description below, an example of a method of forming a semiconductor device according to an example embodiment will be described with reference to FIGS. 23A to 23C. FIGS. 23A to 23C are flowcharts illustrating processes of a method of forming a semiconductor device according to an example embodiment.

Referring to FIG. 23A among FIGS. 23A to 23C, a lower structure may be formed (S10). The lower structure may be the lower structure LS in FIGS. 1 to 3E.

The first mold structure may be formed (S15). The first mold structure may be formed on the lower structure LS. The first mold structure may include lower interlayer insulating layers and lower sacrificial gate layers alternately stacked.

At least one pad recess region and at least one buffer recess region may be formed by patterning the first mold structure (S20). At least one pad capping pattern filling the at least one pad recess region and at least one buffer capping pattern filling the at least one buffer recess region may be simultaneously formed (S25). The at least one pad capping pattern may be at least one lower pad capping pattern PC1a and PC1b (in FIGS. 2A and 2B) described above, and the at least one buffer capping pattern may be the at least one lower buffer capping pattern BC1a and BC1b described above. First sacrificial vertical structures may be formed (S30). The first sacrificial vertical structures may penetrate through a lower structure including the first mold structure, the at least one pad capping pattern, and the at least one buffer capping pattern. A second mold structure may be formed (S35). The second mold structure may be formed on the first sacrificial vertical structures and the lower structure. The second mold structure may include intermediate interlayer insulating layers and intermediate sacrificial gate layers alternately stacked.

At least one pad recess region and at least one buffer recess region may be formed by patterning the second mold structure (S40). At least one pad capping pattern filling the at least one pad recess region and at least one buffer capping pattern filling the at least one buffer recess region may be simultaneously formed (S45). The at least one pad capping pattern may be at least one intermediate pad capping pattern (PC2a and PC2b in FIGS. 2A and 2B) described above, and the at least one buffer capping pattern may be the at least one intermediate buffer capping pattern described above. (BC2a, BC2b).

Second sacrificial vertical structures may be formed (S50). The second sacrificial vertical structures may penetrate through an intermediate structure including the second mold structure, the at least one pad capping pattern, and the at least one buffer capping pattern, and may vertically overlap and may be in contact with the first sacrificial vertical structures.

Referring to FIG. 23B in FIGS. 23A to 23C, a third mold structure may be formed (S55). The third mold structure may be formed on the second sacrificial vertical structures and the intermediate structure. The third mold structure may include upper interlayer insulating layers and upper sacrificial gate layers alternately stacked. At least one pad recess region may be formed by patterning the third mold structure (S60). At least one pad capping pattern filling the at least one pad recess region may be formed (S65). The at least one pad capping pattern may be at least one upper pad capping pattern PC3a and PC3b (in FIGS. 2A and 2B) described above.

Third sacrificial vertical structures may be formed (S70). The third sacrificial vertical structures may penetrate through an upper structure including the third mold structure and the at least one pad capping pattern, and may vertically overlap and may be in contact with the second sacrificial vertical structures.

Among the first to third vertical structures, first to third sacrificial vertical structures in the memory cell array region may be replaced with vertical memory structures (S75). The vertical memory structures may be the vertical memory structures VC in FIGS. 2B and 4.

Referring to FIG. 23C among FIGS. 23A to 23C, preliminary holes may be formed by removing the first to third sacrificial vertical structures in the connection region among the first to third vertical structures (S80). Through-holes may be formed by expanding the preliminary holes (S85). Isolation insulating layers and contact plugs may be formed in the through holes (S90). The isolation insulating layers may be the first to third isolation insulating layers SP1, SP2, and SP3 as illustrated in FIGS. 3D and 5A to 5C, and the contact plugs may be first gate contact plugs GC and the first and second peripheral contact plugs PCa and PC as in FIGS. 1 to 6B.

A separation trench may be formed (S95). The separation trench may intersect the first to third mold structures and may expose the sacrificial gate layers. The sacrificial gate layers of the first to third mold structures may be replaced with gate layers (S105). The gate layers may be the gate layers GL including the lower gate layers GL1, the intermediate gate layers GL2, and the upper gate layers GL3 described above. Separation structures filling the separation trenches may be formed (S110). The separation structures may be the above-described separation structures 83. An interconnection process may be performed (S115). The interconnection process may be a process for forming the upper wiring region IS including the bit lines BL described above.

In the description below, a data storage system including a semiconductor device according to an example embodiment will be described with reference to FIGS. 24, 25, and 26, respectively.

Figure 24:
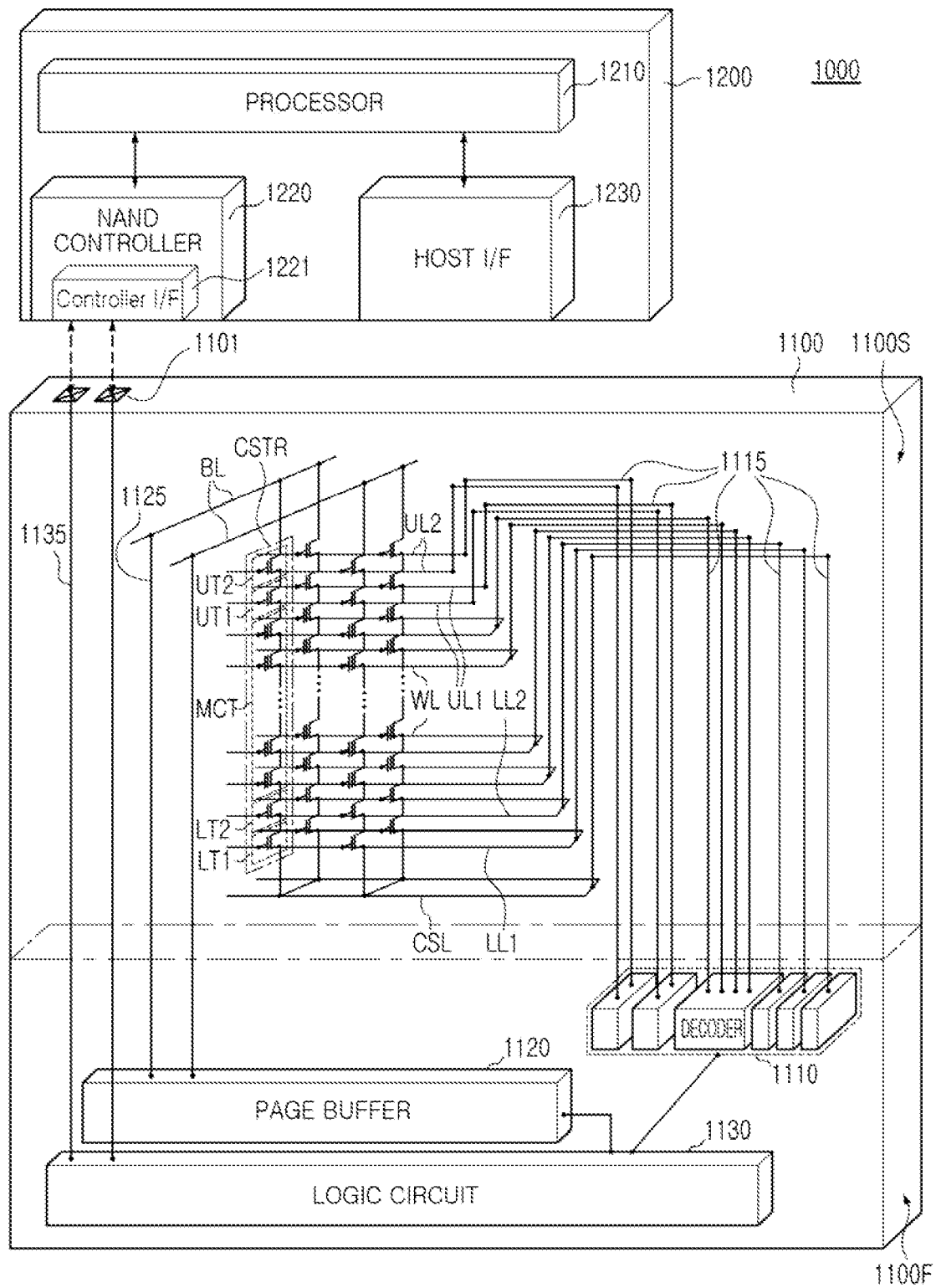
FIG. 24 is a diagram illustrating a data storage system including a semiconductor device according to an example embodiment.

FIG. 24 is a diagram illustrating a data storage system including a semiconductor device according to an example embodiment.

Referring to FIG. 24, the data storage system 1000 may include a semiconductor device 1100 and a controller 1200 electrically connected to the semiconductor device 1100. The data storage system 1000 may be referred to as a storage device including one or a plurality of semiconductor devices 1100 or an electronic device including a storage device. For example, the data storage system 1000 may be referred to as a solid state drive device (SSD) including one or a plurality of semiconductor devices 1100, a universal serial bus (USB), a computing system, a medical device, or a communication device.

In an example embodiment, the data storage system 1000 may be an electronic system for storing data.

The semiconductor device 1100 may be referred to as a non-volatile memory device. For example, the semiconductor device 1100 may be the semiconductor device 1 according to one of the example embodiments described above with reference to FIGS. 1 to 22. The semiconductor device 1100 may include a first structure 1100F and a second structure 1100S on the first structure 1100F.

The first structure 1100F may be a peripheral circuit structure including a decoder circuit 1110, a page buffer 1120, and a logic circuit 1130. For example, the first structure 1100F may include the aforementioned peripheral circuit structure PERI. The above-described peripheral circuit devices (9 in FIG. 4 or 9 in FIG. 5A) may be transistors included in the decoder circuit 1110, the page buffer 1120, and the logic circuit 1130.

The second structure 1100S may be a memory structure including a bit line BL, a common source line CSL, word lines WL, first and second gate upper lines UL1 and UL2, first and second gate lower lines LL1 and LL2 and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be varied in example embodiments.

The plurality of memory cell transistors MCTs may include gate layers which may be word lines among the gate layers GL (in FIG. 4) described above, the channel layer 53 (in FIG. 4), and the data storage structure 50.

In example embodiments, the upper transistors UT1 and UT2 may include a string select transistor, and the lower transistors LT1 and LT2 may include a ground select transistor. The gate lower lines LL1 and LL2 may be configured as gate electrodes of the lower transistors LT1 and LT2, respectively. The word lines WL may be configured as gate electrodes of the memory cell transistors MCT, and the gate upper lines UL1 and UL2 may be configured as gate electrodes of the upper transistors UT1 and UT2, respectively.

The gate layers GL described above may be included in the gate lower lines LL1 and LL2, the word lines WL, and the gate upper lines UL1 and UL2.

The common source line CSL, the first and second gate lower lines LL1 and

LL2, word lines WL, and the first and second gate upper lines UL1 and UL2 may be electrically connected to the decoder circuit 1110 through first connection wires 1115 extending from the first structure 1100F to the second structure 1100S.

The bit lines BL may be electrically connected to the page buffer 1120 through second connection wires 1125 extending from the first structure 1100F to the second structure 1100S. The bit lines BL may be the aforementioned bit lines BL (in FIG. 4). In the first structure 1100F, the decoder circuit 1110 and the page buffer 1120 may perform a control operation on at least one selected memory cell transistor MCT among the plurality of memory cell transistors MCT. The decoder circuit 1110 and the page buffer 1120 may be controlled by a logic circuit 1130.

The semiconductor device 1100 may further include a data transfer pad 1101 configured to receive input data and transmit output data. The semiconductor device 1100 may communicate with the controller 1200 through the data transfer pad 1101 electrically connected to the logic circuit 1130. The data transfer pad 1101 may be electrically connected to the logic circuit 1130 through a data transfer connection wire 1135 extending from the first structure 1100F to the second structure 1100S. Accordingly, the controller 1200 may be electrically connected to the semiconductor device 1100 through the data transfer pad 1101 and may control the semiconductor device 1100.

The controller 1200 may include a processor 1210, a NAND controller 1220, and a host interface 1230. In example embodiments, the data storage system 1000 may include a plurality of semiconductor devices 1100, and in this case, the controller 1200 may control the plurality of semiconductor devices 1100.

The processor 1210 may control overall operations of the data storage system 1000 including the controller 1200. The processor 1210 may operate according to predetermined firmware and may access the semiconductor device 1100 by controlling the NAND controller 1220. The NAND controller 1220 may include a NAND interface 1221 processing communication with the semiconductor device 1100. Through the NAND interface 1221, a control command for controlling the semiconductor device 1100, data to be written to the memory cell transistors MCT of the semiconductor device 1100, and data to be read from the memory cell transistors MCT may be transmitted. The host interface 1230 may provide a communication function between the data storage system 1000 and an external host. When a control command is received from an external host through the host interface 1230, the processor 1210 may control the semiconductor device 1100 in response to the control command.

Figure 25:
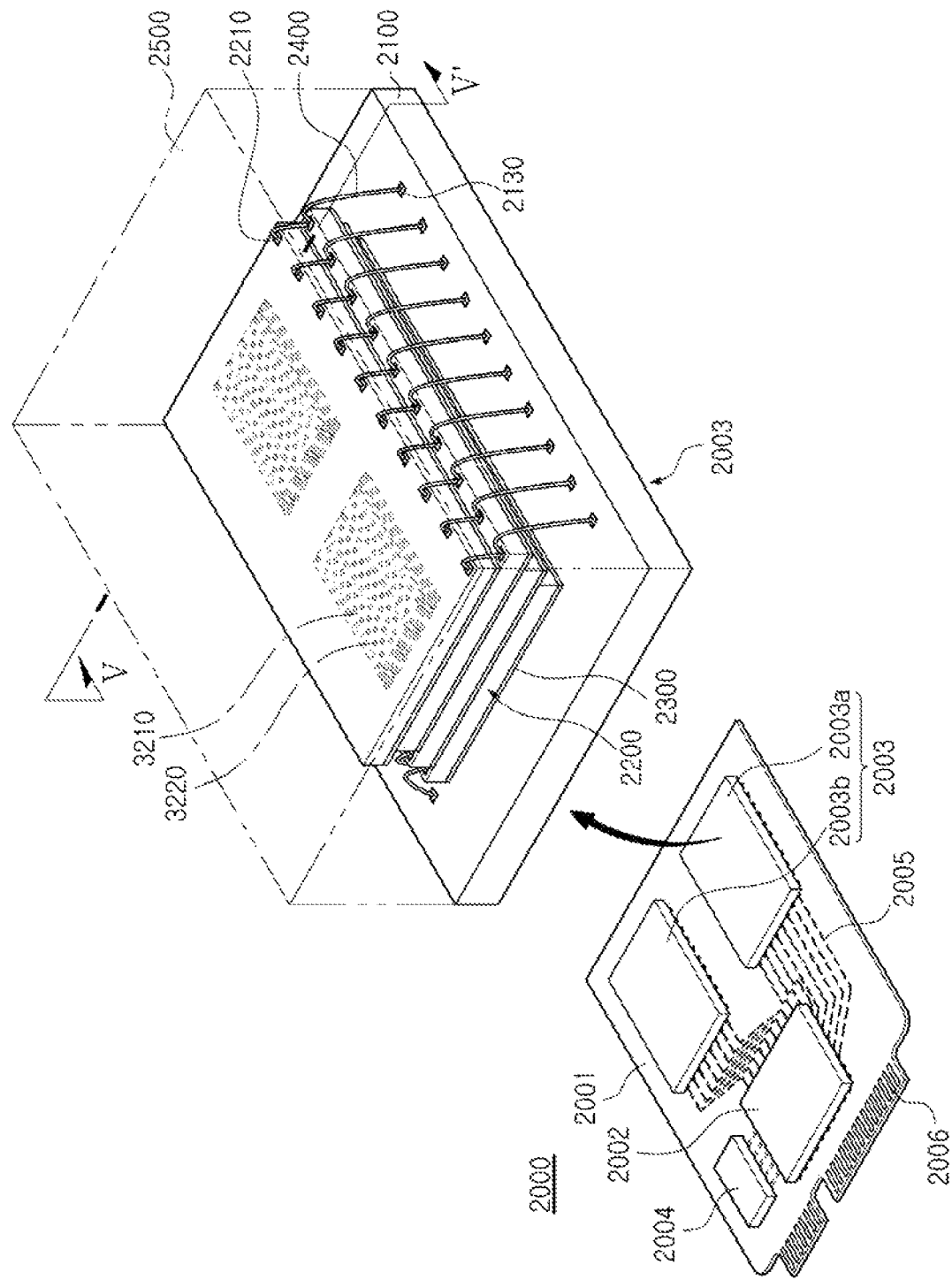
FIG. 25 is a perspective diagram illustrating a data storage system including a semiconductor device according to an example embodiment.

FIG. 25 is a perspective diagram illustrating a data storage system including a semiconductor device according to an example embodiment.

Referring to FIG. 25, a data storage system 2000 in an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number of the plurality of pins and arrangement thereof in the connector 2006 may vary depending on a communication interface between the data storage system 2000 and the external host. In example embodiments, the data storage system 2000 may communicate with an external host according to one of interfaces from among universal serial bus (USB), peripheral component interconnect express (PCI-Express), serial advanced technology attachment (SATA), M-Phy for universal flash storage (UFS). In example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to or may read data from the semiconductor package 2003, and may improve an operating speed of the data storage system 2000.

The DRAM 2004 may be configured as a buffer memory for alleviating a difference in speeds between the semiconductor package 2003, which is a data storage space, and an external host. The DRAM 2004 included in the data storage system 2000 may operate as a cache memory, and may provide a space for temporarily storing data in a control operation for the semiconductor package 2003. When the data storage system 2000 may include the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the semiconductor chips 2200 may include a semiconductor device according to one of the example embodiments described above with reference to FIGS. 1 to 22.

Each of the first and second semiconductor packages 2003a and 2003b may include a package substrate 2100, a semiconductor chip 2200 on the package substrate 2100, adhesive layers 2300 disposed on lower surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an data transfer pad 2210.

In example embodiments, the connection structure 2400 may be configured as a bonding wire electrically connecting the data transfer pad 2210 to the package upper pads 2130. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other by a connection structure including a through-electrode (TSV) instead of the connection structure 2400 of a bonding wire method.

In example embodiments, the controller 2002 and the semiconductor chips 2200 may be included in a single package. In an example embodiment, the controller 2002 and the semiconductor chips 2200 may be mounted on a separate interposer substrate different from the main substrate 2001, and the controller 2002 and the semiconductor chips 2200 may be connected to each other by wiring formed on the interposer substrate. FIG. 26 is a cross-sectional diagram illustrating a data storage system including a semiconductor device according to an example embodiment. FIG. 26 describes an example embodiment of the semiconductor package 2003 in FIG. 25 and conceptually illustrates a region obtained by cutting the semiconductor package 2003 in FIG. 25 along line V-V'.

Figure 26:
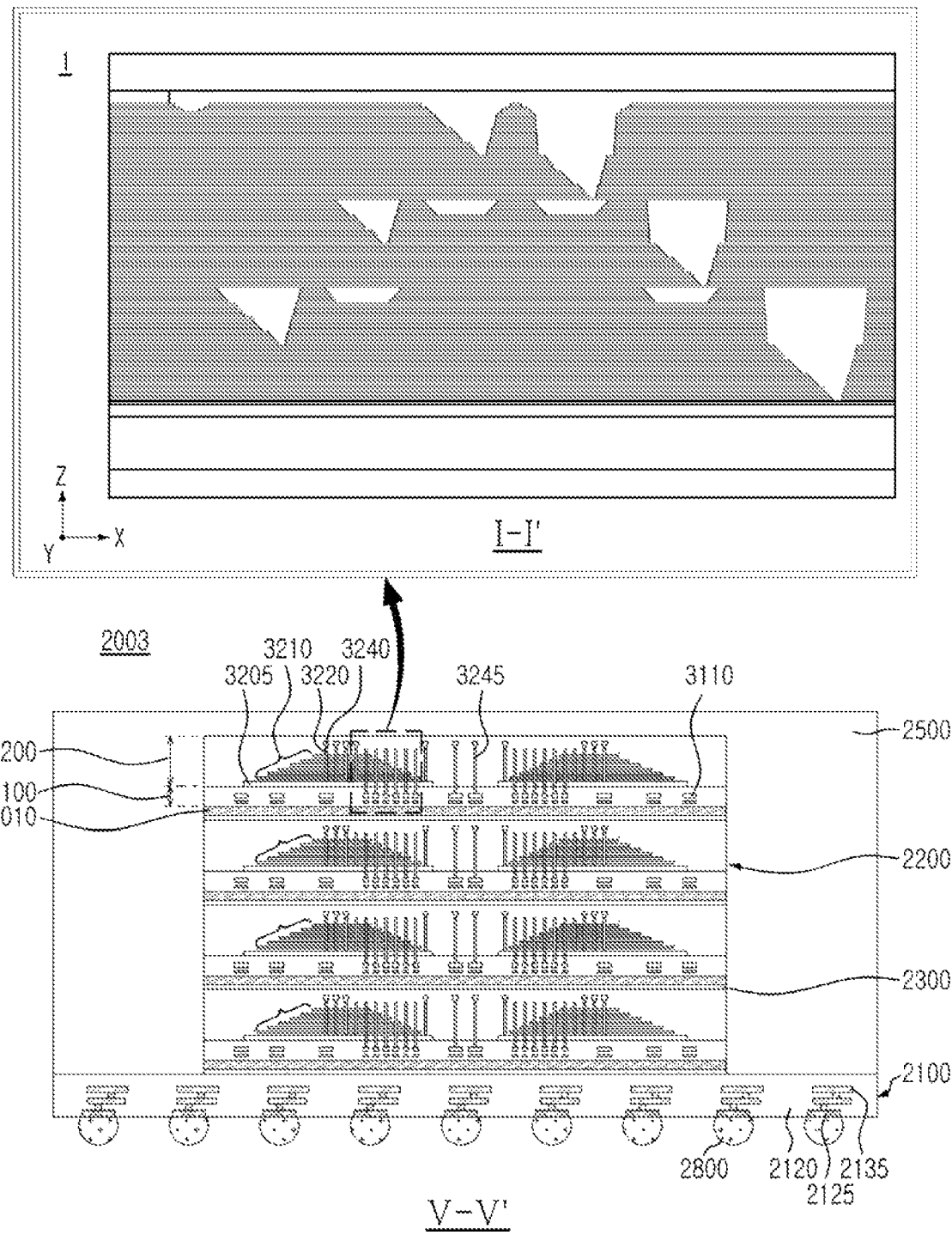
FIG. 26 is a cross-sectional diagram illustrating a data storage system including a semiconductor device according to an example embodiment.

Referring to FIGS. 25 and 26, in the semiconductor package 2003, the package substrate 2100 may be referred to as a printed circuit board. The package substrate 2100 may include a package substrate body 2120, package upper pads 2130 disposed on the upper surface of the package substrate body 2120, package lower pads 2125 disposed on the lower surface of the package substrate body 2120 or exposed through the lower surface, and internal wirings 2135 electrically connecting the package upper pads 2130 to the package lower pads 2125 in the package substrate body 2120. The package upper pads 2130 may be electrically connected to the connection structures 2400. The package lower pads 2125 may be connected to the wiring patterns 2005 of the main board 2010 of the data storage system 2000 through the conductive connection parts 2800.

Each of the semiconductor chips 2200 may include a semiconductor substrate 3010 and a first structure 3100 and a second structure 3200 stacked in order on the semiconductor substrate 3010. The first structure 3100 may include a peripheral circuit region including the peripheral wires 3110. The second structure 3200 may include a common source line 3205, a stack structure 3210 on the common source line 3205, memory channel structures 3220 and separation structures 3230 penetrating the stack structure 3210, bit lines 3240 electrically connected to the memory channel structures 3220 and gate contact plugs 106 (in FIG. 2A) electrically connected to the word lines WL of the stack structure 3210. The first structure 3100 may include the first structure 1100F in FIG. 24, and the second structure 3200 may include the second structure 1100S in FIG. 24.

Each of the semiconductor chips 2200 may include a through wire 3245 electrically connected to the peripheral wires 3110 of the first structure 3100 and extending into the second structure 3200. The through wire 3245 may penetrate through the stack structure 3210 and may be further disposed on an external side of the stack structure 3210.

Each of the semiconductor chips 2200 may include an data transfer connection wiring 3265 electrically connected to the peripheral wires 3110 of the first structure 3100 and extending into the second structure 3200, and an data transfer pad 2210 (in FIG. 25) electrically connected to the data transfer connection wiring 3265.

In FIG. 26, the partially enlarged portion indicated by reference numeral 1 may indicate that the semiconductor chips 2200 in FIGS. 25 and 26 may be modified to include the partially enlarged portion of the cross-sectional structure as in FIG. 2A. Accordingly, each of the semiconductor chips 2200 may include the semiconductor device 1 according to one of the example embodiments described above with reference to FIGS. 1 to 22.

According to the aforementioned example embodiments, among the plurality of vertically stack structures, a lower structure or an intermediate structure may include a buffer capping pattern, and a portion of gate contact plugs penetrating the plurality of structures may penetrate through the buffer capping pattern. Each of the plurality of structures may include gate layers and interlayer insulating layers alternately stacked, and the gate contact plugs may be electrically connected to gate pads of the gate layers. The buffer capping pattern may increase reliability of gate contact plugs penetrating the plurality of structures. Accordingly, integration density may be increased, and a semiconductor device having reliability may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the invention as set forth in the following claims.

What is claimed is:

1. A semiconductor device, comprising:
 a first structure;
 a second structure on the first structure; and
 gate contact plugs penetrating through the first and second structures, wherein the first structure includes:
  a first stack structure including first gate layers and first insulating layers alternately stacked;
  a first pad capping pattern penetrating through at least a first portion of the first stack structure; and
  a first buffer capping pattern penetrating through at least a second portion of the first stack structure and spaced apart from the first pad capping pattern,
 wherein the second structure includes:
  a second stack structure including second gate layers and second insulating layers alternately stacked; and
  a second pad capping pattern penetrating through at least a portion of the second stack structure,
 wherein the first gate layers include first gate pads covered by the first pad capping pattern,
 wherein the second gate layers include second gate pads covered by the second pad capping pattern,
 wherein at least a portion of the first pad capping pattern is disposed at substantially the same level as a level of the first buffer capping pattern, and
 wherein at least a portion of the second pad capping pattern vertically overlaps the first buffer capping pattern.

2. The semiconductor device as claimed in claim 1,
 wherein the gate contact plugs include:
  first gate contact plugs penetrating through the first and second structures, electrically connected to the first gate pads of the first gate layers, and electrically insulated from the second gate layers; and
  second gate contact plugs penetrating through the first and second structures, electrically connected to the second gate pads of the second gate layers, and electrically insulated from the first gate layers,
 wherein the first gate contact plugs extend upwardly from portions in contact with the first gate pads, penetrate through the first pad capping pattern and the second gate layers, and are spaced apart from the second pad capping pattern and the second gate layers, and wherein the second gate contact plugs extend downwardly from portions in contact with the second gate pads, penetrate through the first buffer capping pattern and the first gate layers disposed below the first buffer capping pattern, and spaced apart from the first gate layers.

3. The semiconductor device as claimed in claim 2, wherein one of the first gate contact plugs includes a first lower plug portion and a first upper plug portion bonded to the first lower plug portion on the first lower plug portion, wherein one of the second gate contact plugs includes a second lower plug portion and a second upper plug portion bonded to the second lower plug portion on the second lower plug portion, wherein the first lower plug portion includes a portion penetrating the first gate layers, wherein the first upper plug portion includes a portion penetrating the second gate layers, wherein the second lower plug portion includes a portion penetrating the first gate layers, and wherein the second upper plug portion includes a first portion penetrating the second pad capping pattern.

4. The semiconductor device as claimed in claim 3, wherein a maximum width of the first portion penetrating the second pad capping pattern of the second upper plug portion is greater than a maximum width of the first upper plug portion.

5. The semiconductor device as claimed in claim 3, wherein a width of an upper region of the second lower plug portion is smaller than a width of a lower region of the second upper plug portion.

6. The semiconductor device as claimed in claim 5, wherein a width of an upper region of the first lower plug portion is smaller than a width of a lower region of the first upper plug portion.

7. The semiconductor device as claimed in claim 5, wherein the second upper plug portion extends from the first portion penetrating the second pad capping pattern to an internal region of the first buffer capping pattern.

8. The semiconductor device as claimed in claim 3, wherein a bonding region between the second lower plug portion and the second upper plug portion is disposed at a level lower than a level of an uppermost first gate layer among the first gate layers.

9. The semiconductor device as claimed in claim 3, wherein at least a portion of a bonding region between the second lower plug portion and the second upper plug portion is disposed at a level lower than a level of a bonding region between the first lower plug portion and the first upper plug portion.

10. The semiconductor device as claimed in claim 3, wherein a first vertical central axis of the second lower plug portion and a second vertical central axis of the second upper plug portion are misaligned, wherein, with respect to the second vertical central axis of the second upper plug portion, a bonding region between the second lower plug portion and the second upper plug portion includes a first bonding region disposed on a first side of the second vertical central axis and a second bonding region disposed on a second side of the second vertical central axis, wherein the first side of the second vertical central axis and the second side of the second vertical central axis are opposite to each other, and wherein the first bonding region is disposed at a level higher than a level of the second bonding region.

11. The semiconductor device as claimed in claim 10, wherein the second upper plug portion includes a first lower end disposed on the first side of the second vertical central axis and a second lower end disposed on the second side of the second vertical central axis, and wherein the first lower end and the second lower end of the second upper plug portion are disposed at different levels.

12. The semiconductor device as claimed in claim 11, wherein, in the second upper plug portion, the first lower end is disposed at a level higher than a level of the second lower end.

13. The semiconductor device as claimed in claim 12, wherein, in the second upper plug portion, the first lower end is disposed at a level lower than a level of the first bonding region and is disposed at a level higher than a level of the second bonding region, and wherein the second lower end is disposed at a level lower than a level of the second bonding region.

14. The semiconductor device as claimed in claim 12, wherein, in the second upper plug portion, the first lower end and the second lower end are disposed at a level lower than a level of the first bonding region and the second bonding region.

15. The semiconductor device as claimed in claim 3, wherein each of the gate contact plugs includes at least one layer of material, wherein the at least one layer of material of each of the first gate contact plugs extends from a lower region of the first lower plug portion to an upper region of the first upper plug portion, and wherein the at least one layer of material of each of the second gate contact plugs extends from a lower region of the second lower plug portion to an upper region of the second upper plug portion.

16. The semiconductor device as claimed in claim 3, wherein each of the first gate contact plugs further includes a first horizontal extension portion protruding from the first lower plug portion in a horizontal direction and in contact with a first gate pad of the first gate layer, and wherein the each of the second gate contact plugs further includes a second horizontal extension portion protruding from the second upper plug portion in the horizontal direction and in contact with a second gate pad of the second gate layer.

17. The semiconductor device as claimed in claim 1, further comprising:

peripheral circuit structures;

a source structure on the peripheral circuit structure; and a vertical memory structure penetrating through the first and second stack structures and is electrically connected to the source structure.

18. A semiconductor device, comprising:

a first structure;

a second structure on the first structure;

a third structure on the second structure;

a vertical memory structure penetrating the first, second and third structures in a memory cell array region; and gate contact plugs penetrating the first, second and third structures in a connection region adjacent to the memory cell array region, wherein the first structure includes:
- a lower stack structure including lower gate layers and lower insulating layers alternately stacked;
- a first lower pad capping pattern penetrating through at least a first portion of the lower stack structure; and
- a first lower buffer capping pattern penetrating through at least a second portion of the lower stack structure and spaced apart from the first lower pad capping pattern, wherein the second structure includes:
- an intermediate stack structure including alternately stacked intermediate gate layers and intermediate insulating layers; and
- a first intermediate pad capping pattern penetrating through at least a portion of the intermediate stack structure, wherein the third structure includes:
- an upper stack structure including upper gate layers and upper insulating layers alternately stacked; and
- a first upper pad capping pattern penetrating through at least a portion of the upper stack structure, wherein the lower gate layers include first lower gate pads covered by the first lower pad capping pattern, wherein the intermediate gate layers include first intermediate gate pads covered by the first intermediate pad capping pattern, wherein the upper gate layers include first upper gate pads covered by the first upper pad capping pattern, wherein at least a portion of the first lower pad capping pattern is disposed at substantially the same level as a level of the first lower buffer capping pattern, and wherein at least a portion of the first intermediate pad capping pattern vertically overlaps the first lower buffer capping pattern.

19. The semiconductor device as claimed in claim 18, wherein the first structure further includes a second lower pad capping pattern penetrating through at least a portion of the lower stack structure, wherein the second structure further includes:
- a second intermediate pad capping pattern penetrating through at least a portion of the intermediate stack structure; and
- an intermediate buffer capping pattern penetrating through at least a portion of the intermediate stack structure and spaced apart from the first intermediate pad capping pattern, wherein the third structure further includes a second upper pad capping pattern penetrating through at least a portion of the upper stack structure, wherein the lower gate layers further include second lower gate pads covered by the second lower pad capping pattern, wherein the intermediate gate layers include second intermediate gate pads covered by the second intermediate pad capping pattern, wherein the upper gate layers include second upper gate pads covered by the second upper pad capping pattern, wherein the second lower gate pads are disposed at a level different from a level of the first lower gate pads, wherein the second intermediate gate pads are disposed at a level different from a level of the first intermediate gate pads, wherein the second upper gate pads are disposed at a level different from a level of the first upper gate pads, wherein the gate contact plugs include:
- first lower gate contact plugs electrically connected to the first lower gate pads and penetrating the first lower pad capping pattern;
- second lower gate contact plugs electrically connected to the second lower gate pads and penetrating the second lower pad capping pattern;
- first intermediate gate contact plugs electrically connected to the first intermediate gate pads and penetrating the first intermediate pad capping pattern and the first lower buffer capping pattern;
- second intermediate gate contact plugs electrically connected to the second intermediate gate pads and penetrating through the second intermediate pad capping pattern;
- first upper gate contact plugs electrically connected to the first upper gate pads and penetrating through the first upper pad capping pattern and the intermediate buffer capping pattern; and
- second upper gate contact plugs electrically connected to the second upper gate pads and penetrating the second upper pad capping pattern.

20. A data storage system, comprising:
a semiconductor device including data transfer pads configured to receive input data and transmit output data; and
a controller electrically connected to the semiconductor device through the data transfer pads and controlling the semiconductor device, wherein the semiconductor device includes:
- a first structure;
- a second structure on the first structure; and
- gate contact plugs penetrating through the first and second structures, wherein the first structure includes:
- a first stack structure including first gate layers and first insulating layers alternately stacked;
- a first pad capping pattern penetrating through at least a first portion of the first stack structure; and
- a first buffer capping pattern penetrating through at least a second portion of the first stack structure and spaced apart from the first pad capping pattern, wherein the second structure includes:
- a second stack structure including second gate layers and second insulating layers alternately stacked; and
- a second pad capping pattern penetrating through at least a portion of the second stack structure, wherein the first gate layers include first gate pads covered by the first pad capping pattern, wherein the second gate layers include second gate pads covered by the second pad capping pattern, wherein at least a portion of the first pad capping pattern is disposed at substantially the same level as a level of the first buffer capping pattern, and wherein at least a portion of the second pad capping pattern vertically overlaps the first buffer capping pattern.

* * * * *